(12) United States Patent
Malhan et al.

(10) Patent No.: US 7,999,369 B2
(45) Date of Patent: *Aug. 16, 2011

(54) POWER ELECTRONIC PACKAGE HAVING TWO SUBSTRATES WITH MULTIPLE SEMICONDUCTOR CHIPS AND ELECTRONIC COMPONENTS

(75) Inventors: Rajesh Kumar Malhan, Nagoya (JP); C. Mark Johnson, Derbyshire (GB); Cyril Buttay, Sheffield (GB); Jeremy Rashid, Singapore (SG); Florin Udrea, Cambridge (GB)

(73) Assignees: DENSO CORPORATION, Kariya (JP); University of Cambridge, Cambridge (GB); The University of Sheffield, Sheffied (GB)

( * ) Notice: Subject to any disclaimer, the term of this patent is extended or adjusted under 35 U.S.C. 154(b) by 1193 days.

This patent is subject to a terminal disclaimer.

(21) Appl. No.: 11/511,516

(22) Filed: Aug. 29, 2006

(65) Prior Publication Data
US 2008/0054439 A1 Mar. 6, 2008

(51) Int. Cl.
*H01L 23/48* (2006.01)
(52) U.S. Cl. ........ 257/690; 257/686; 257/678; 257/723; 257/725; 257/734; 257/E23.071
(58) Field of Classification Search .......... 257/690, 257/686, 678, 723, 725, 734 E23.071
See application file for complete search history.

(56) References Cited

U.S. PATENT DOCUMENTS

| | | | |
|---|---|---|---|
| 6,072,240 A | 6/2000 | Kimura et al. | |
| 6,324,072 B1 | 11/2001 | Lorenz et al. | |
| 6,337,512 B1 | 1/2002 | Steimer et al. | |
| 6,448,645 B1 | 9/2002 | Kimura et al. | |
| 6,542,365 B2 | 4/2003 | Inoue | |
| 6,943,443 B2 | 9/2005 | Nobori et al. | |
| 7,521,789 B1 * | 4/2009 | Rinehart et al. | 257/699 |
| 7,557,434 B2 * | 7/2009 | Malhan et al. | 257/678 |
| 2003/0090873 A1 | 5/2003 | Ohkouchi | |
| 2003/0132511 A1 | 7/2003 | Gerbsch et al. | |
| 2004/0061221 A1 | 4/2004 | Schaffer | |
| 2004/0169266 A1 | 9/2004 | Maxwell | |
| 2004/0183188 A1 | 9/2004 | Oohama | |
| 2005/0146027 A1 | 7/2005 | Kondou et al. | |
| 2005/0151161 A1 | 7/2005 | Topp et al. | |

(Continued)

FOREIGN PATENT DOCUMENTS
DE 43 17 215 A1 12/1994
(Continued)

OTHER PUBLICATIONS

Office Action dated Jun. 5, 2009 from the China Patent Office in the corresponding CN application No. 200610128833.1 (and English Translation).

(Continued)

*Primary Examiner* — Junghwa M Im
(74) *Attorney, Agent, or Firm* — Posz Law Group, PLC

(57) ABSTRACT

A power electronic package includes: first and second high thermal conductivity insulating non-planar substrates; and multiple semiconductor chips and electronic components between the substrates. Each substrate includes multiple electrical insulator layers and patterned electrical conductor layers connecting to the electronic components, and further includes multiple raised regions or posts, which are bonded together so that the substrates are mechanically and electrically connected. The number, arrangement, and shape of the raised regions or posts are adjusted to have mechanical separation between the substrates. The electrical conductor layers are separated and isolated one another so that multiple electric circuits are provided on at least one of the substrates.

26 Claims, 48 Drawing Sheets

U.S. PATENT DOCUMENTS

2006/0151874 A1* 7/2006 Milich et al. .................. 257/713
2006/0163648 A1   7/2006 Hauenstein et al.

FOREIGN PATENT DOCUMENTS

| DE | 10 2004 050 792 A1 | 4/2006 |
|----|--------------------|--------|
| EP | 1 298 108 A3       | 4/2003 |
| EP | 1 531 494 A2       | 5/2005 |
| FR | 2 786 657          | 6/2002 |
| WO | WO 2004/034428 A2  | 4/2004 |

OTHER PUBLICATIONS

Office Action dated Feb. 25, 2011 issued from Great Britain Patent Office in corresponding GB application No. 0617100.3.

German Office Action dated May 15, 2007 in the corresponding German application No. 10 2006 040 838 1-33 with an English translation.

Office Action dated Oct. 10, 2008 in corresponding Chinese patent application No. 2006101288331 (and English translation).

Search Report from Great Britain Patent Office issued on Dec. 8, 2006 for the corresponding Great Britain patent application No. GB0617100.3.

Gillot et al., Charlotte. "Double-Sided Cooling for High Power IGBT Modules Using Flip Chip Technology." *IEEE Transactions on Components and Packaging Technologies*. vol. 24, No. 4. (Dec. 2001): pp. 698-704.

B. Borowy, L. Casey, G. Davis; SatCon Applied Technology & J. Connell; Advanced Thermal Technologies, *HiRel Double Sided Package for SI/SIC Power Module*; IEEE 06CH37728 44$^{th}$ Annual International Reliability Physics Symposium, San Jose, 2006; p. 613. [Discussed on p. 3 of application].

\* cited by examiner

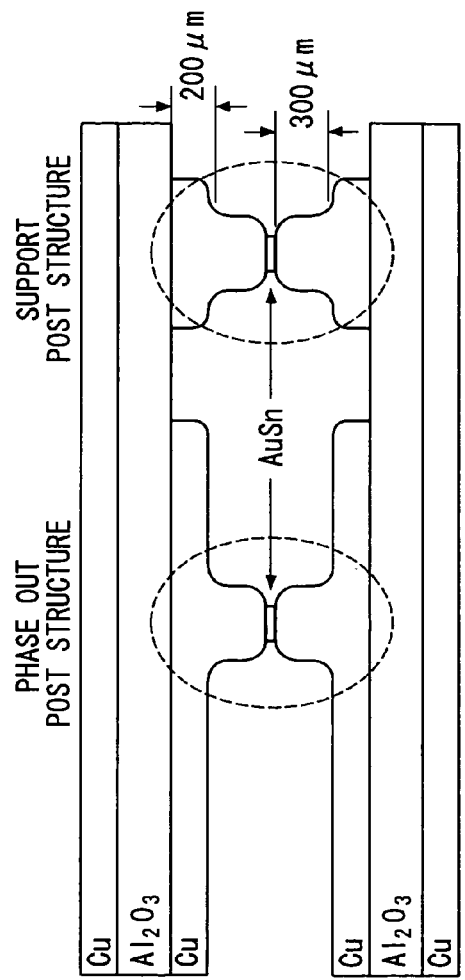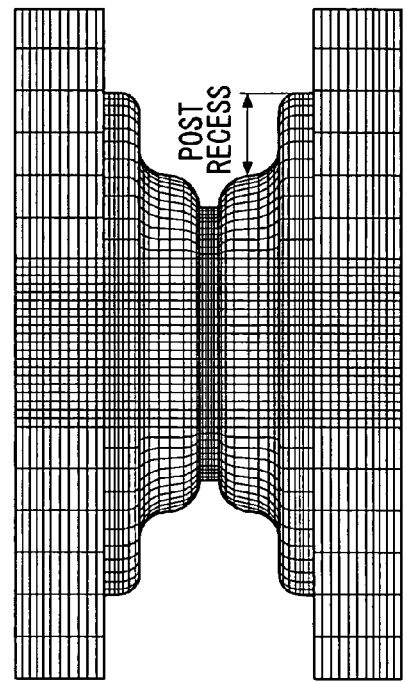
FIG. 13A
FIG. 13B

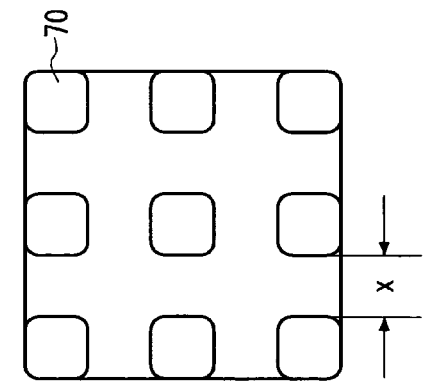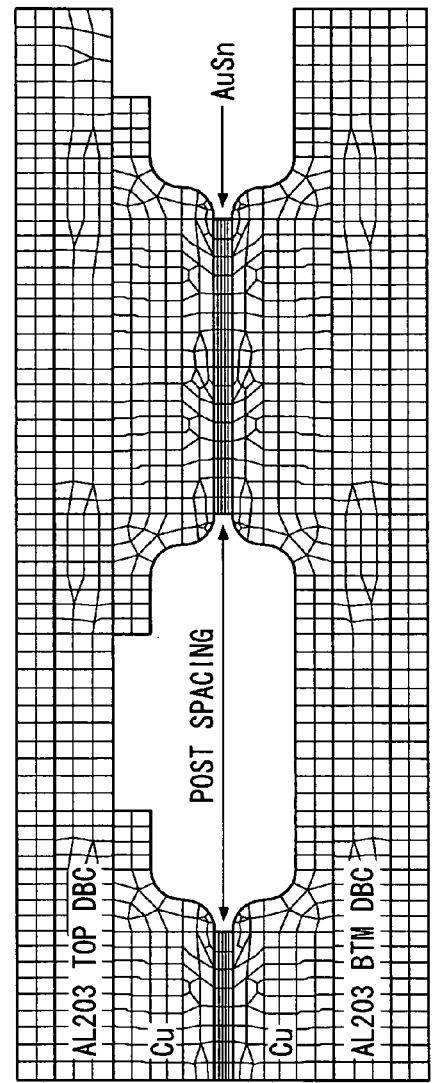
FIG. 15A
FIG. 15B

POWER ELECTRONIC PACKAGE HAVING TWO SUBSTRATES WITH MULTIPLE SEMICONDUCTOR CHIPS AND ELECTRONIC COMPONENTS

FIELD OF THE INVENTION

The present invention relates generally to a power electronic package having two substrates with multiple semiconductor chips and electronic components.

BACKGROUND OF THE INVENTION

High-performance power electronic devices continue to make great strides in voltage, current and power levels. But the higher performance comes with higher power dissipation levels that place a strain on electrical interconnections, on cooling and on mechanical integrity. Conventional approaches to packaging power electronic devices use discrete packaged devices mounted onto a board or substrate or a hybrid module, in which bare chips are mounted onto the substrate and connected to the substrate by wire bonds, and therefore, the conventional techniques have significant performance limitations. The discrete package can be plastic molded, metal sealed cans or sealed ceramic carriers, and the package contains one power chip wire bonded to a plastic package lead frame. The bare power chip is solder attached to a pad on the substrate, and the thermal path is through these interfaces, through the substrate, through an adhesive or thermal grease into a cooling structure. The number of thermal interfaces and the poor thermal conductance between the substrates and the interface materials cause excessively high junction-to-ambient thermal resistances, and the construction limits device operation and increases the junction temperature beyond limitation. These thermal effects can also cause designers to move devices apart to increase thermal spreading, at the expense of a larger module size, increased electrical parasitics and a more costly assemble.

Power semiconductor chips such as power JFETs, MOSFETs, IGBTs and diodes are devices for controlling large currents, so that they produce large amounts of heat. Consequently, when these semiconductor chips are built into packages, it is arranged to achieve a sufficient cooling (heat radiation). In a conventional power module technology, consisting of a plurality of semiconductor chips built into a package, an insulating substrate made of a high thermal conductivity ceramic is used. The plurality of semiconductor chips are mounted on this insulating substrate, and main electrodes provided on the lower principal surfaces of the semiconductor chips are connected by soft soldering to a copper thick film provided on the insulating substrate. Main electrodes and control electrodes provided on the upper surfaces of the IGBT chips are connected to a copper thick film provided on the insulating substrate by wire bonding. The insulating substrate is soldered to a heat radiation base plate made of copper. By this means, heat produced by the semiconductor chips is radiated through the insulating substrate disposed on the lower surface side of the semiconductor chips. In this conventional technology, the heat is only radiated from one surface of each of the semiconductor chips, and therefore, there is a limit to how much the heat-radiation performance can be raised, and further, there is a limitation for reducing the size of the construction of the power module.

An advanced packaging technology that addresses the thermal and mechanical performance requirements while providing a high electrical performance interconnect structure are required in the future for power electronics targeted at application areas such as military, aerospace, medical and industrial electronics. These application areas all are moving to semiconductors with higher voltage, higher current, higher power dissipation and faster switching speeds, and the devices are outstripping the electrical, mechanical and thermal capabilities of traditional packaging approaches. The advanced packaging technology should replace the wire-bonded die on low-performance ceramic substrates with one side cooling path with a direct double side cooled metal-based interconnect structure. One example of this construction is an electrically isolated and thermally conductive double side pre-packed component (U.S. Patent Application Publication No. 2003/0132511). A hybrid technology utilizes the metal spacers and wire bonding to make electrical connections with semiconductor chips. The use of spacers, which are capable of absorbing a difference in a thickness between the semiconductor chips, also provides heat conduction path for double side cooling of the power module (U.S. Patent Application Publication No. 2003/0090873). In this pre-packed component, stamped lead members, contact electrodes, semiconductor chips and the like are positioned between a pair of ceramic substrate members. Another example of this construction is a high reliability copper graphite conductor substrate power device package (IEEE 44th Annual International Reliability Physics Symposium, San Jose, 2006, page 613). This package has a structure wherein an IGBT and diode chips are sandwiched by two copper graphite conductor substrates, gold bumps and solder bumps for planarization and interconnection, and a second copper graphite layer for topside interconnect and double sided heat removal. However, without the inherent stress relief of wire bonds, double-sided construction requires very careful material selection to eliminate expansion mismatch at the interfaces, while providing high conductivity for both electrical and thermal conduction. The reduced Coefficient of thermal expansion of the heat transfer layer not only provides for a reliable interface, but due to the reduced stress on the electrical insulator layer allows the use of very thin AlN dielectric to further improve the heat transfer. In this configuration, to obtain electrical connection between the electrodes of the IGBT and diode chips and the electrodes, the semiconductor chips are sandwiched by two copper graphite conductor substrates, gold bumps and solder bumps for planarization. However, on the upper side of the semiconductor chip, because the electrodes on this upper side and electrodes provided on the upper insulating substrate are connected by metal bumps, the area of the connection is small. Consequently, there has been the problem that the electrical resistance is large, which is disadvantageous to obtaining large currents, and that heat produced by the semiconductor chip is not readily transmitted to the insulating substrate, and thus the heat-radiation performance is poor. Also, this package design requires external connection buses bonding together with the semiconductor chips bonding. In this asymmetric design layout, it difficult to control to achieve a uniform stress distribution in the package after the full assembly process, which may leads to large stresses on the semiconductor chips. The semiconductor chips like IGBTs and MOSFETs having MOS gate structures have the characteristic that they are vulnerable to stresses.

SUMMARY OF THE INVENTION

In view of the above-described problem, it is an object of the present disclosure to provide a power electronic package having two substrates with multiple semiconductor chips and electronic components.

According to a first aspect of the present disclosure, a power electronic package includes: first and second high thermal conductivity insulating non-planar substrates; and a plurality of semiconductor chips and electronic components, which are disposed between the first and second high thermal conductivity insulating non-planar substrates. Each of the first and second high thermal conductivity insulating non-planar substrates includes a plurality of electrical insulator layers and patterned electrical conductor layers, which are alternately stacked. The electrical conductor layers are connected to the electronic components with mechanical and electrical connection. Each of the first and second high thermal conductivity insulating non-planar substrates further includes a plurality of raised regions or posts. The raised regions or posts are bonded together so that the first and second high thermal conductivity insulating non-planar substrates are mechanically and electrically connected. The number of the raised regions or posts, arrangement of the raised regions or posts, and a shape of each raised region or post are adjusted to have mechanical separation between the first and second high thermal conductivity insulating non-planar substrates. The electrical conductor layers are separated and isolated one another so that a plurality of electric circuits is provided on at least one of the first and second high thermal conductivity insulating non-planar substrates.

In the above package, a uniform stress distribution in the package is obtained, and therefore, heat radiation performance is improved. Specifically, the heat produced by the semiconductor chip is smoothly transmitted from the two principal surfaces of the semiconductor chip to the two high thermal conductivity insulating non-planar substrates, and is thereby radiated quickly. The direct double-side cooled configuration further reduces the heat resistance of the power electronic package.

According to a second aspect of the present disclosure, a power electronic package includes: first and second high thermal conductivity insulating non-planar substrates; and a plurality of semiconductor chips and electronic components, which are disposed between the first and second high thermal conductivity insulating non-planar substrates. Each of the first and second high thermal conductivity insulating non-planar substrates includes a plurality of electrical insulator layers and patterned electrical conductor layers, which are alternately stacked. The electrical conductor layers are connected to the electronic components with mechanical and electrical connection. Each of the first and second high thermal conductivity insulating non-planar substrates further includes a plurality of recesses or wells. The recesses or wells are disposed on predetermined regions of at least one of the first and second high thermal conductivity insulating non-planar substrates, the predetermined regions on which the electronic components are located. The first and second high thermal conductivity insulating non-planar substrates are mechanically and electrically bonded with a plurality of bonding regions. The electrical conductor layers are separated and isolated one another so that a plurality of electric circuits is provided on at least one of the first and second high thermal conductivity insulating non-planar substrates.

In the above package, a uniform stress distribution in the package is obtained, and therefore, reliability and heat radiation performance is improved.

BRIEF DESCRIPTION OF THE DRAWINGS

The above and other objects, features and advantages of the present invention will become more apparent from the following detailed description made with reference to the accompanying drawings. In the drawings:

FIG. 13A is a cross-sectional schematic representation of the phase out and support post structures in the ceramic sandwich, and FIG. 13B is a view showing the meshed 3D model of the main recess feature;

FIG. 15A is a top plan view showing the schematic of post-post separation and FIG. 15B is a view showing a meshed two-dimensional model used to investigate the effect of the spacing parameter between support posts on the residual stresses within the ceramic sandwich;

DETAILED DESCRIPTION OF THE PREFERRED EMBODIMENTS

Figure 1:
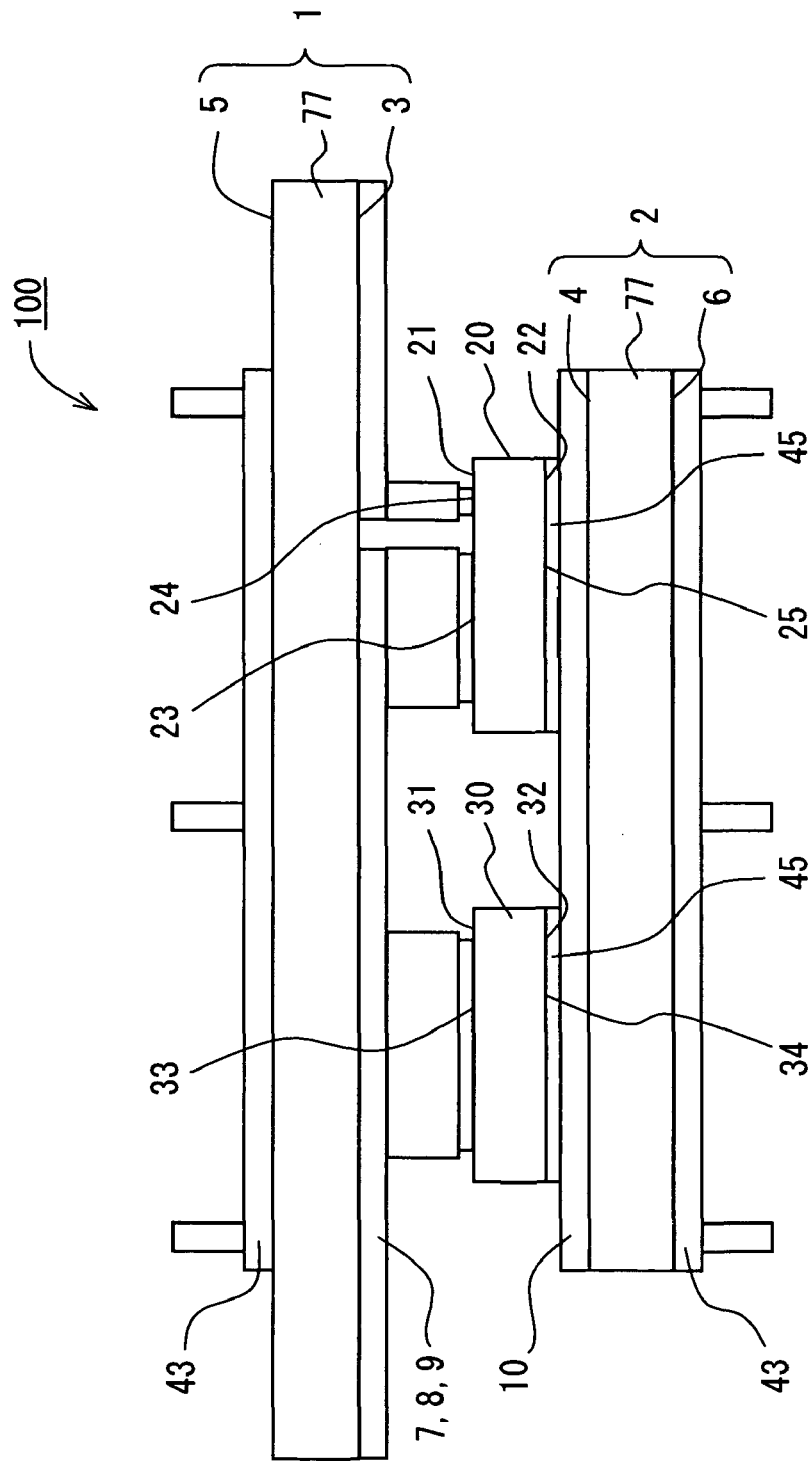
FIG. 1 a cross-sectional view showing a power electronic package.

Referring now to the drawings in which like numerals reference like parts, example embodiments of a double-side cooled power electronic will be discussed.

Figure 2:
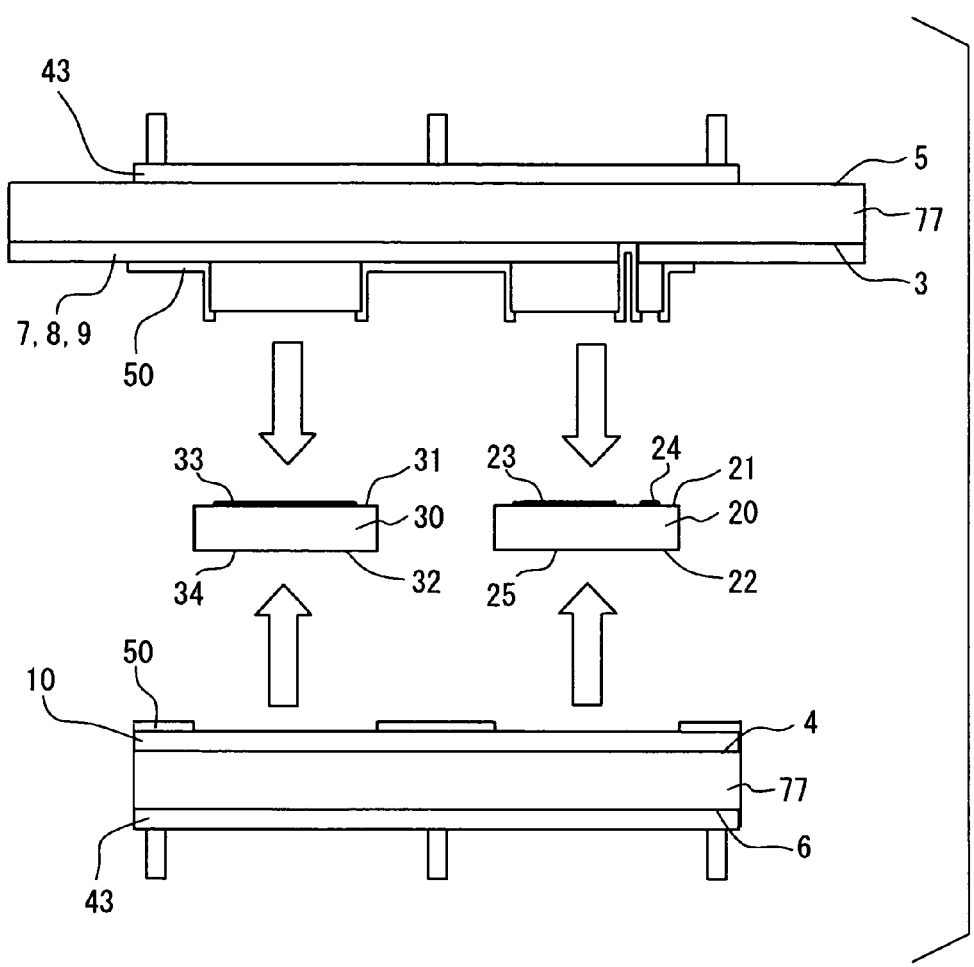
FIG. 2 is an exploded view showing the power electronic package.
Figure 3A:
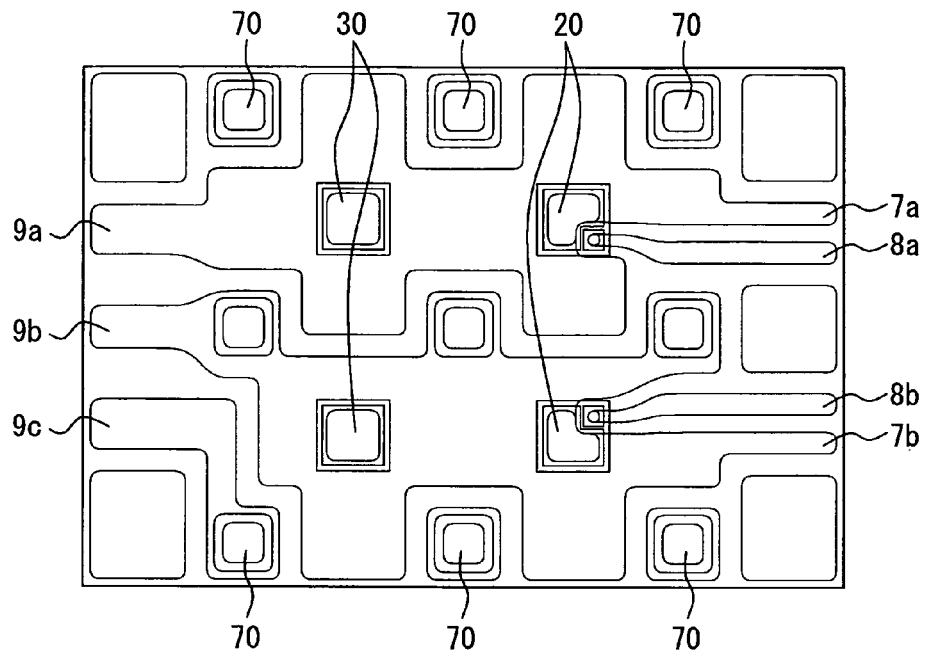
FIGS. 3A and 3B are top and bottom plan views of an upper high thermal conductivity insulating non-planar substrate in the package.
Figure 3B:
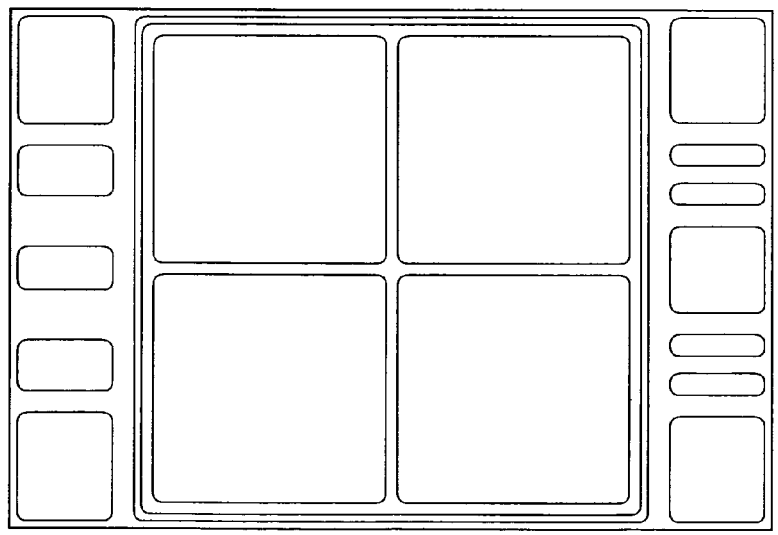
Figure 4A:
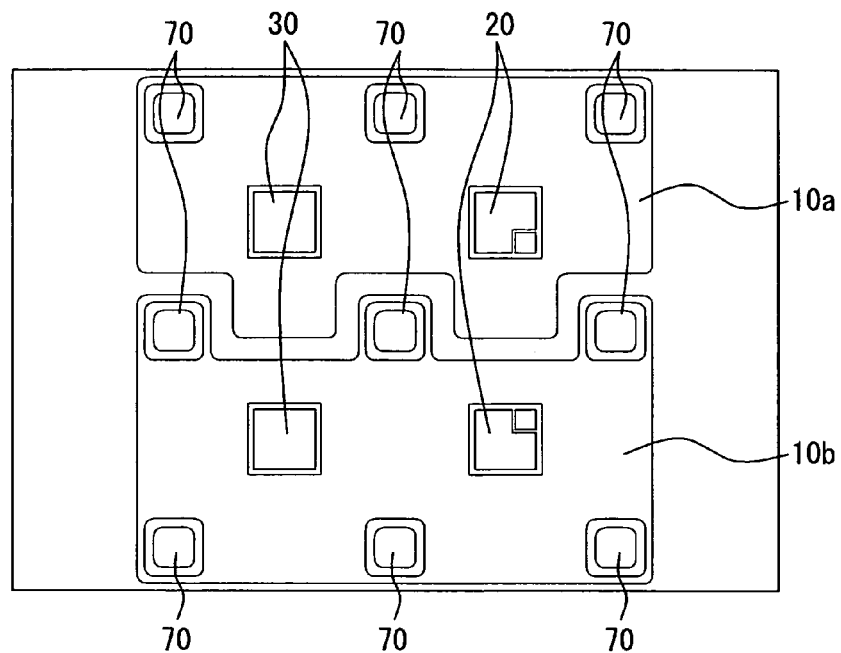
FIGS. 4A and 4B are top and bottom plan views of a lower high thermal conductivity insulating non-planar substrate in the package.
Figure 4B:
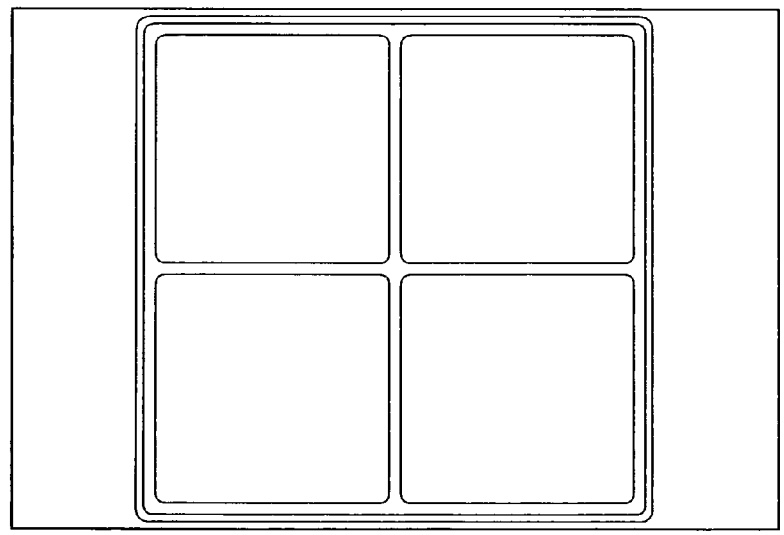

A first example embodiment of the present disclosure applied to a power electronic package 100 will be described with reference to FIG. 1 through FIG. 5B. The cross section of the power electronic package 100 is shown in FIG. 1 (Figure shows only half of the half-bridge rectifier, i.e. one transistor 20 and one diode 30). The power electronic package 100 consists of for example two power semiconductor transistor chips 20 and for example two power semiconductor diode chips 30 sandwiched between two high thermal conductivity insulating non-planar substrates 1, 2, onto which metal electrodes 7-10 have been patterned to make contact with the semiconductor chips when the upper and lower non-planar substrates 1, 2 are brought into contact. FIG. 2 shows the plan view and an exploded view showing the power electronic package. FIGS. 3 and 4 show the upper and lower non-planar substrates layouts. Inner and outer sides for these high thermal conductivity insulating non-planar substrates 1, 2 are shown in the figures. The power semiconductor transistor chips 20 have an upper surface 21 and a lower surface 22 as two principal surfaces. On the lower principle surface 22 of each transistor chips 20, a drain or collector electrode 23 is formed over the entire surface. On the other upper principle surface 21 of the transistor chips 20 a small rectangular gate electrode 24 is formed in the selected region of the upper principle surface and a drain or emitter electrode 25 is formed in the remaining upper principle surface region. The power semiconductor diode chips 30 also have an upper surface 31 and a lower surface 32 as two principal surfaces. On the lower principle surface 32 of the power semiconductor diode chips 30, a cathode electrode 32 is formed over the entire surface. On the upper principle surface 31 of the diode chips 30, an anode electrode 33 is formed while a cathode electrode 34 is formed on the lower principle surface 32 of the diode chips 30.

The power electronic package will be described with reference to FIG. 1 through FIG. 28. The upper and lower high thermal conductivity insulating substrates 1, 2 consists of a of non-conductive ceramic substrate 77 and highly conductive metal electrodes 7-10, bonded by either direct bonded copper, directly bonded aluminum or active metal brazing solder material. The ceramic substrate 77 comprises materials taken from the group consisting of alumina, aluminum nitride, silicon nitride, silicon carbide, or diamond, and copper or aluminum metal. Each of the upper and lower high thermal conductivity insulating substrates 1, 2 also has an inner surface 3, 4 and a outer surface 5, 6 as two principal surfaces. On the inner principle surface 3 of the upper high thermal conductivity insulating substrate 1, gate, drain or emitter, and anode external bus electrode patterns 7a, 7b, 8a, 8b, 9a, 9b, 9c, 10a, 10b are disposed, as shown in a top plan view of high thermal conductivity insulating substrate 1, 2 in FIGS. 3A to 4B. These external bus electrode patterns 7-10 on the high thermal conductivity insulating non-planar substrates 1, 2 are formed by either one-bond and two-step etching or the two-bond and two-step etching of copper or aluminum materials of the direct bonded copper, directly bonded aluminum or active metal brazing solder material. In addition to these external bus electrode patterns 7-10, electrically isolated regions 70 are disposed on the inner principle surfaces 3, 4 of the upper and lower high thermal conductivity insulating substrates 1, 2. These substrates 1, 2 consist of alternate layers of electrical insulator and patterned electrical conductor, the electrical conductor being presented to the components in order to make a mechanical and electrical connection. The surface profile of conductor regions on the substrates is adjusted so that they possess a number of raised regions, or posts, which are bonded during assembly to provide mechanical and electrical interconnection between the two substrates 1, 2. Depending on example embodiments, the raised regions may also be used to provide electrical and/or mechanical connection between the components and the substrates. These bonded regions, the number, placement, and geometry control the mechanical separation of the non-planar substrates 1,2. The segregation of the conductor layers into a number of electrically isolated regions allows an electrical circuit to be defined on one or both substrates.

The shapes of the electrically conductive and isolated regions will now be described. As shown in FIGS. 3A to 4B, the upper and lower high thermal conductivity insulating non-planar substrates 1, 2 are made up of a substantially rectangular shape, which also includes the external connection buses. In this embodiment, for example the half bridge rectifier is designed to operate with two transistors 20 and two diodes 30. The distance between the semiconductor chips is a variant as it plays a big role in determining the stress distribution over the whole power electronic package 100.

As shown in FIGS. 3A to 4B, the upper and lower high thermal conductivity insulating non-planar substrates 1, 2 are made up of a substantially rectangular shape, which also includes the external connection buses. Two semiconductor transistor 20 and two semiconductor diode chips 30 are soldered on the lower high thermal conductivity insulating non-planar substrate 2. Moving away from the semiconductor chips bonding region on the non-planar substrates 1, 2, the external line connection terminals, which defines DC bus and phase out leads, are positioned in the Z direction. The patterned connection buses are on upper and lower high thermal conductivity insulating non-planar substrates 1, 2 and provide direct integration of the power electronic package 100 with external circuitry like the gate drive unit (GDU) since no external rigging is necessary to compensate for the height difference between the buses. The external line connection terminal metal 7-10 is confined in the upper and lower high thermal conductivity insulating non-planar substrate geometry, and is not protruding from the non-planar substrates.

In the power electronic package 100, for the mechanical stability and to minimize the stress on the semiconductor chips, there are non-electrically active support posts on the periphery of the module. This is to aid with the mechanical support especially during the compression bond formation between the non-electrically active support posts and the semiconductor chips, thus preventing undue stresses from building up in the high thermal conductivity insulating non-planar substrates 1, 2.

Figure 5A:
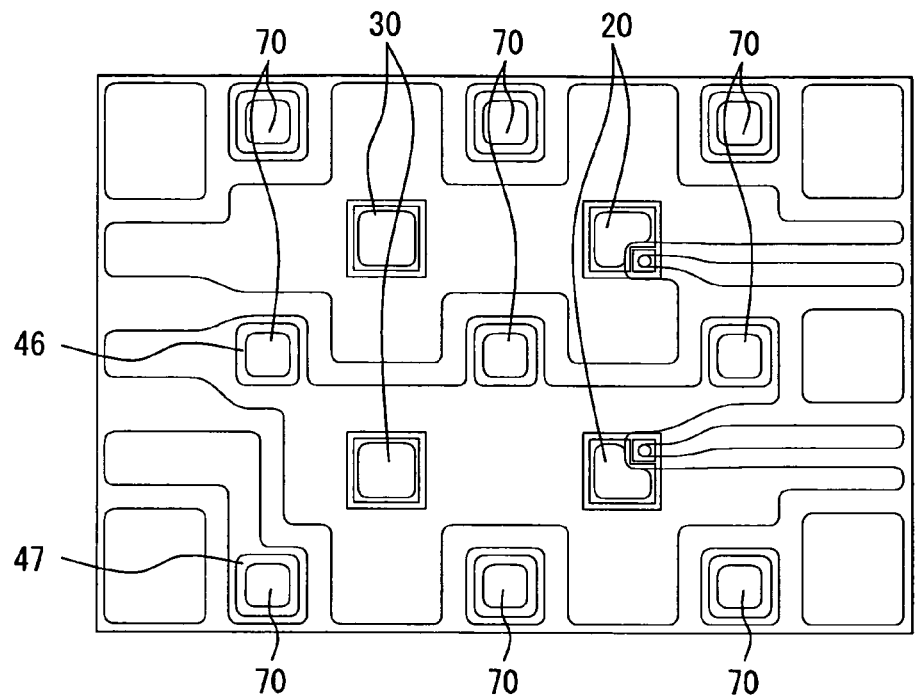
FIGS. 5A and 5B are the top plan views of the upper and lower high thermal conductivity insulating non-planar substrates showing the mechanical and electrical connections.
Figure 5B:
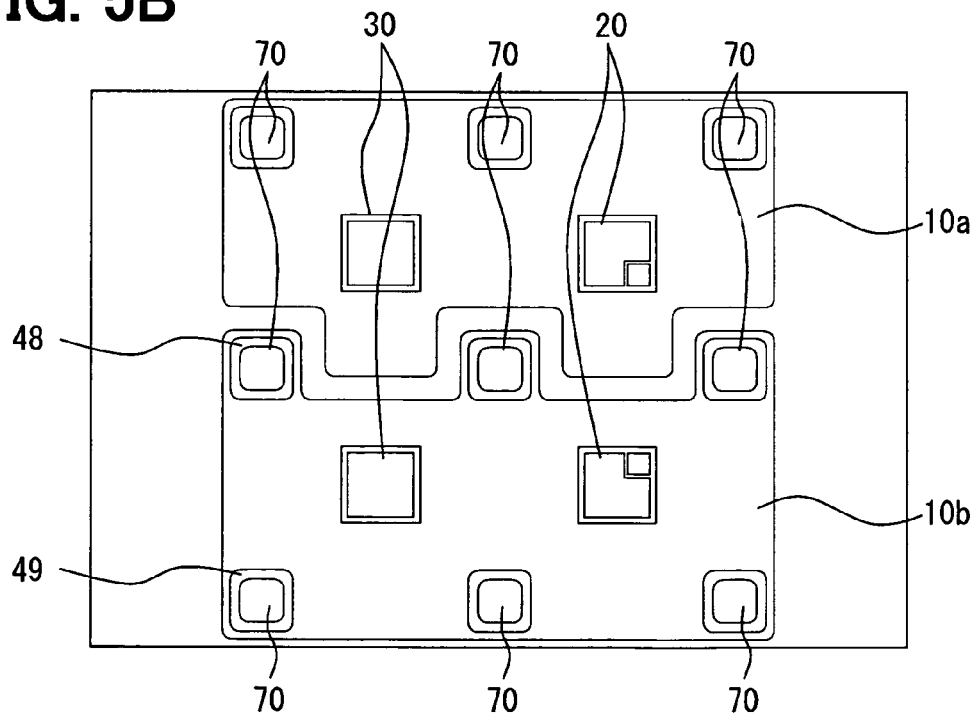

As shown in FIGS. 5A and 5B, the upper and lower high thermal conductivity insulating non-planar substrates 1, 2 consist of alternate layers of electrical insulator and patterned electrical conductor, the electrical conductor being presented to the components in order to make a mechanical and electrical connection. The surface profile of conductor regions on the substrates is adjusted so that they possess a number of raised regions, or posts, which are bonded during assembly to provide mechanical and electrical interconnection between the two substrates. Depending on example embodiments, the raised regions may also be used to provide electrical and/or mechanical connection between the components and the substrates. The segregation of the conductor layers into a number of electrically isolated regions allows an electrical circuit to be defined on one or both substrates. As shown in the FIGS. 5A and 5b, in addition to the central phase out position, regions 46 and 47 on the upper high thermal conductivity insulating substrate 1 and regions 48 and 48 on the lower high thermal conductivity insulating substrate 2 provides the mechanical as well as electric connections for the power electronic package.

Figure 6A:
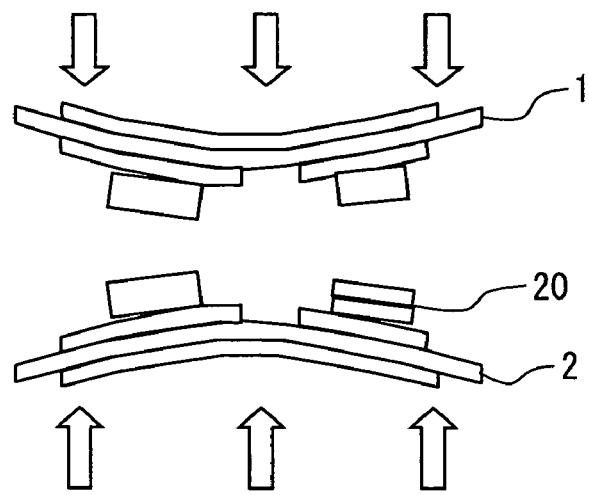
FIGS. 6A to 6C are cross-sectional views showing a schematic of the power electronic package at various stages, FIG. 6A explains the package before assembling, FIG. 6B explains the package during reflow process, and FIG. 6C explains the package after assembling.
Figure 6B:
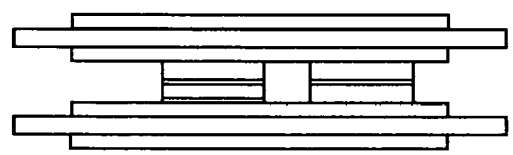
Figure 6C:
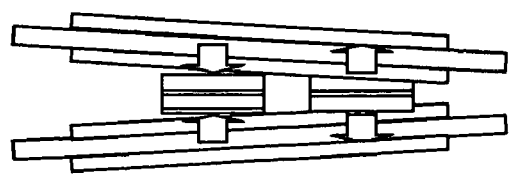
Figure 7:
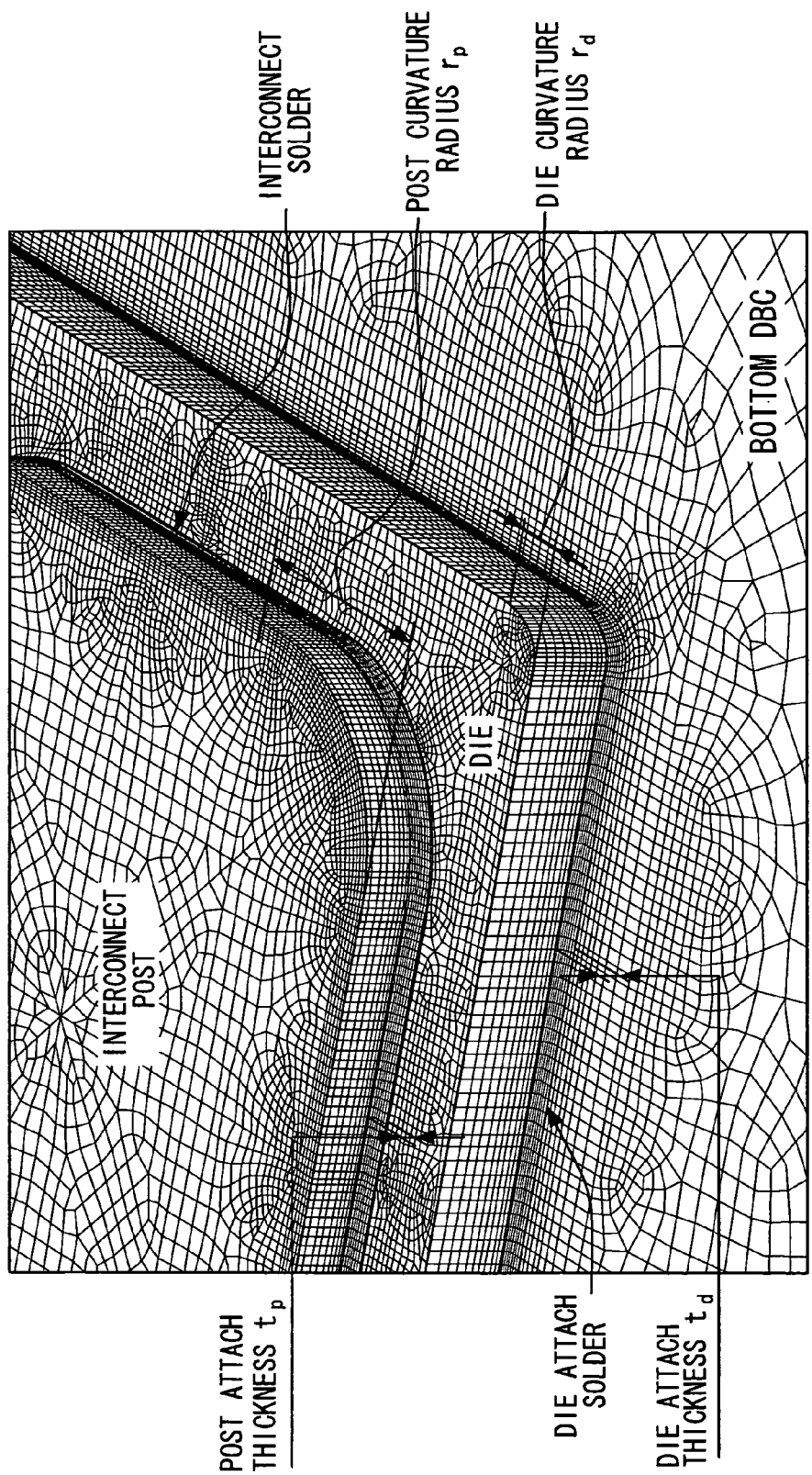
FIG. 7 is an expanded view of a meshed 3D image of a semiconductor chip and a connection post region in the power electronic package.

FIGS. 6A to 6C show the power electronic package schematic at various stages; FIG. 6A shows the package before assembly, FIG. 6B shows the package during reflow process, and FIG. 6C shows the package after assembly. Differential thermal expansion coefficients in the material of the package will induce stress after reflow process. The existing various stress forces are as follows: unequal stresses in starting high thermal conductive insulating non-planar substrate leading to bowing prior to assembly process; tensile force in copper-copper bonding regions for mechanical strength as the copper contract more than the semiconductor chips; compressive force on the semiconductor chips, while excessive stress may cause damage to the semiconductor chip; and bending force on the semiconductor chips, depending upon the number and position and the distance between the insulating bonding areas. To optimise the power electronic package design, stress values are calculated to determine the key package parameters. Geometry considerations are important when doing a thermo-mechanical analysis of the assembly process. Optimization of parameters defining etched features within the ceramic tiles is important in minimizing the residual stresses that result after assembly of the ceramic sandwich. Areas, which are susceptible to high resultant forces, are primarily the semiconductor chip (Die) side stack structure, the interconnect posts and the support posts.

Figure 8:
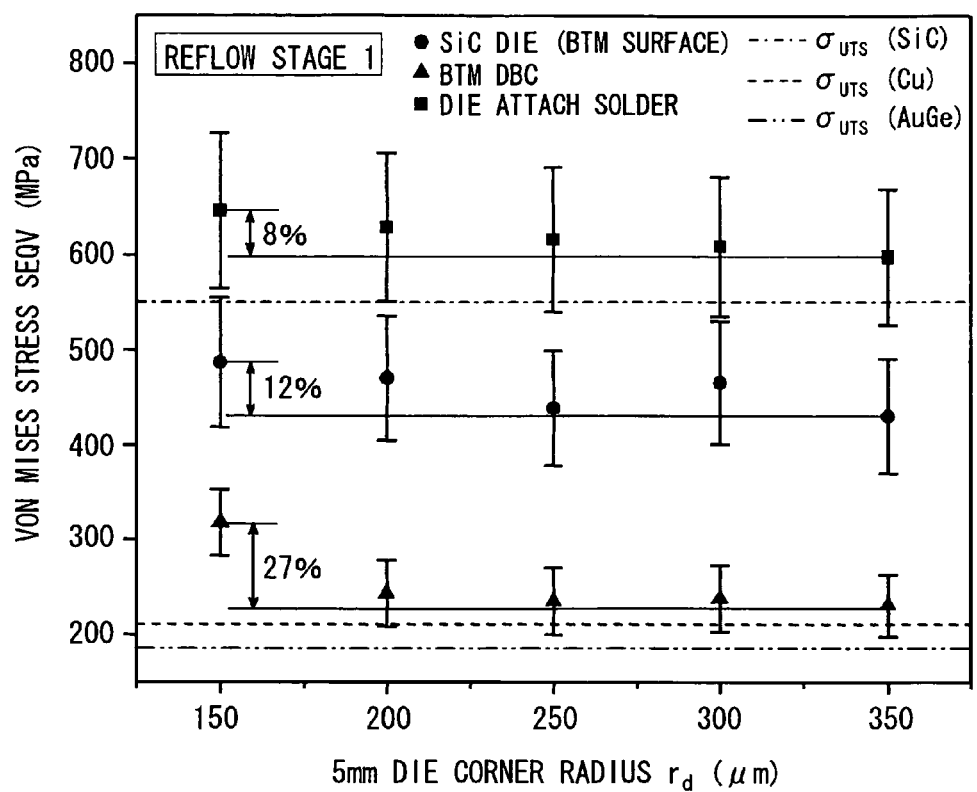
FIG. 8 is a graph showing the calculated results of effect of semiconductor chip (Die) corner radius on the total stress values in a copper layer of the lower non-planar substrate and a solder material (AuGe) after the reflow process.
Figure 9:
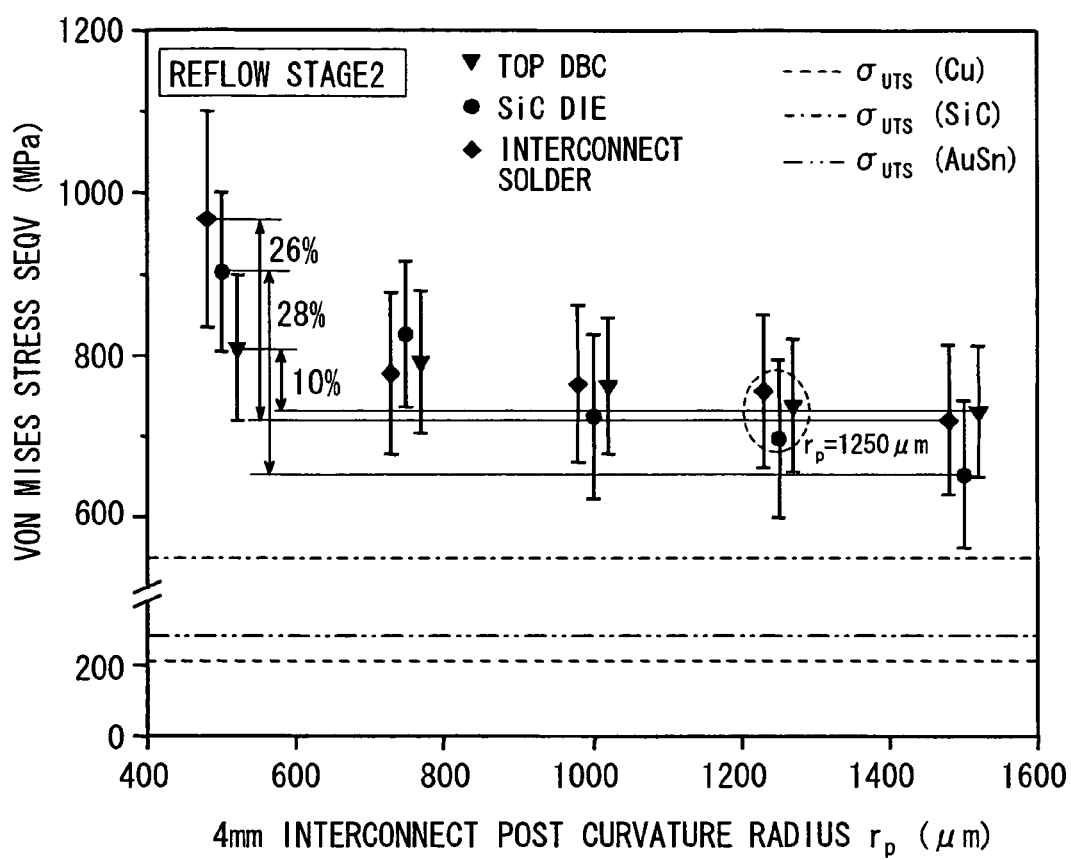
FIG. 9 is a graph showing the calculated results of stress variations in the various material layers attributed to increasing interconnect post curvature after the reflow process.

Localized elevation of the resultant stresses are symptomatic of sharp corners in the model being investigated. In an attempt to investigate the extent to which we are able to reduce the spike in stress values along the corners of the semiconductor chip, we introduce curvature to the die corner, on the X-Y plane, with radius $r_d$ for a for example 5 mm die. Since laser cutting of semiconductor often leaves the vertical edges at right angles to each other, curvature in the Z direction will not be considered. This die curvature is seen in the meshed 3D model of FIG. 7. Attaching the semiconductor chip to the lower high thermal conductivity insulating non-planar substrates, the von Mises stress values (SEQV) for the material layers immediate to the AuGe chip attach solder are extracted for each $r_d$. These results are shown in FIG. 8. As expected, an exponential decay trend can clearly be seen, with a sharp decrease in SEQV observed between curvature radii of 150 and 200 µm. As seen from the initial assembly simulations, large stresses well in excess of the $\sigma_{UTS}$ for AuGe solder results as a consequence of the thickness of this layer in comparison to the other layers sandwiching it. The etched copper surface of the outer substrate experiences stress values that hover around the $\sigma_{UTS}$ of the material, with SEQV varying by 27% of the maximum and minimum values. The bottom surface of the SiC exhibits a 12% spread in stress values for varying $r_d$. These SEQV values are all significantly lower than the ultimate tensile strength of the material indicating that the curvature of the semiconductor die corner does not severely influence the forces within the die during the die attach process. For $r_d$=250 μm, following the second reflow process for the bonding of the 4 mm post interconnect, large stresses are seen within the SiC die due to its completely elastic behaviour, with a spread of 28% decaying exponentially to 653 MPa, 18% of $\sigma_{UTS}$ (SiC) as seen in FIG. 9 when the post curvature radius $r_d$ is varied. While this is slightly in excess of the $\sigma_{UTS}$ for SiC, this is expected to saturate to the yield stress of the material in the actual assembly. While the stresses seen in the other materials surrounding the AuSn solder are much higher than their respective $\sigma_{UTS}$ values, they all exponentially decay gradually indicating that a circular interconnect post (as $r_d$ to infinite, i.e., ∞) as shown in FIGS. 10A to 10E would best minimize the residual stresses in the upper high thermal conductivity insulating non-planar substrate.

Figure 11:
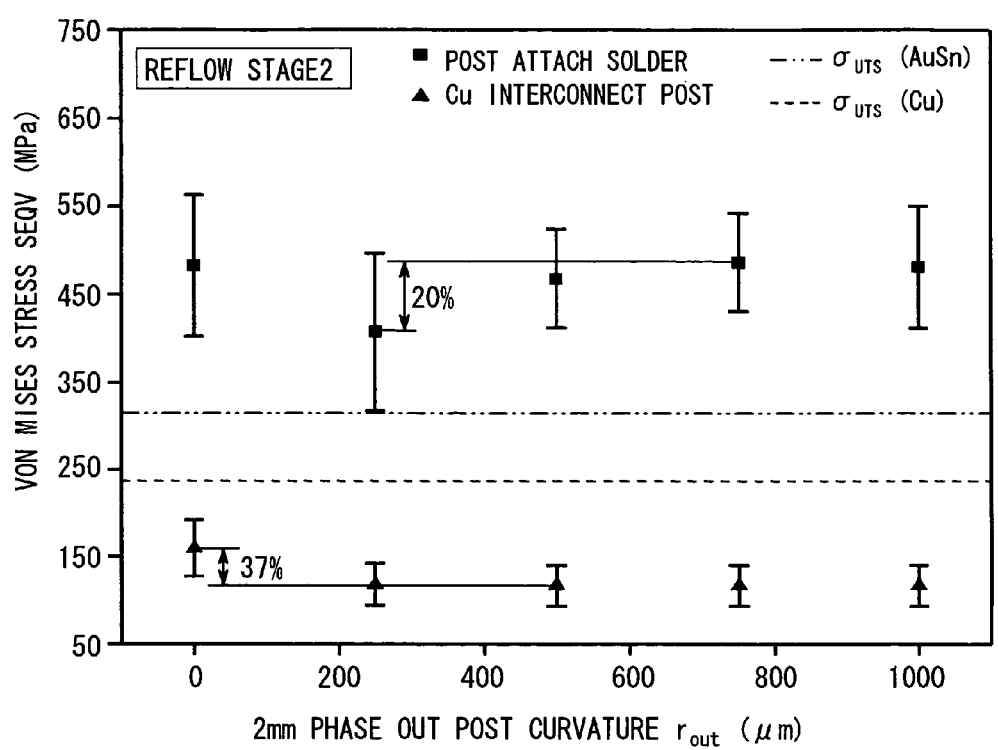
FIG. 11 a graph is showing calculated results of influence of increasing curvature of a phase out post on the residual stresses in the copper surface of the upper non-planar substrate and the interconnect solder material layer.
Figure 12B:
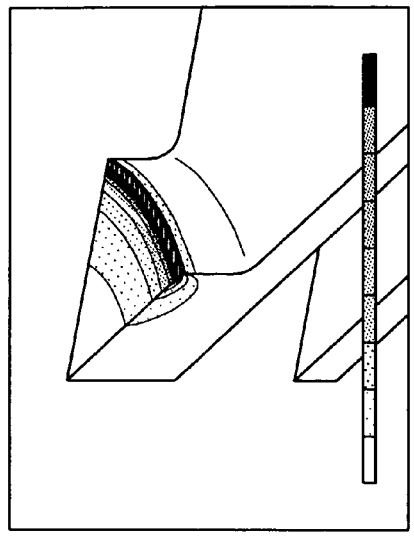
FIGS. 12A to 12D are views showing calculated phase out post analysis with and without a vertical etched profile indicating a 30% decrease in residual stresses in the copper layer due to the inclusion of curvature in the Z direction.
Figure 12D:
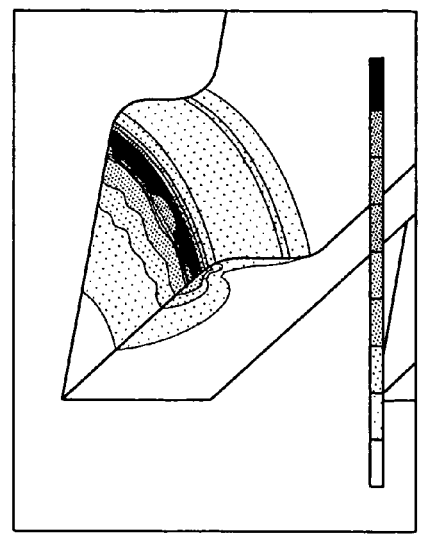
Figure 12A:
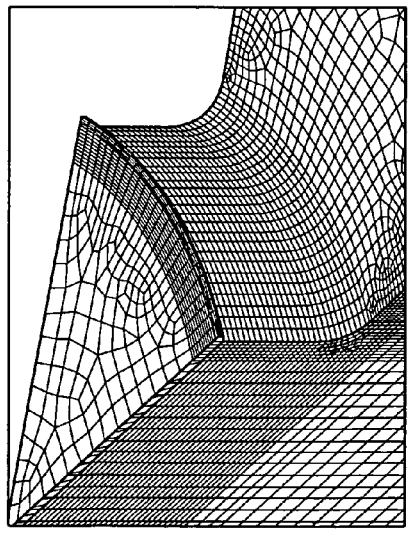
Figure 12C:
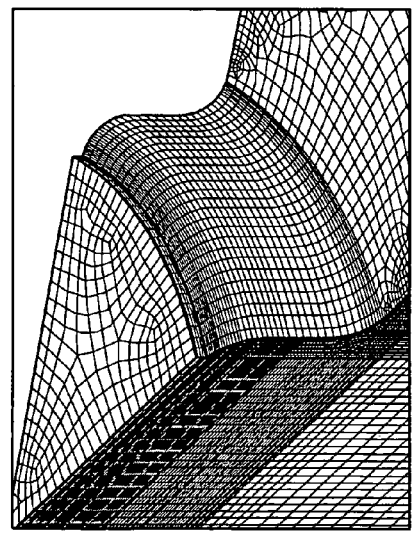

Moving away from the die vicinity, the inventors examine the phase out post geometry. Here, the inventors consider a structure that is symmetrical about the AuSn interconnect solder layer. The phase out post curvature is then varied, starting off with a completely square 2 mm post structure to a completely circular one with $r_{out}$=1 mm. After reflowing the AuSn solder (similar to second reflow process), the resultant maximum stresses in the models are extracted for each $r_{out}$ and are shown in FIG. 11. While the AuSn solder layer does experience the expected elevated elastic stress values, the von Mises stress contours in the coppwer post indicate a 37% decrease in $\sigma_{Cu}$ when moving from a square to circular phase out post. The significantly low stress values seen in the post structure indicate that the AuSn reflow process has little influence on the etched inner copper layer on both substrate layers in the vicinity of the phase out post. On the contrary, and as seen in the previous subsection, this soldering process has a much more severe influence on the resultant stresses in the interconnect post in the vicinity of the semiconductor chip.

In addition to curvature on the X-Y plane, an etch radius was introduced into the phase out post structure in the Z direction (radius taken to be half the height of the interconnect post). The inclusion of this curvature best approximates the actual inner surface of the etched non-planar substrates. For a complete circular phase out post, extraction of the residual stresses after solder reflow show a 30% improvement in $\sigma_{max}$ from 117 MPa to 84 MPa as indicated in FIGS. 12A to 12D. Also shown in the figure is the meshed model used in the analysis.

Figure 14:
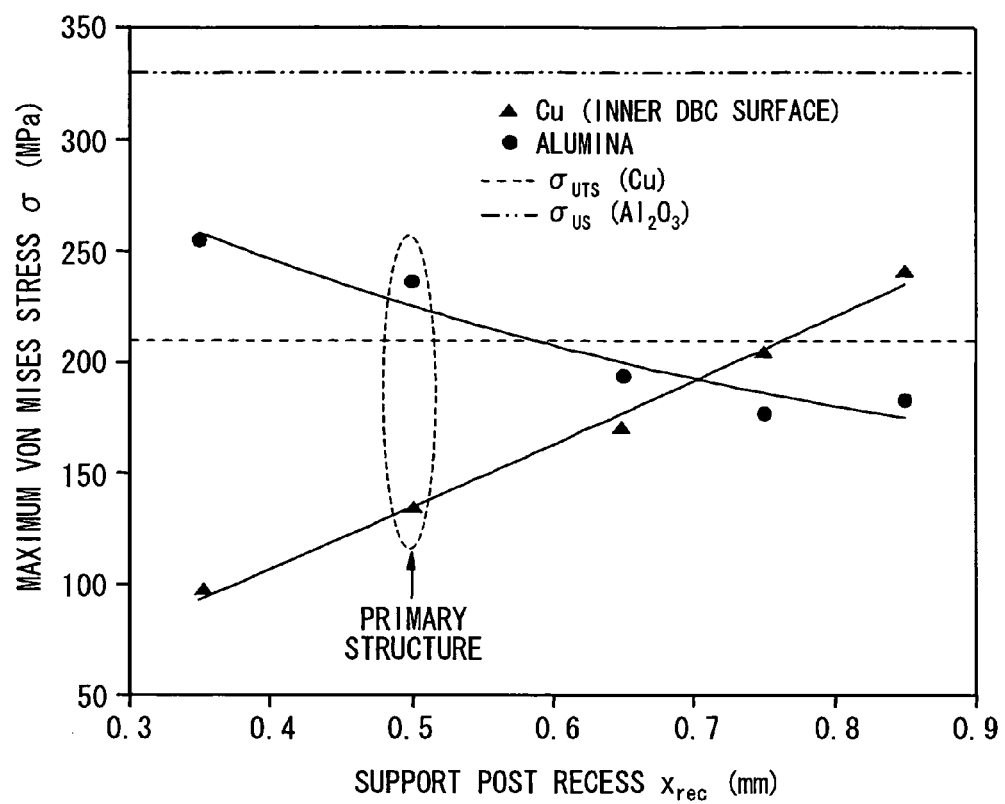
FIG. 14 is a graph showing the calculated residual stresses observed in the copper and ceramic layers of the support post structure on the assembled ceramic sandwich structure.

In this power electronic package design, the phase out post is an etched feature that comprises of a for example 300 μm copper block on the inner copper layer of the respective substrates, as indicated in FIGS. 13A and 13B. However, looking at the support posts, this etch goes all the way down to the ceramic layer thus creating a for example 500 μm high electrically isolated post. This slight change in geometry of the post structure has implications on the residual stresses that remain after assembly. The meshed model used in this analysis is also shown in FIGS. 13A and 13B. This model incorporates the curvature in X-Y plane, and in the Z direction. The inventors investigate the effect of varying the post recess distance $X_{rec}$ as indicated in figure. Extracted von Mises stresses in the copper and ceramic layers resulting from AuSn post attach solder reflow, for all $X_{rec}$, are shown in FIG. 14. From the plot, it is apparent that the stress values obtained in the structure are well below the ultimate tensile strengths of the respective materials. In addition, the trends seen by the copper and alumina layers are in opposition to each other where σ (Al$_2$O$_3$) decreases while σ (Cu) increases with increasing $X_{rec}$. Excessively large recesses will result in plastic deformation of the copper layer thus placing a geometry constraint on the support post structure. Since a exponential decreasing trend is seen in the alumina layer, well below $\sigma_{UTS}$(Al$_2$O$_3$), keeping $X_{rec}$ to as small a design value as possible would prevent any plastic deformation of copper due to the buildup of residual stresses in the layer after assembly.

Spacing of post structures on the substrates 1, 2 is another important issue that needs to be analyzed. Due to excessive node count, 2D models were used in this analysis an example of which is shown in FIGS. 15A and 15B. These models incorporate post structures that are both interior to the substrates (300 μm in height) and electrically isolated structures that are etched down 500 μm to the ceramic layer.

Figure 16:
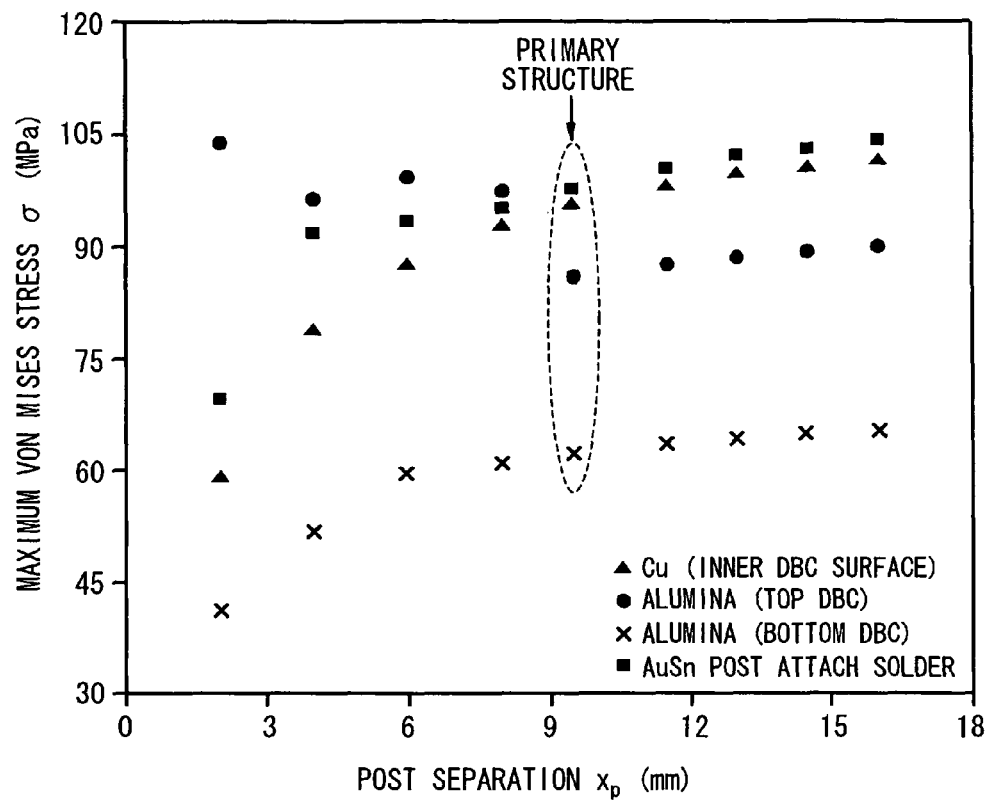
FIG. 16 is a graph showing the calculated results of varying post separation on the maximum stress values seen in the respective layers on the package assembly.
Figure 17:
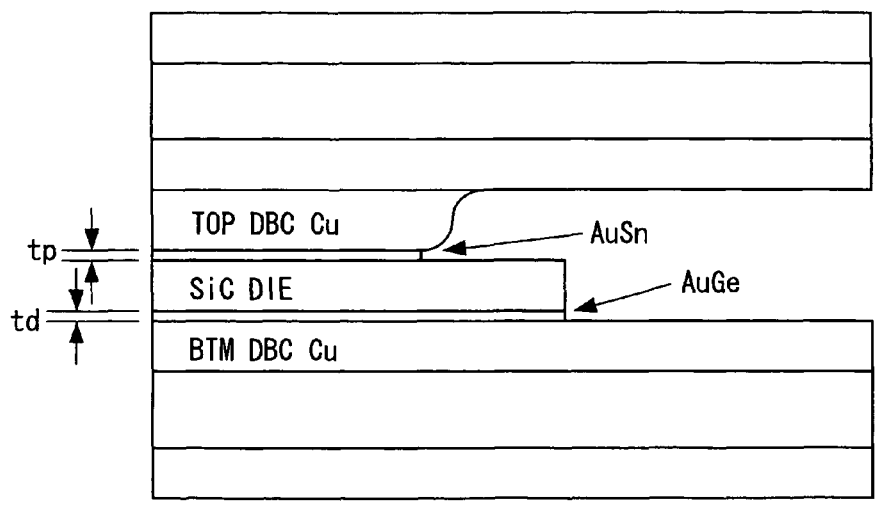
FIG. 17 is a schematic cross sectional view showing the ceramic sandwich assembly indicating the AuGe solder attach solder and AuSn interconnect post attach solder.

Solution of the AuSn solder reflow process reveals stress contours that are not symmetrical about the solder layer as in previous analysis, as shown in FIG. 16 for the primary structure with $X_p$=9.5 mm.

Breaks in the upper substrate 1 inner copper layer due to complete etch down of the copper for electrical isolation leaves 90° corners in the layer which then leads to localized stress elevation in the underlying ceramic. The maximum von Mises stress values in each of these layers is extracted, for each $X_p$. It is apparent from the plot that the stress values are well below the $\sigma_{UTS}$ for each material, although the exponentially increasing trends seen for most material layers will result in high stresses developing as the separation between posts increases to large values. Alumina on the upper and lower substrates 1,2 however react differently to the post separation due to the nature of the copper etch on the surface of the ceramic. Increasing the post separation alleviates the compressive stresses in the top substrate alumina thus reducing the stress seen in the layer. This trend is seen in FIG. 16.

Figure 18:
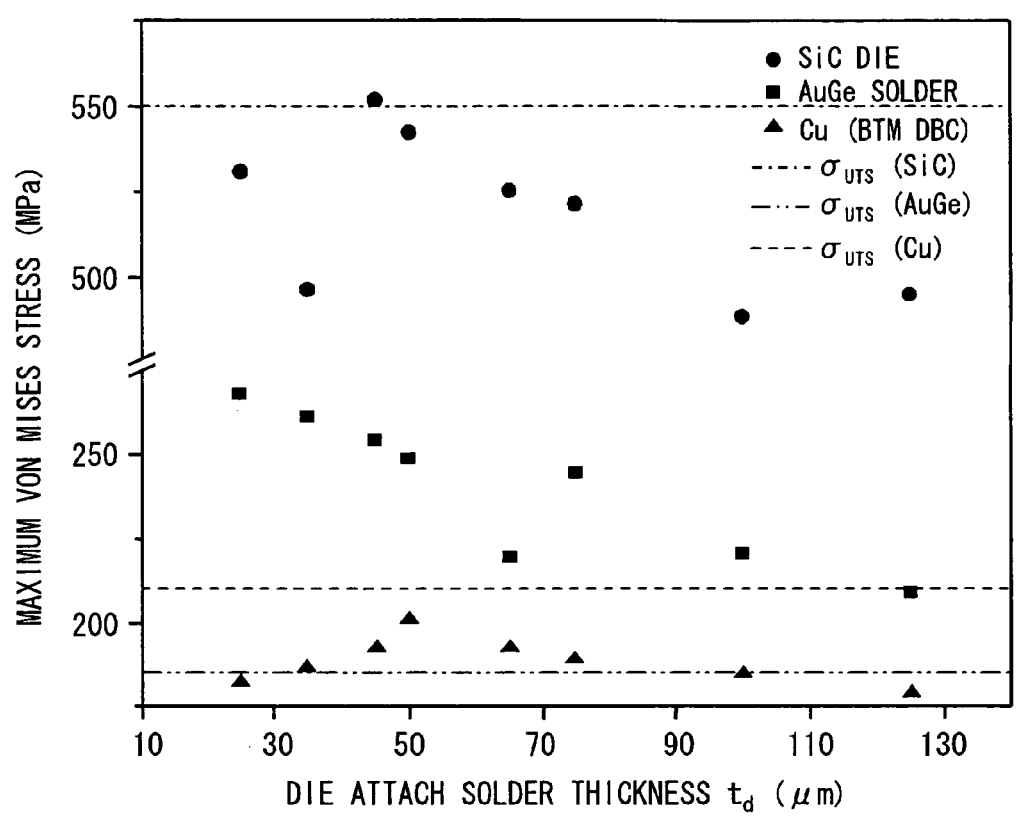
FIG. 18 is a graph showing the calculated results of stress values obtained from varying the die attach solder thickness after the reflow processes.
Figure 19:
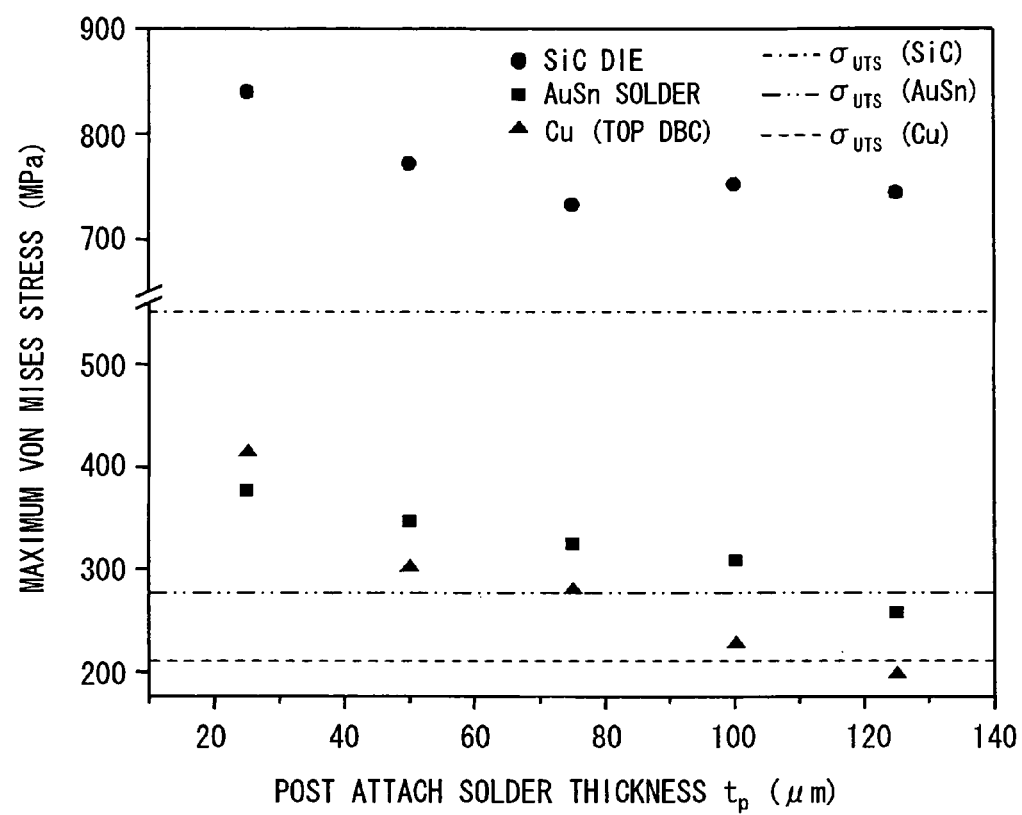
FIG. 19 is a graph showing the calculated results of stress values obtained from varying post interconnect solder thickness after the reflow processes.

In order to determine the extent to which the die attach and post attach soldering process has an influence on the residual stresses developed in the surrounding layers, the thicknesses of the die attach $t_d$ and post attach $t_p$ solders during the respective solder reflow processes. When investigating $t_d$, the assembly process is stopped after reflow process whereas in the case of $t_p$ variation, both solder reflow processes are simulated ($t_d$ held constant at 100 μm in this case). These parameters are indicated on the cross-sectional sketch of the ceramic sandwich given in FIG. 17. The extracted maximum von Mises stresses obtained when varying $t_d$ are shown in FIG. 18 for the upper substrate copper layer and the semiconductor chip. Both materials experience forces that are well below their respective $\sigma_{UTS}$ values, and decrease exponentially as $t_d$ increases. While the influence of the solder thickness is prevalent in these surrounding layers, the stress values extracted in the solder material itself is beyond its yield stress and thus should realistically saturate due to plastic deformation. However high stresses characteristic of completely elastic deformation is observed. When holding $t_d$ constant and varying $t_p$, a similar exponentially decreasing trend can be seen as $t_p$ to infinite, i.e., ∞, as seen in the plot of extracted stress values in FIG. 19. Since two layers of solder are on either side of the semiconductor chip, it is expected that the stresses developed in the die would saturate beyond the yield stress of the material. This is evident in the high extracted von Mises stresses seen at all the AuSn solder thicknesses investigated. While the stresses in the upper substrate layer and the AuSn post interconnect solder layer are within acceptable range of their $\sigma_{UTS}$ values, using thicker solders would minimize the residual stresses seen in the various layers of the ceramic sandwich package.

Figure 20:
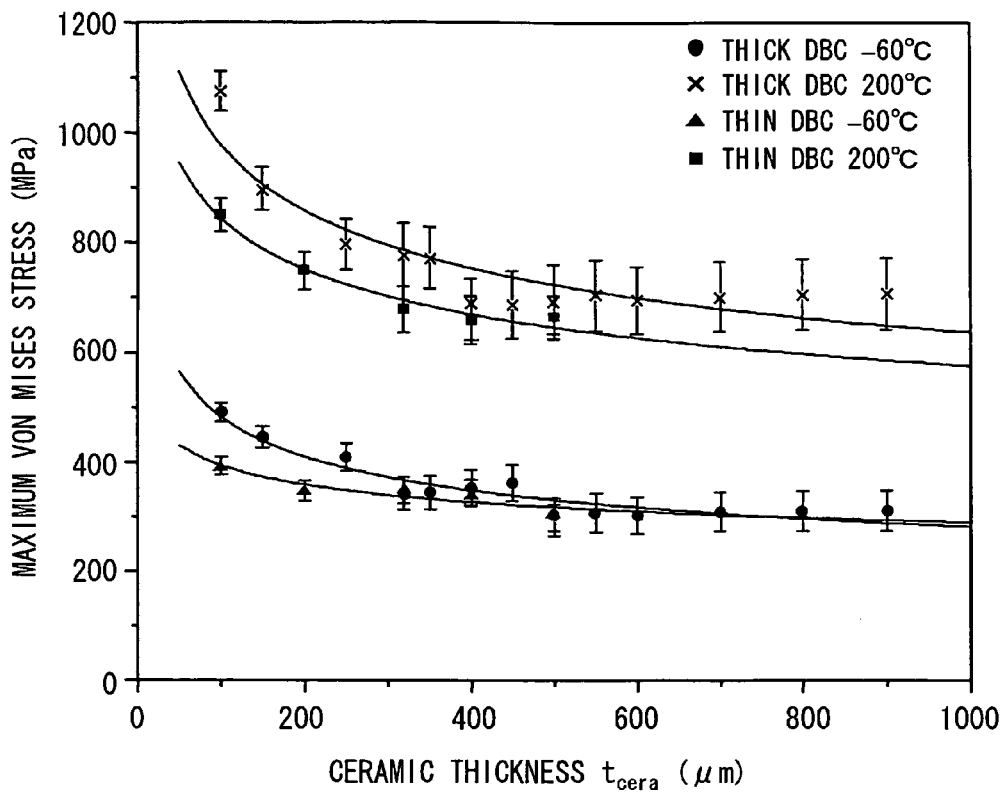
FIG. 20 is a graph showing the calculated maximum stresses obtained in the thin and thick copper ceramic layer of the power electronic package, shown at the extremes of the cycling temperatures used at −60 and 200° C.

Maximum Von Mises stresses in the alumina ceramic that are extracted from various type of substrates at various $t_{cera}$ are shown in the plot of FIG. 20 for the two extreme temperatures of the thermal cycle. From trends highlighted by the plot, thicker ceramic layers would reduce the stresses seen in the alumina layer as it will now be able to withstand the shear and compressive forces of the inner and copper layers on either side of it. In addition, it can be seen that the stresses in the conventional non-well structures are lower than the thick substrates, explaining the extended lifetime observed experimentally.

In the previous sections, the semiconductor chip experiences stresses that are well into the plastic range of deformation and as such, since the analysis here involves completely elastic material models, it is expected that the extracted von Mises stress values are well in excess of $\sigma_{UTS}$(semiconductor material) as seen in the chart. Similarly, due to the high aspect ratio of the FEA elements within the AuGe and AuSn solder layers surrounding the semiconductor chip, and the resulting close proximity of the integration points within the elements and their defining nodes, stresses in excess of the respective materials' $\sigma_{UTS}$ values are observed.

Figure 10A:
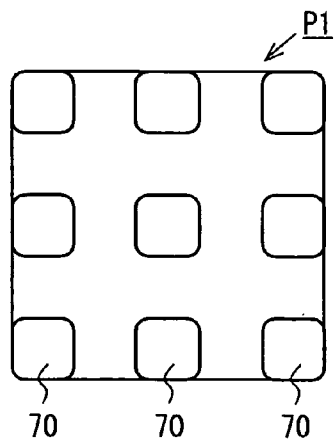
FIGS. 10A to 10C are top plan views showing nine (P1) and five (P2), (P3) posts position configurations including a central phase out post.
Figure 10B:
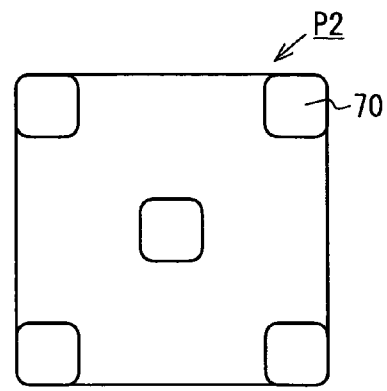
Figure 10C:
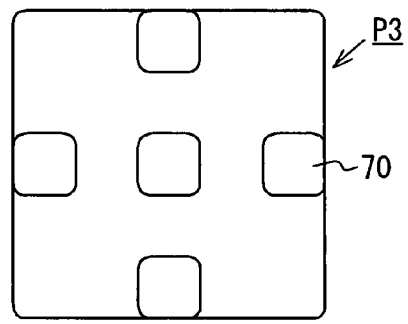
Figure 10D:
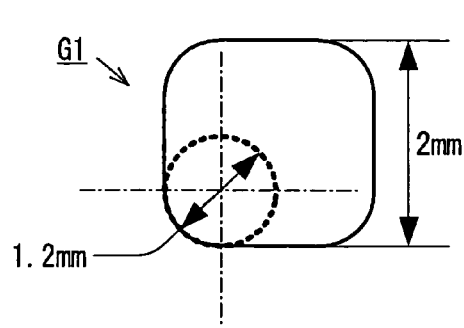
FIGS. 10D and 10E are top plan views showing suggested post curvatures (G1) and (G2)
Figure 10E:
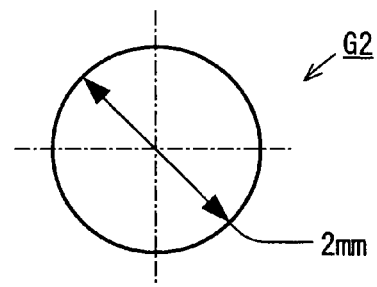

The number of non-electrically active support posts and the shape are also parameters as it also plays a role in determining the stress distribution over the whole power electronic package 10. There are three variations of layouts with support posts considered and nine and five support posts configuration are proposed. The central post is connected to the phase out terminal and has the same dimension. In FIGS. 10A to 10C show possible nine (P1) and five (P2), (P3) posts position configurations including the central phase out post. These substrates consist of alternate layers of electrical insulator and patterned electrical conductor, the electrical conductor being presented to the components in order to make a mechanical and electrical connection. The surface profile of conductor regions on the substrates is adjusted so that they possess a number of raised regions, or posts, which are bonded during assembly to provide mechanical and electrical interconnection between the two substrates. Depending on example embodiments, the raised regions may also be used to provide electrical and/or mechanical connection between the components and the substrates. The segregation of the conductor layers into a number of electrically isolated regions allows an electrical circuit to be defined on one or both substrates.

Figure 21:
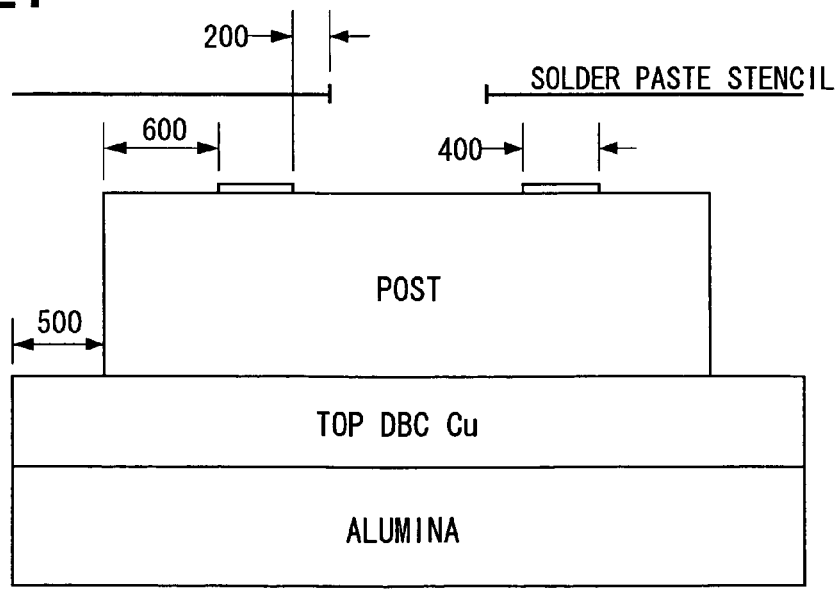
FIG. 21 is a schematic cross sectional view showing suggested layouts guide for the solder resist.

For the bonding of these electric insulating post regions, a solder stopper layer 50 is consider to protect the overflow of the solder 45 which may cause the short circuit after the complete reflow process. Solder resist layers are screen printed onto the posts and have a finite line thickness of for example 400 μm (mean position $Q_s(x, y) \pm 200$ μm). The screen-printing of the solder 45 paste onto the gate pad requires a stencil which has a tolerance of for example 200 μm as shown in FIG. 21. This solder resist can also be applied to the patterned electrodes used electric connection with semiconductor chips. On semiconductor chips, the fabrication process ensures sufficient polyamide coating on the device pads thus making solder stop layers redundant.

Figure 22A:
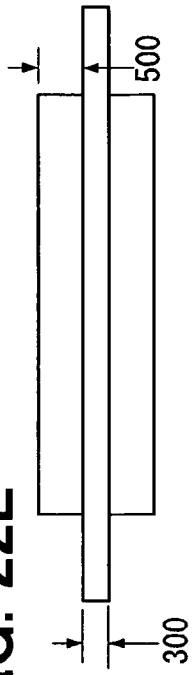
FIGS. 22A to 22G are cross sectional views showing double etching technique with either a single or double bonding process used for the fabrication of non-planar substrates.
Figure 22B:
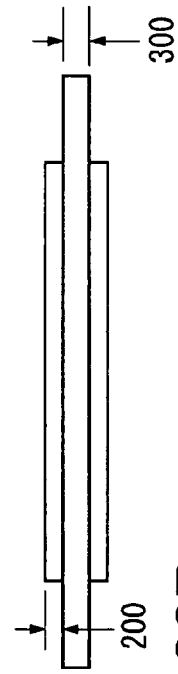
Figure 22C:
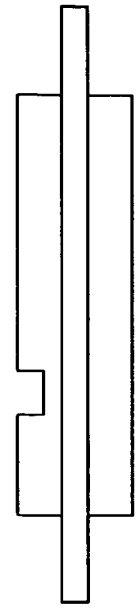
Figure 22D:
Figure 22E:
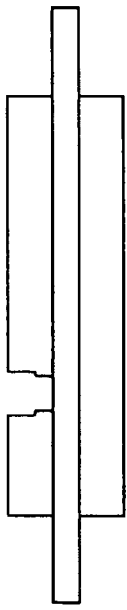
Figure 22F:
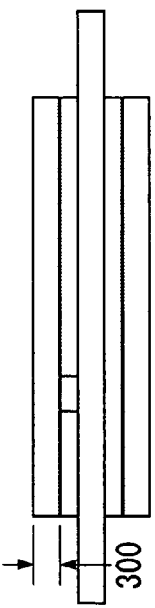
Figure 22G:
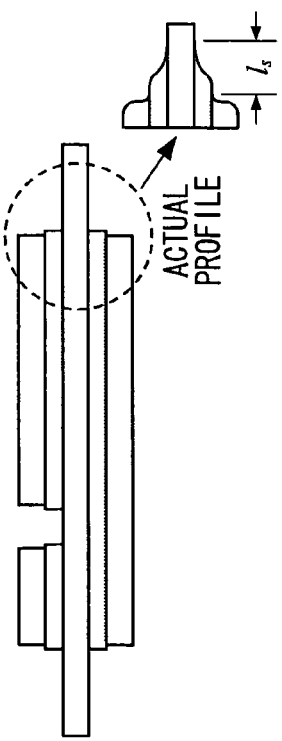

The fabrications of these high thermal conductivity insulating non-planar substrates 1, 2 are done by for example etching of the direct bonded copper. The various layers needed for each step is shown alongside the process flow. A double etching technique with either a single or double bonding process is used for the fabrication of non-planar substrates 1, 2 as shown in FIGS. 22A to 22G. In the double bond double etching process, the starting material is for example 300 μm thick ceramic with for example thin copper (200 μm) bonded on either side of it (FIG. 22A of Step-No. 1). This is then etched as specified by the mask (FIG. 22B of Step-No. 2) after which 300 μm of thick copper is bonded onto the surface of the etched thin copper (FIG. 22C of Step-No. 3). Etching of the thick copper then proceeds to give the final patterned direct bonded copper substrate (FIG. 22D of Step-No. 4). In the single bond technique, 500 μm of thick copper is bonded onto the ceramic to begin with (FIG. 22E of Step-No. 1), after which two etching processes are carried out to give the etched direct bonded copper substrate as required (FIGS. 22F and 22G of Steps-No. 2 and No. 3). The double bond double etch process boasts good control over the lateral spread $l_s$ of the etched features (for example within 100 μm and 250 μm) although the double etching results in an over-etching of the first 200 μm copper layer. The single bond double etch process leaves a much smoother copper surface.

Figure 23:
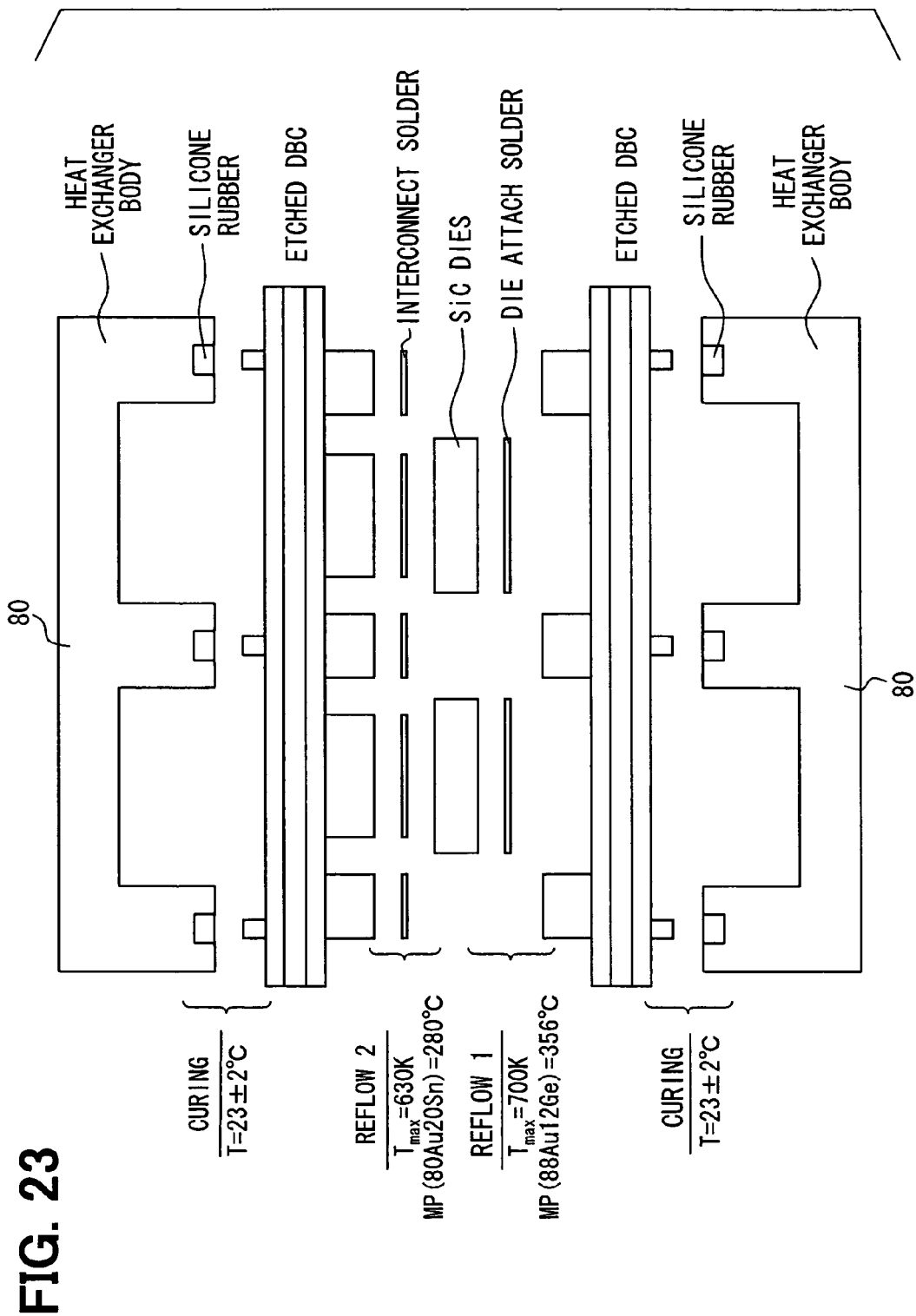
FIG. 23 is an exploded view of the package in the assembly process including the heat exchanger unit.
Figure 24:
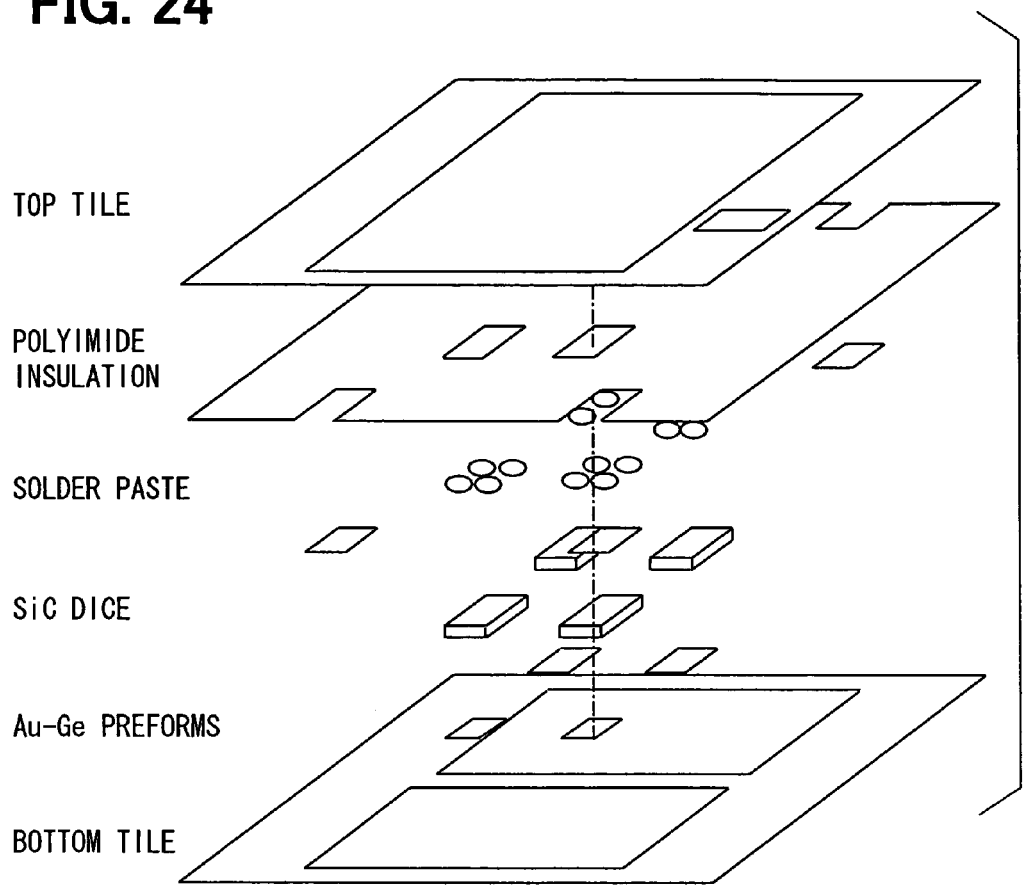
FIG. 24 is an exploded view showing the power electronic package in the assembly process using the alternative polyamide insulation sheet.

The power electronic package 100 various assembly stages with semiconductor chips and heat exchanges unit bonding is also shown in FIG. 23. Two high thermal conductive insulating substrates 1, 2 are brought face to face so that two semiconductor transistor chips 20 and two diode chips 30 are sandwiched between the two high thermal conductivity insulating substrates 1, 2. As a result of this, the patterned electrode patterns 7a, 7b, 8a, 8b, 9a, 9b, 9c on the upper high thermal conductivity insulating substrate 1, the control gate electrode 24, drain or emitter electrode 25 of the transistor chips 20 and the front side cathode electrode 34 of the diode chips 30 on the lower high thermal conductivity insulating substrate 2 side come together with the solder material 45 and/or solder stopper layer 50 there between. Then, the above-mentioned contacting parts being heated with a hot plate or a heating oven or the like carry out reflow soldering. The gap between the high thermal conductivity insulating substrates 1, 2 is controlled uniformly by the electrically inactive bonding posts and is almost double the value of the starting copper metal thickness which is for example about 0.3 mm to 5 mm. The gap of the sandwich package also takes in to account the thickness of the solder 45 after reflow process.

In this power electronic package, bonded regions control the mechanical separation of the non-planar substrates 1, 2, and therefore, there is no need to insert spacers between the two high thermal conductivity insulating non-planar substrates 1, 2. In brazing the semiconductor chips to the electrode patterns of the high thermal conductivity insulating substrates 1, 2, the brazing materials are screen printed attached on the bonding parts of the electrode patterns. Alternatively, a foil of a brazing material may be sandwiched between the electrodes of the semiconductor chips and the bonding parts of the electrode patterns.

In this embodiment, all semiconductor chips are soldered to the lower high thermal conductivity insulating substrate 2 in the first soldering operation (higher melting point solder 45 for example AuGe). Then, the upper high thermal conductivity insulating substrate 1 is brought together, and second soldering operation is carried out (lower melting point solder 45 for example AuSn). Alternatively, this assemble process can be carried out in a single soldering operation with the semiconductor chips sandwiched between the high thermal conductivity insulating substrates 1, 2, using the same melting point solder 45 for example AgSn, transient liquid phase process. In the second soldering operation, solder 45 large size bumps can be used as it can provide a control over the amount of solder 45 used in the soldering operation. For main electrode pads, several large size solder bumps can be formed on the semiconductor chips instead of one single bump. As the material of these bumps, gold based solder 45 is preferable for example AuGe and AuSn. To control the solder 45 thickness on the patterned electrodes on the high thermal conductive insulating non-planar substrates 1, 2, a solder stopper resist 50 can also be used to control the solder 45 amount after the reflow process. After the above-mentioned bonding is carried out, an insulating resin for example silicone resign is filled between the two high thermal conductivity insulating substrates 1, 2 and hardened by backing at a specific temperature. An encapsulant filling in the gap results in the elimination of air pockets in the structure, which consequently leading to air breakdown when high electric fields are involved. Alternatively a polymide insulation sheet can be inserted between the two highly conductive insulating non-planar substrate in the assembly process as shown in the FIG. 24.

According to this embodiment, semiconductor chips are sandwiched by two high thermal conductivity insulating substrates 1, 2, and the electrodes of the semiconductor transistor 20 and diode chips 30 and electrode patterns of the high thermal conductivity insulating substrates 1, 2 are bonded by brazing (for example AuSn and AuGe soldering) to make a power electronic package. The heat produced by the semiconductor chips are transmitted smoothly from the upper surfaces and the lower surface of the semiconductor chips to the high thermal conductivity insulating substrates 1, 2 and is thereby radiated swiftly.

The outer surface of the two high thermal conductive insulating non-planar substrates 1, 2 has been step etched to form ridges 43 so as to improve integration with first and second heat exchangers 80. Each of the heat exchangers 80 has milled groves on its inner surface. Etching a raised periphery (ridge structure) around the outer edge of the exposed copper would enable the heat exchanger body to sit firmly in place. A heat exchanger unit is sealed using the same insulating resin or using the low temperature solder 45 as shown in FIG. 23.

The external bus connection terminals are provided in the electrode patterns of the high thermal conductivity insulating substrates 1, 2. A laser ceramic ablation or ceramic cut of the bottom ceramic can expose the electrical connection buses after the full assembly. Therefore, it is possible to eliminate the work of providing separate terminals for connections to external lines and connecting these terminals to the electrode patterns. In particular, among the external line connection terminals, the main DC buses terminals are provided extending in the same direction, and the control electrode terminals for the gate driver unit are provided extending in the opposite direction to the main electrode terminals. With this construction, because it becomes easy for control lines and power lines to be kept apart, the construction is resistant to electromagnetic interference noise. In addition, such electrode layouts design effective in reducing the stray inductance of the power electronic package 100.

Figure 25:
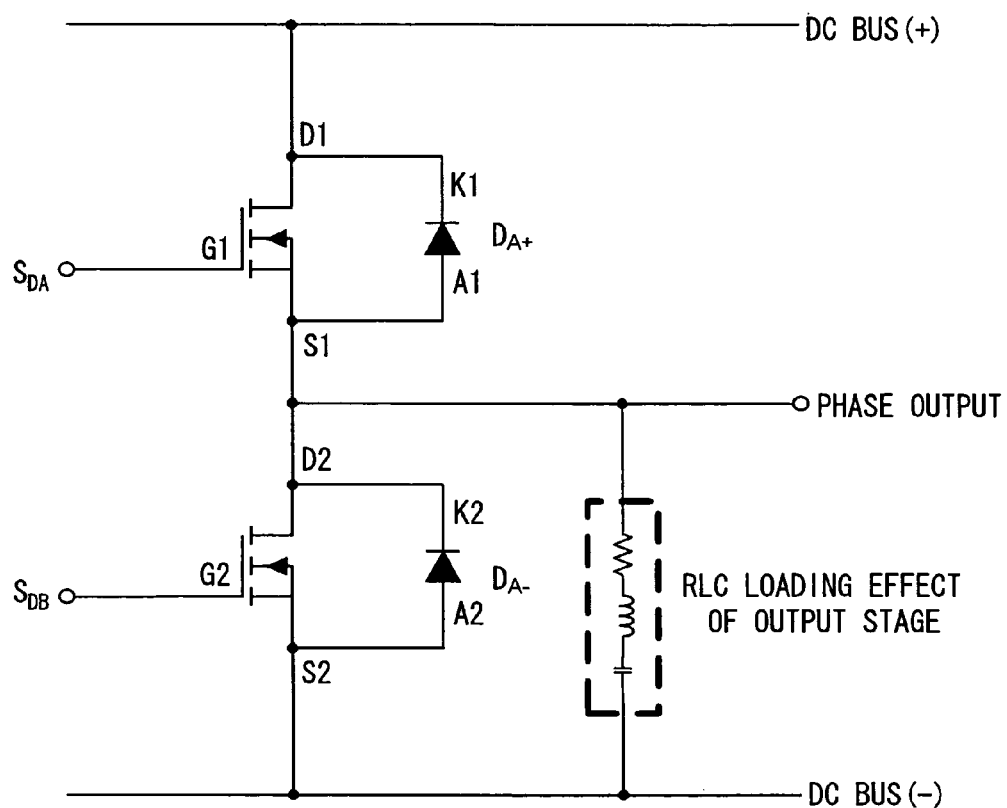
FIG. 25 is a circuit diagram showing an electrical circuit of the power electronic package.

A power electronic package 100 houses a half-bridge power stage. It consists of two semiconductor transistors 20 connected in series, each with its own recovery diode 30 also of the same rating. An electrical circuit diagram of the power electronic package 10 manufactured in the way described above is shown in FIG. 25. The layout of the semiconductor chips in the power electronic package 100 is shown in figure. As shown in FIG. 25, the drain or collector electrode of a transistors 20 are connected to a positive DC bus terminal, the source or emitter of the transistors 20 are connected to a negative DC bus terminal and the gate of the transistors 20 are connected to a gate drive unit terminals. Similarly, the terminals of diodes 30 are connected to the drain or collector and the source or emitter of the transistors 20 with respective polarity. The drain or collector of a second transistor 20 is connected to the source or emitter of the first transistor 20, and the gate of the second transistor 20 is also connected to a gate drive unit terminal. The central bonding area connects the upper and lower DC buses terminals to give the phase out signal. The terminals of a second diode 30 are connected with the polarity to the drain or collector and the source or emitter of the second transistor 20. Such a construction can be extended from explained half-bridge circuit to a full three-phase inverter circuit by bonding the multiple semiconductor chips.

Figure 26:
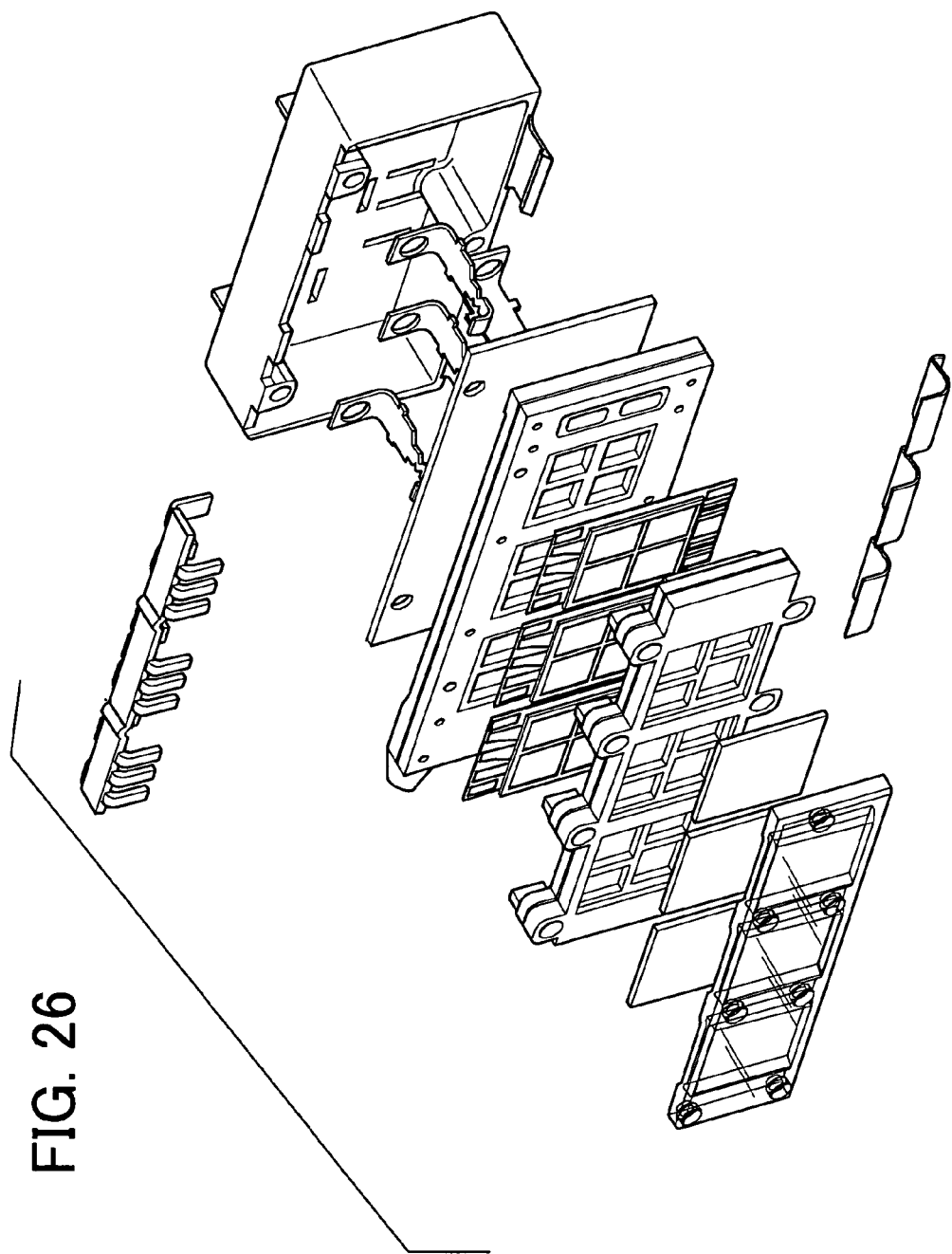
FIG. 26 is an exploded view of the power inverter system consisting of sandwich power module, DC link capacitor board and driver unit, all of which are cooled by integrated sealed heat exchanger unit.
Figure 27:
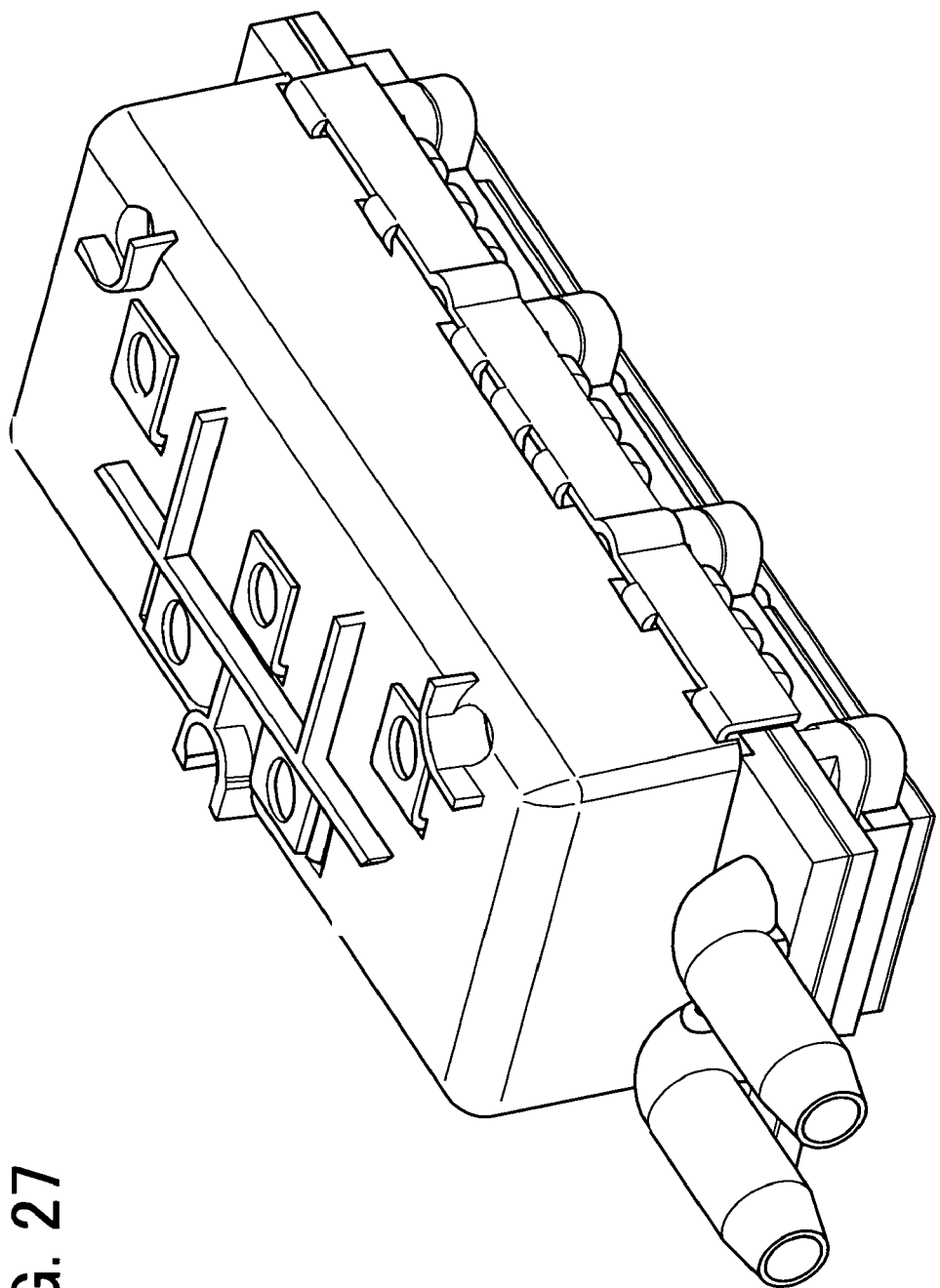
FIG. 27 is a perspective view of the power inverter system from topside.
Figure 28:
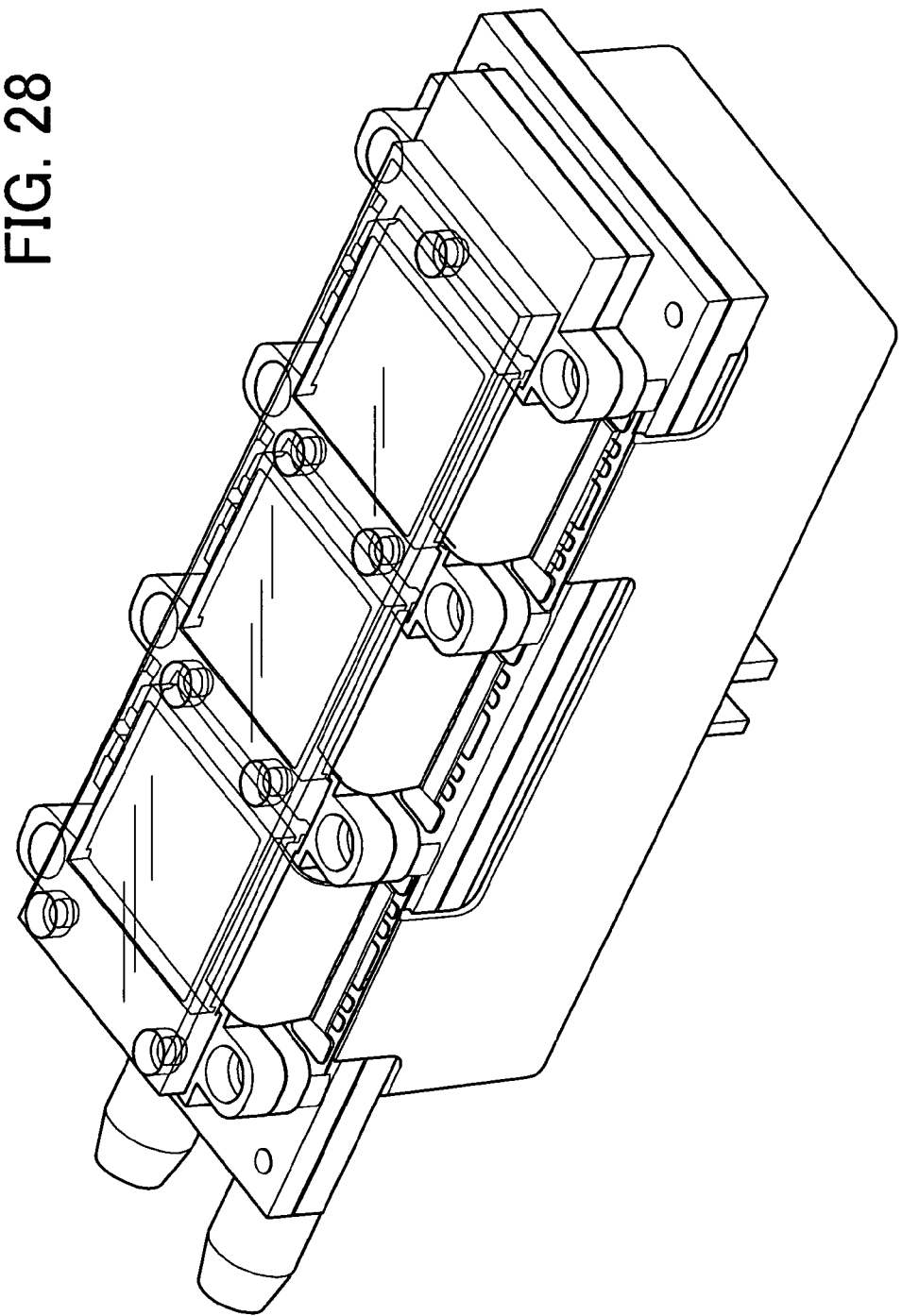
FIG. 28 is a perspective view of the power inverter system from bottom side.
Figures 29A, 29B, 29C, 29D:
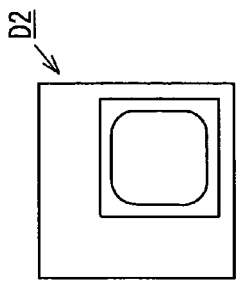
FIG. 29A to 29D are top and bottom plan views showing large and small semiconductor devices on the same chips with a common electrode post layouts.
Figure 29F:
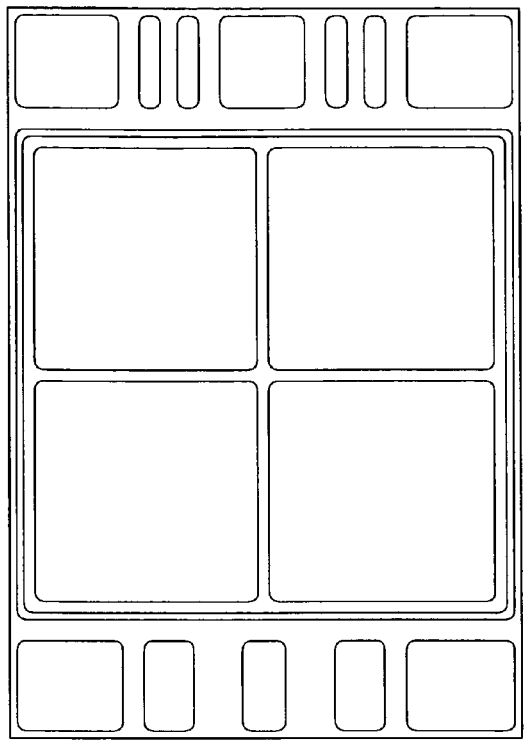
FIGS. 29E and 29F are top and bottom plan views of another upper high thermal conductivity insulating substrate that can accommodate with semiconductor device of different sizes.
Figure 29E:
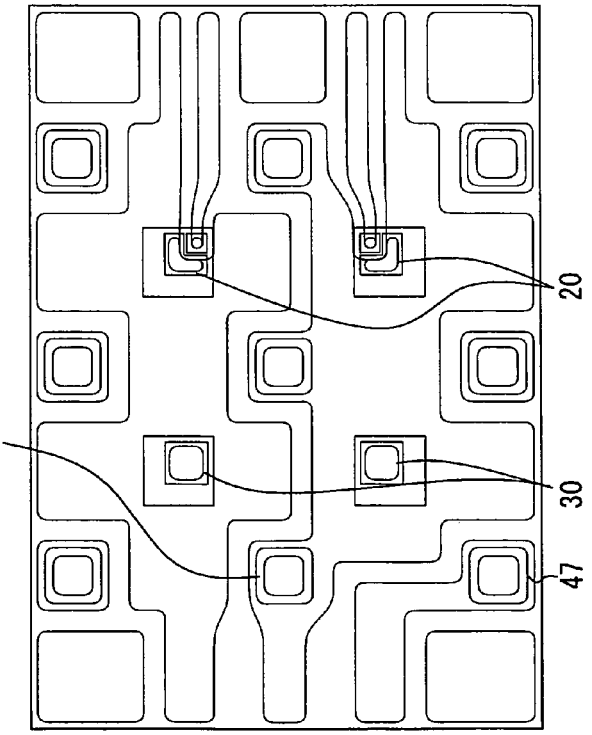
Figure 30A:
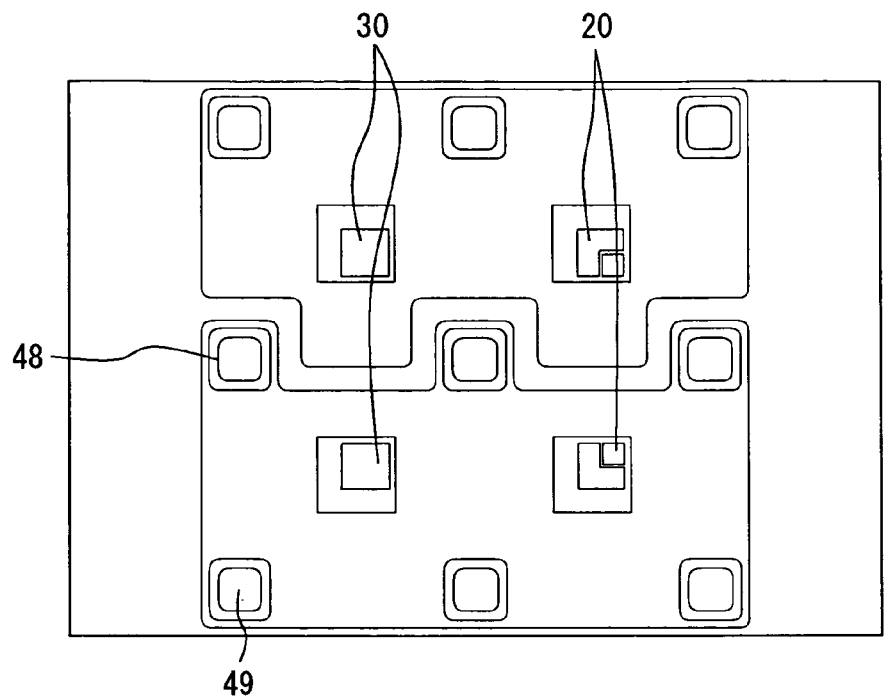
FIGS. 30A and 30B are top and bottom plan views of further another upper high thermal conductivity insulating substrate.
Figure 30B:
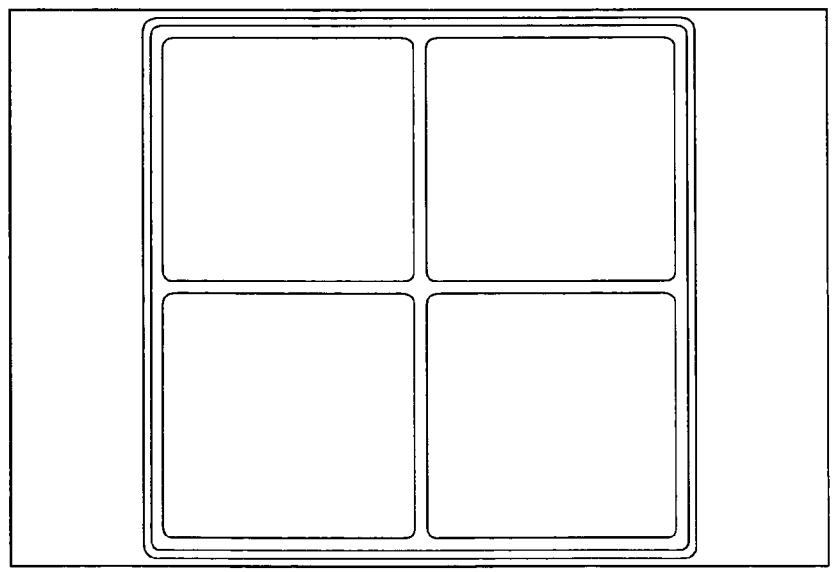

Referring to FIG. 26, FIG. 27, and FIG. 28, a description will be made of a power inverter system, which utilizes the all sides of the heat exchanger unit to cool for power module, DC link capacitor board and the gate driver unit. FIG. 26 shows the exploded view of the inverter system. The power electronic package is consists of three half bridge circuits described earlier in FIG. 25, which constitute a full three-phase inverter module. In this inverter system, the first side of the lower heat exchanger pinches the electronic package 100, while the individual gate driver unit for half bridge circuit pinches other side. On the other hand, the first side of the upper heat exchanger pinches the electronic package 10, while the individual DC link capacitor board for half bridge circuit pinches other side. Such a configuration allows the operation of inverter system at high operational temperatures. FIG. 27 and FIG. 28 show three-dimensional views of the power inverter system from top and bottom side.

In a second example embodiment, a power electronic package will be described with reference to FIG. 29A through FIG. 30B. The differences between this package and the package shown in FIGS. 1 to 28 will be described.

FIGS. 29E, 29F, 30A and 30B show the top and bottom plan views of upper and lower high thermal conductivity insulating substrates. To cater to both large and small semiconductor devices on the same chips, a common electrode post layouts have been considered (configuration D1 and D2) such that they will be aligned to the semiconductor transistor 20 bonding electrode pads of both geometries. The size of the patterned electrode bonding area is set either substantially slightly smaller than that of the semiconductor transistor 20 bonding electrode pads, and the projecting height of the patterned electrode is set to higher than the external connection buses. The curvature of thin features such as the gate electrodes has been increased to eliminate as many 90-degree corners as possible.

As shown in these figures, the upper and lower high thermal conductivity insulating non-planar substrates 1, 2 is made up of a substantially rectangular shapes, with all the external connection buses on the upper high thermal conductivity insulating substrate. The upper high thermal conductivity insulating substrate 1 is big in size compare to the lower upper high thermal conductivity insulating substrate 2. The semiconductor transistor 20 and diode chips 30 having their two principal surfaces front-rear reversed with respect to each other are sandwiched between the two high thermal conductivity insulating substrates 1, 2. First semiconductor transistor 20 and first diode 30 and second semiconductor transistor 20 and second diode chips 30 are soldered on the lower high thermal conductivity insulating non-planar substrate 2. The rest of the construction is the same as that of the first example embodiment. With this kind of construction also it is possible to improve the thermal heat generation and shear stress distribution within the power electronic package 10.

In a third example embodiment, a power electronic package will be described with reference to FIG. 31 through FIG. 33B. The differences between this package and the package shown in FIGS. 1 to 28 will be described.

Figure 31:
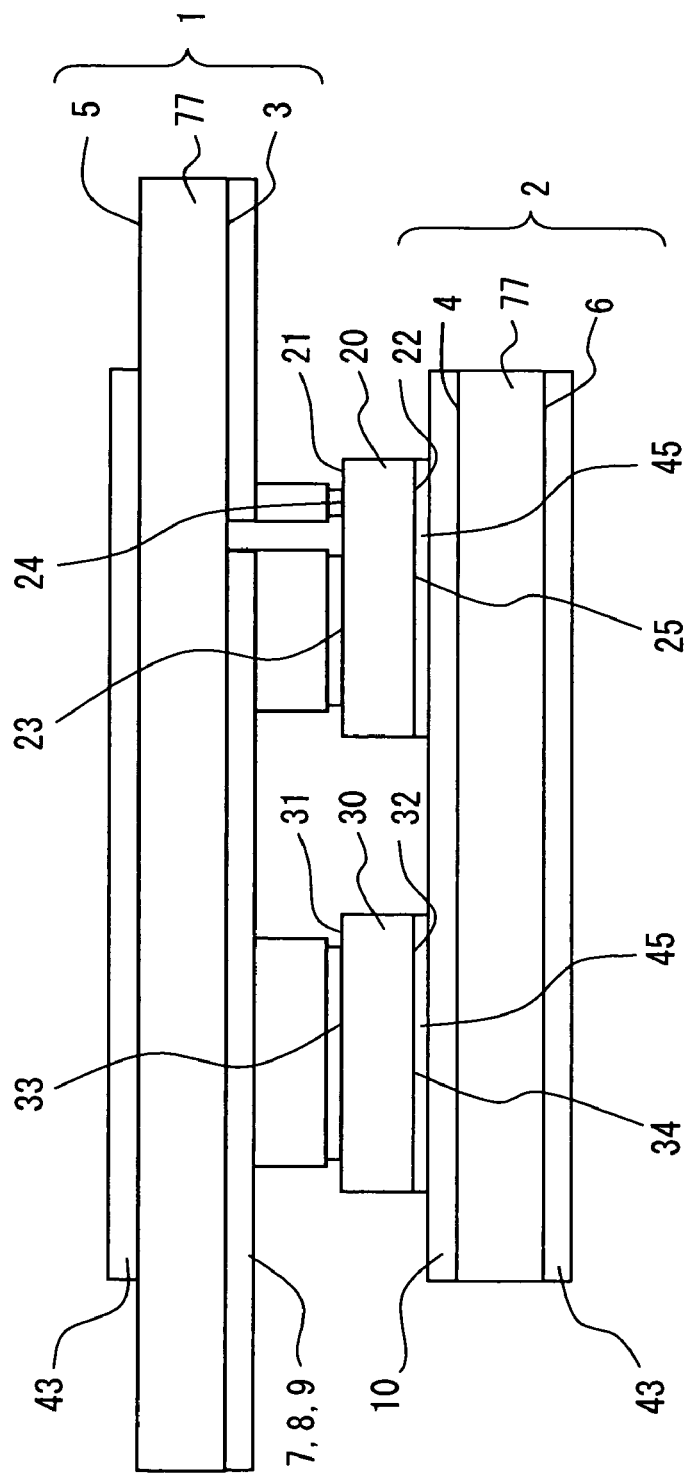
FIG. 31 is a cross-sectional view showing another power electronic package.
Figure 32A:
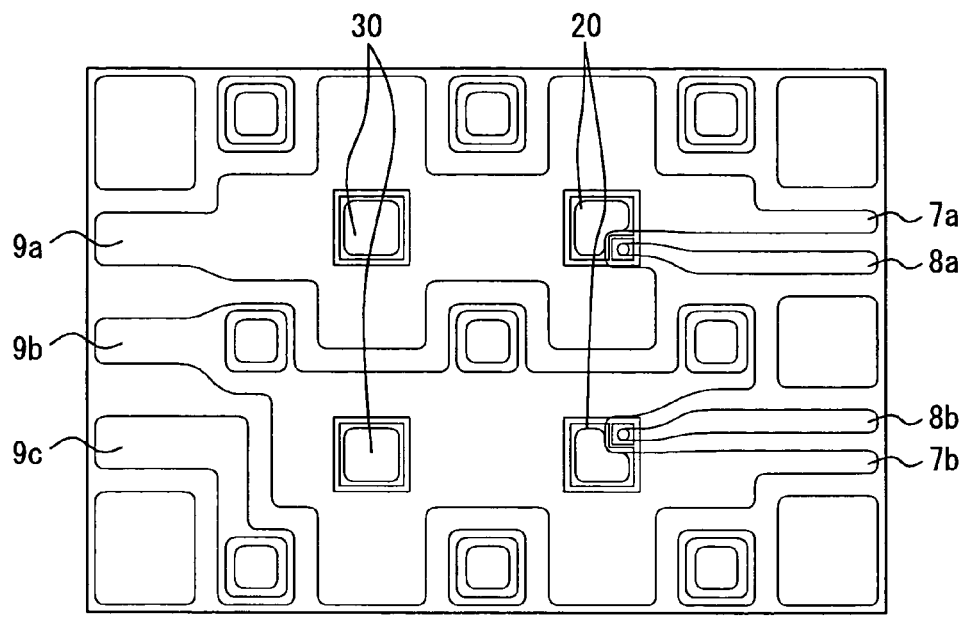
FIGS. 32A and 32B are top and bottom plan views of an upper high thermal conductivity insulating substrate.
Figure 32B:
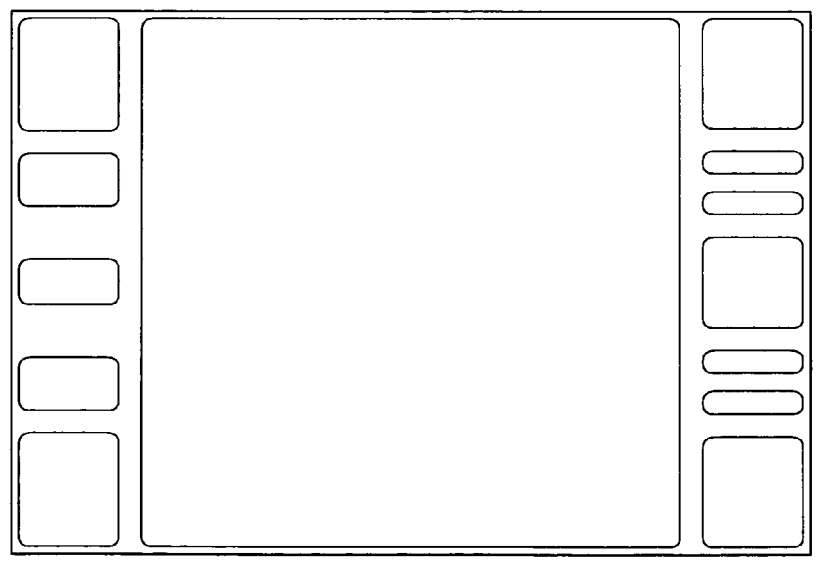
Figure 33A:
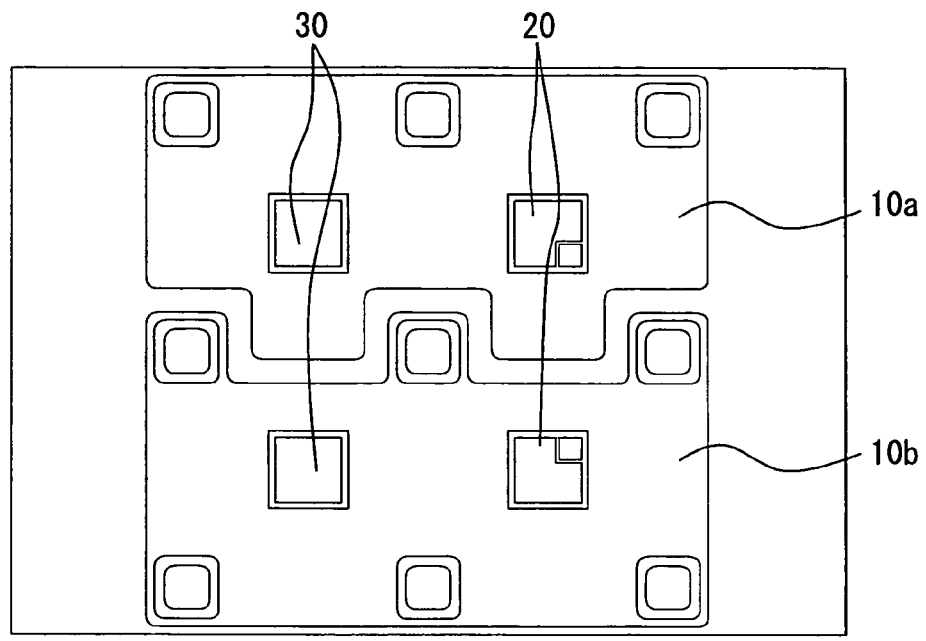
FIGS. 33A and 33B are top and bottom plan views of a lower high thermal conductivity insulating substrate.
Figure 33B:
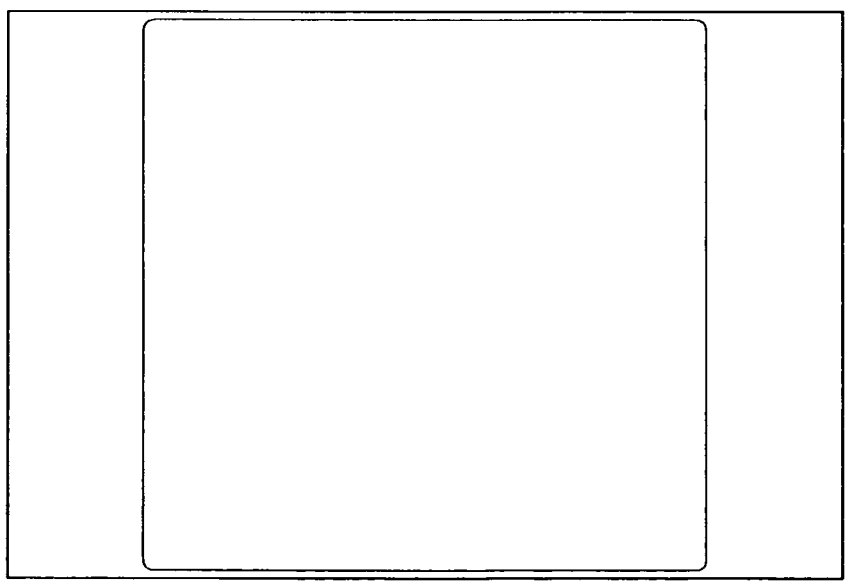

As shown in FIG. 31, each outer surface of the two high thermal conductive insulating non-planar substrates 1, 2 has not been etched for the improved integration with the heat exchanger 80. This example embodiment provide a freedom to use a integrated as well as a non integrated heat exchanger 80 for cooling the both side of the sandwich structure. The flat outer surface of the two high thermal conductive insulating non-planar substrates 1, 2 is suitable for using closed type micro-channel heat exchanger 80 unit using a thermal component in between to improve the heat radiation performance. However, this leads to a larger thermal resistance of the power electronic package 100. However, this configuration relaxes the total stress on the sandwich structure due to lack of direct bonding of the heat exchanger 80 unit. This structure can also be mounted on the air-cooled heat exchanger 80 units. The rest of the construction is the same as that of the first embodiment. With this kind of construction also it is possible to improve the thermal heat generation and shear stress distribution within the power electronic package 100.

FIGS. 32A to 33B show the top and bottom plan views of upper and lower high thermal conductivity insulating substrates. As shown in these figures, the upper and lower high thermal conductivity insulating non-planar substrates 1, 2 are made up of a substantially rectangular shapes, with all the external connection buses on the upper high thermal conductivity insulating substrate 1. The upper high thermal conductivity insulating substrate 1 is big in size compare to the lower upper high thermal conductivity insulating substrate 2. First semiconductor transistor 20 and first diode 30 and second semiconductor transistor 20 and second diode chips 30 are soldered on the lower high thermal conductivity insulating non-planar substrate 2.

In a fourth example embodiment, a power electronic package will be described with reference to FIG. 34 through FIG. 36B. The differences between this package and the package shown in FIGS. 1 to 28 will be described.

Figure 34:
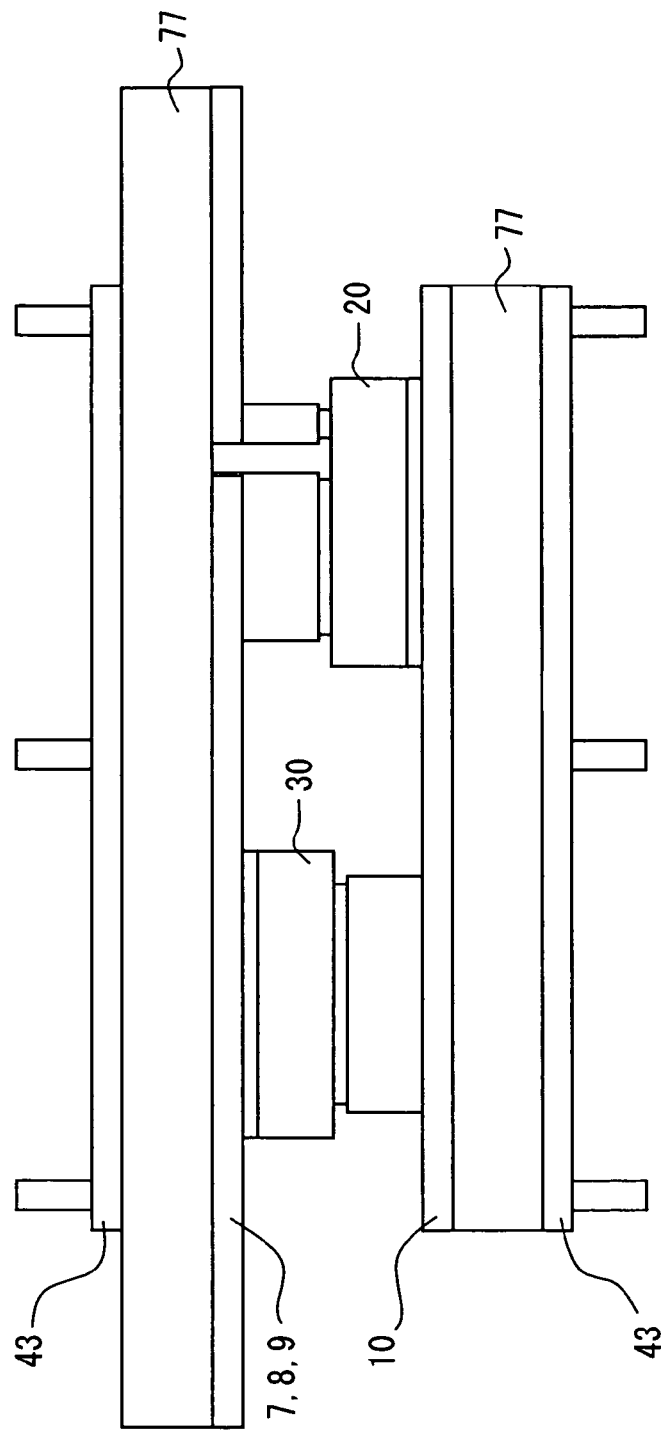
FIG. 34 is a cross-sectional view showing further another power electronic package.
Figure 35A:
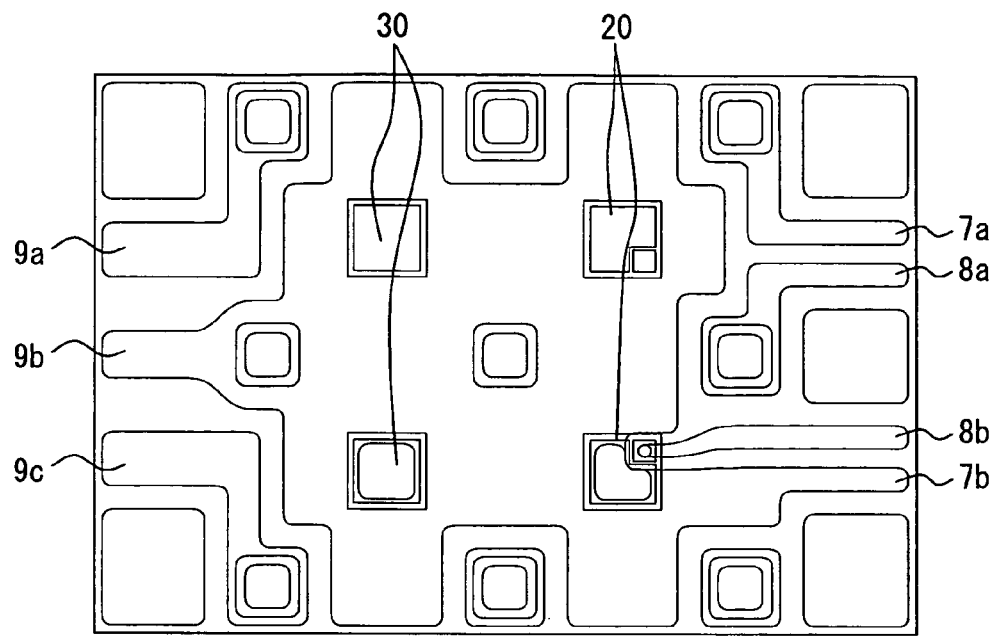
FIGS. 35A and 35B are top and bottom plan views of an upper high thermal conductivity insulating substrate.
Figure 35B:
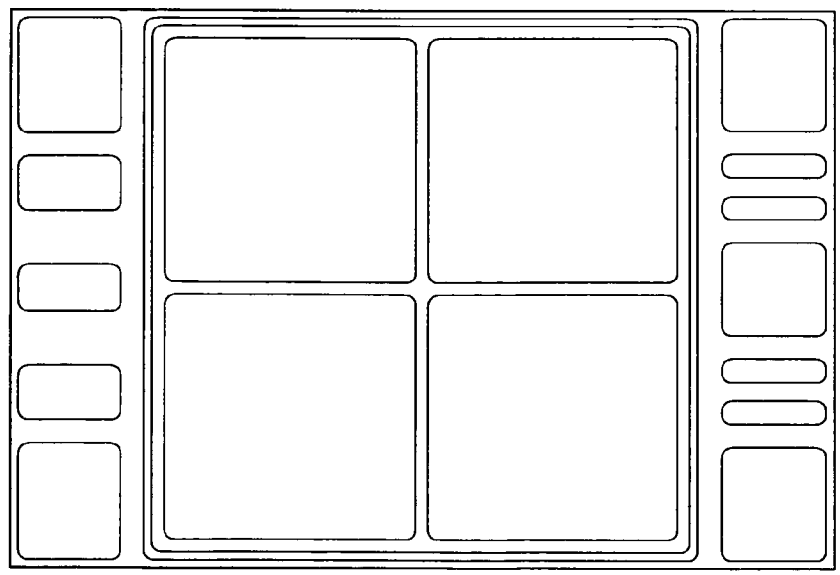
Figure 36A:
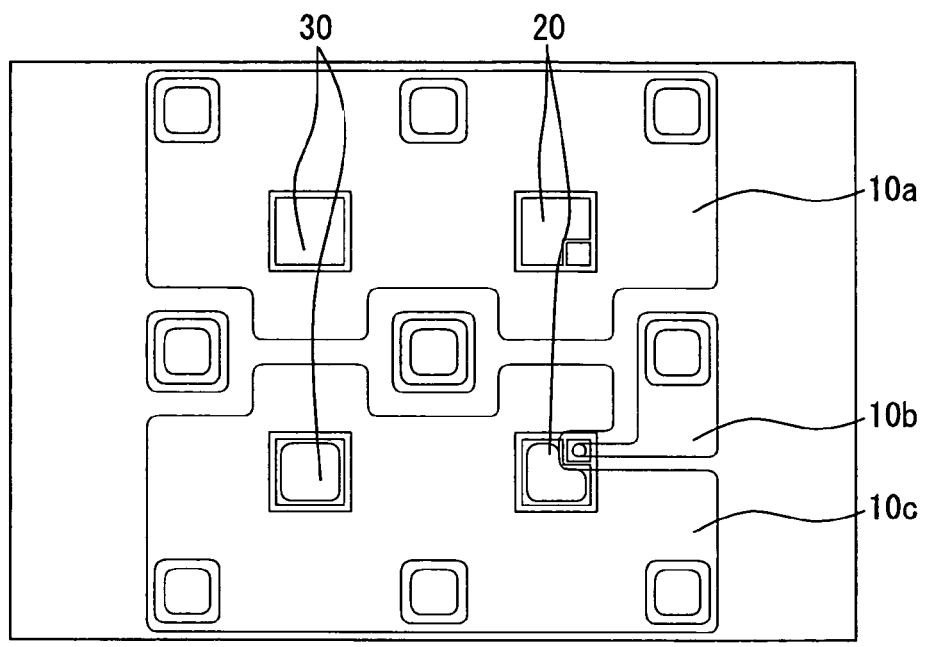
FIGS. 36A and 36B are top and bottom plan views a lower high thermal conductivity insulating substrate.
Figure 36B:
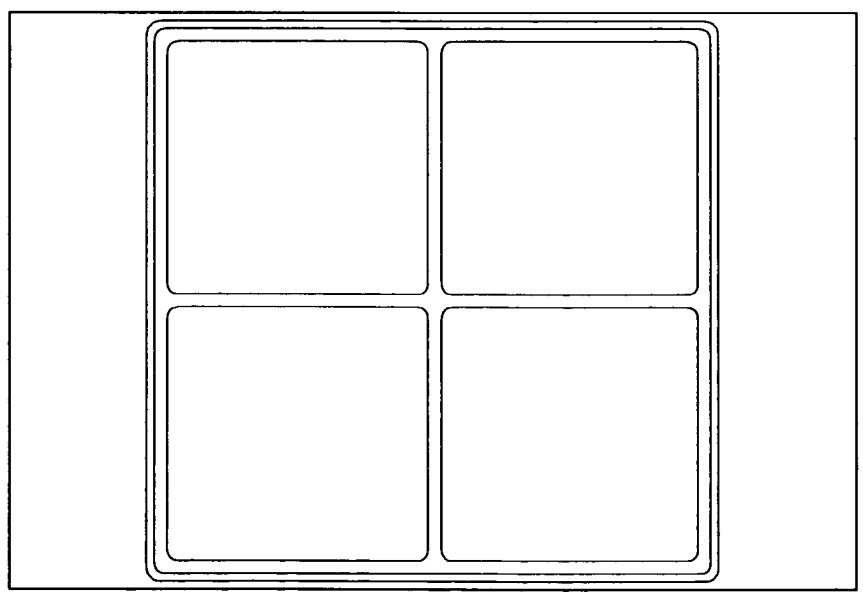

As shown in FIG. 34, the semiconductor chips are mounted on both upper and lower high thermally conductive insulating non-planar substrates 1, 2 in a symmetrical manner. The semiconductor transistor 20 and diode chips 30 having their two principal surfaces front-rear reversed with respect to each other are sandwiched between the two high thermal conductivity insulating substrates 1, 2. Specifically, first transistor 20 and first diode chips 30 are soldered to the upper high thermal conductivity insulating substrate 1, and second transistor 20 and diode chips 30 are soldered to the lower high thermal conductivity insulating substrate 2, which are in a front-rear reversed relationship to each other. The rest of the construction is the same as that of the first example embodiment. With this kind of construction also it is possible to improve the thermal heat generation and shear stress distribution within the power electronic package 100.

FIGS. 35A to 36B show the top and bottom plan views of upper and lower high thermal conductivity insulating substrates. As shown in these figures, the upper and lower high thermal conductivity insulating non-planar substrates 1, 2 are made up of a substantially rectangular shapes, with all the external connection buses on the upper high thermal conductivity insulating substrate. The upper high thermal conductivity insulating substrate 1 is big in size compare to the lower upper high thermal conductivity insulating substrate 2. First semiconductor transistor 20 and first diode 30 and second semiconductor transistor 20 and second diode chips 30 are soldered on the upper and lower high thermal conductivity insulating non-planar substrate 1, 2, respectively.

In a fifth example embodiment, a power electronic package will be described with reference to FIG. 37 through FIG. 39B. The differences between the package and the package shown in FIGS. 1 to 28 will be described.

Figure 37:
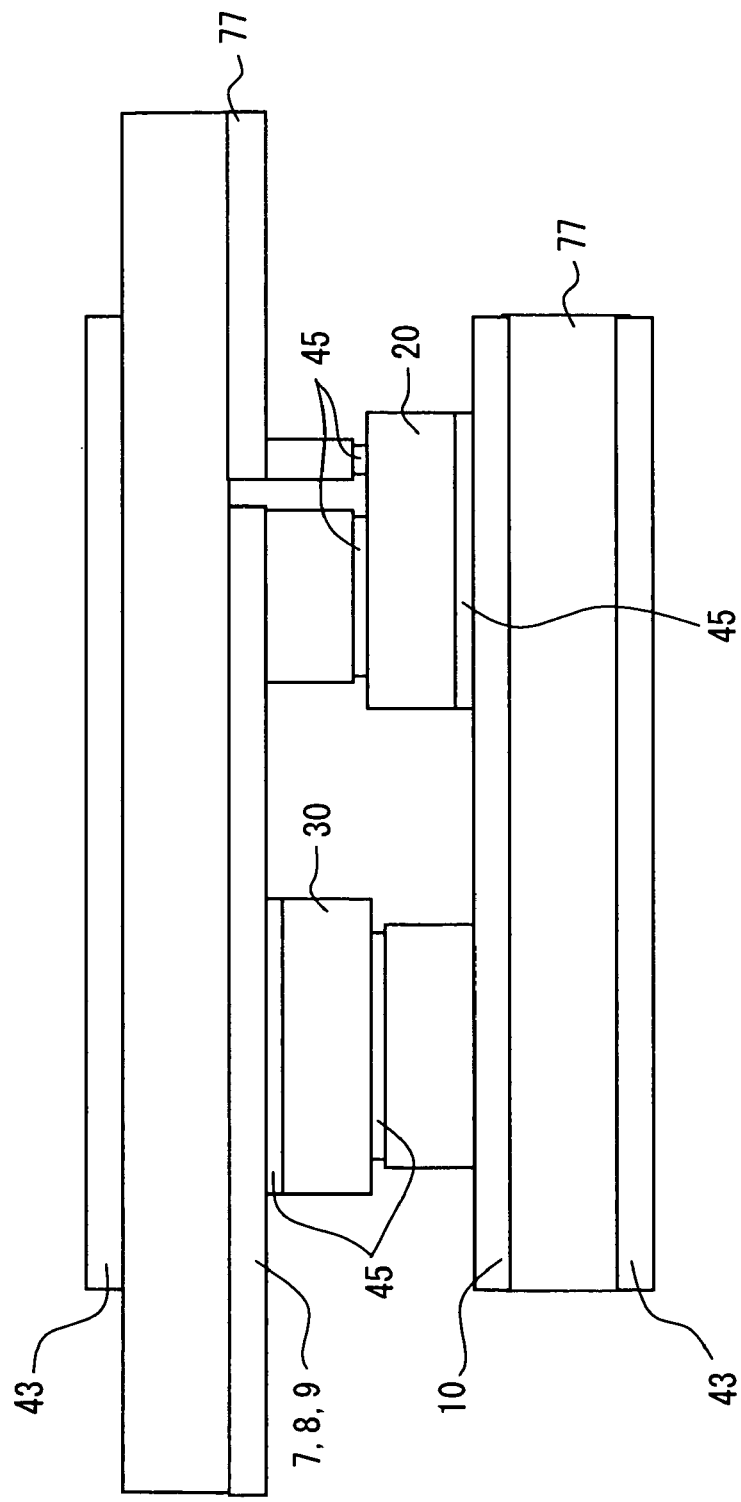
FIG. 37 is a cross-sectional view showing another power electronic package.
Figure 38A:
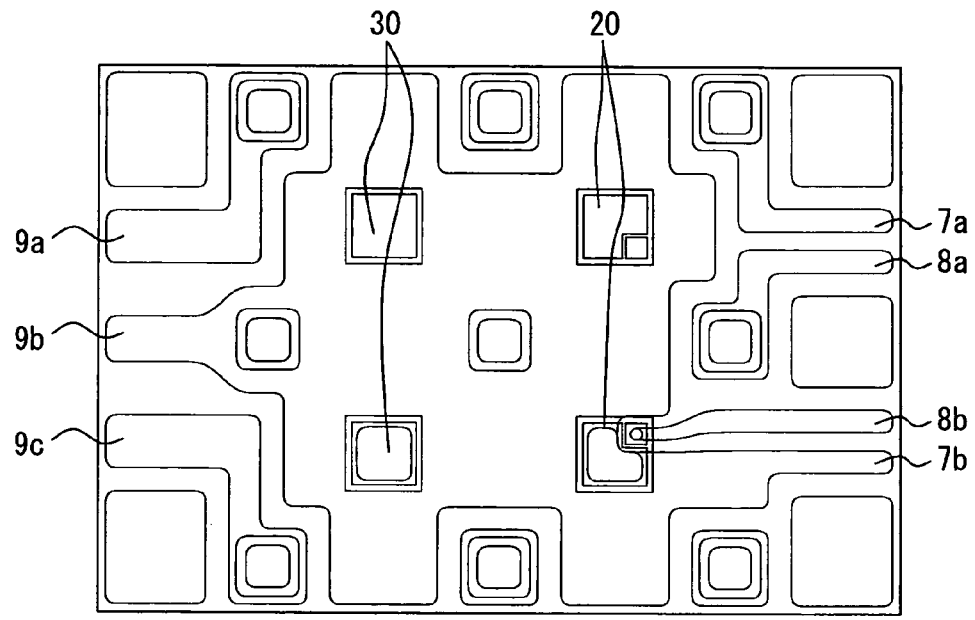
FIGS. 38A and 38B are top and bottom plan views of an upper high thermal conductivity insulating substrate.
Figure 38B:
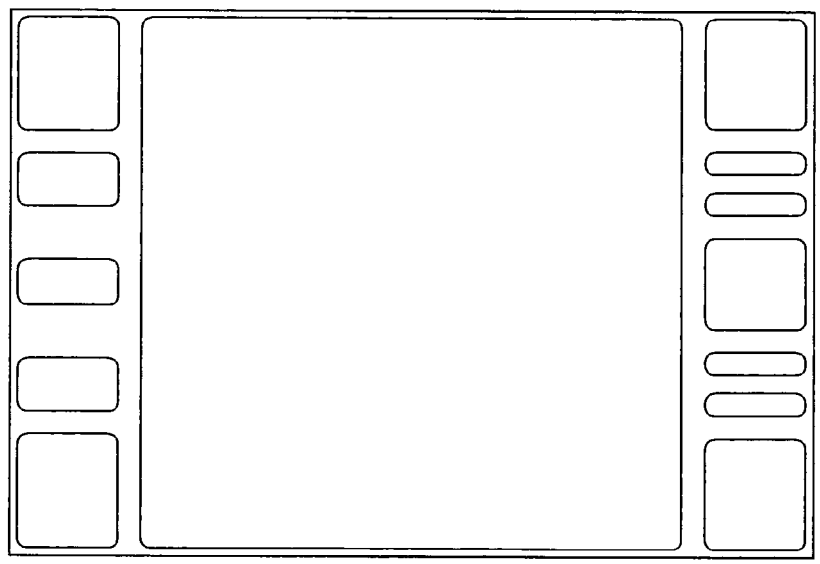
Figure 39A:
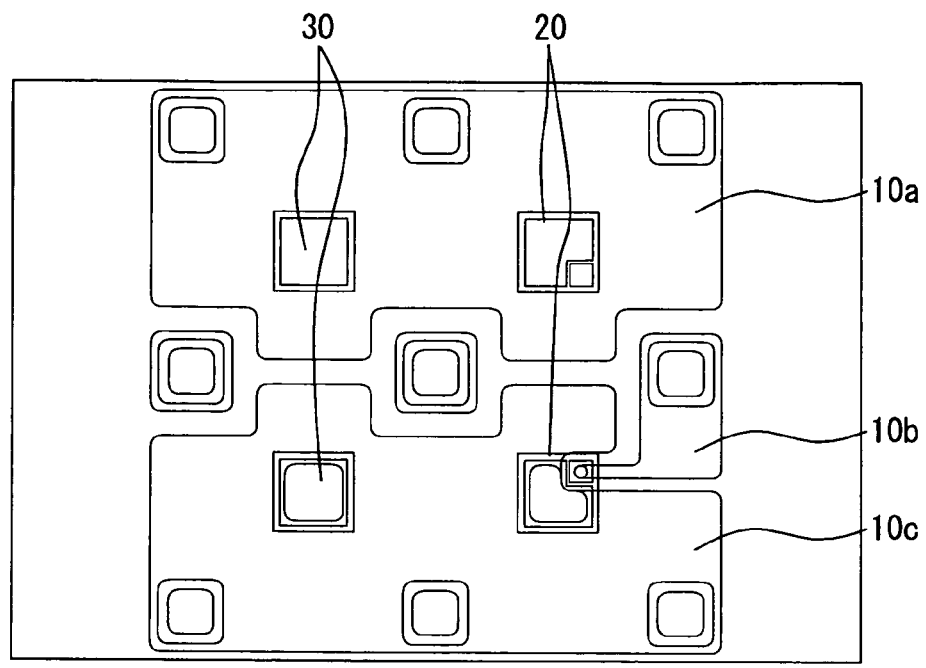
FIGS. 39A and 39B are top and bottom plan views a lower high thermal conductivity insulating substrate.
Figure 39B:
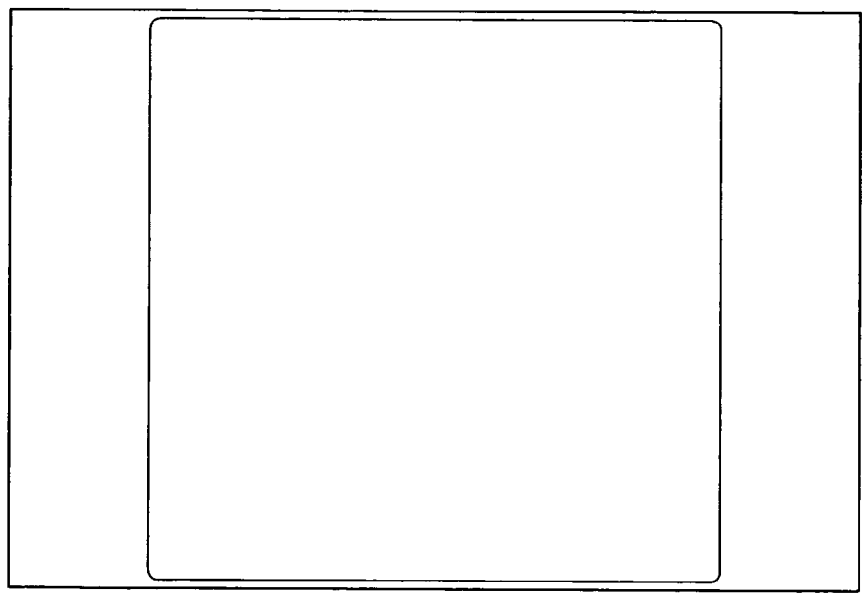
Figure 40:
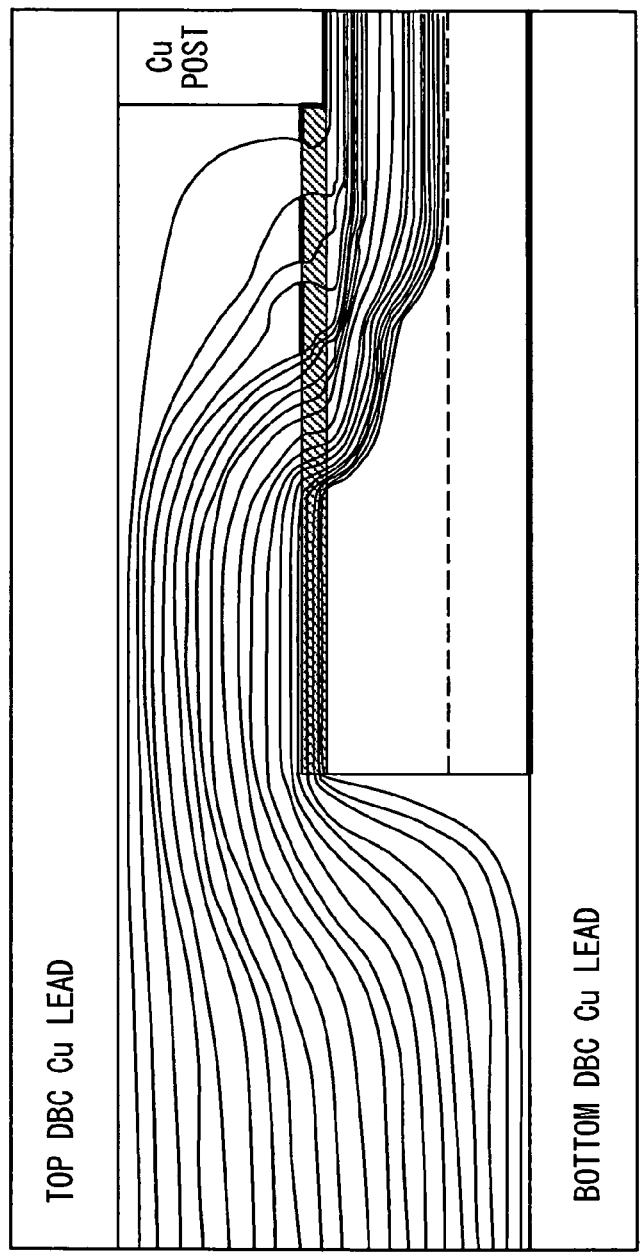
FIG. 40 is a cross-sectional view showing the crowding of potential lines at the edge of the semiconductor chip.
Figure 41:
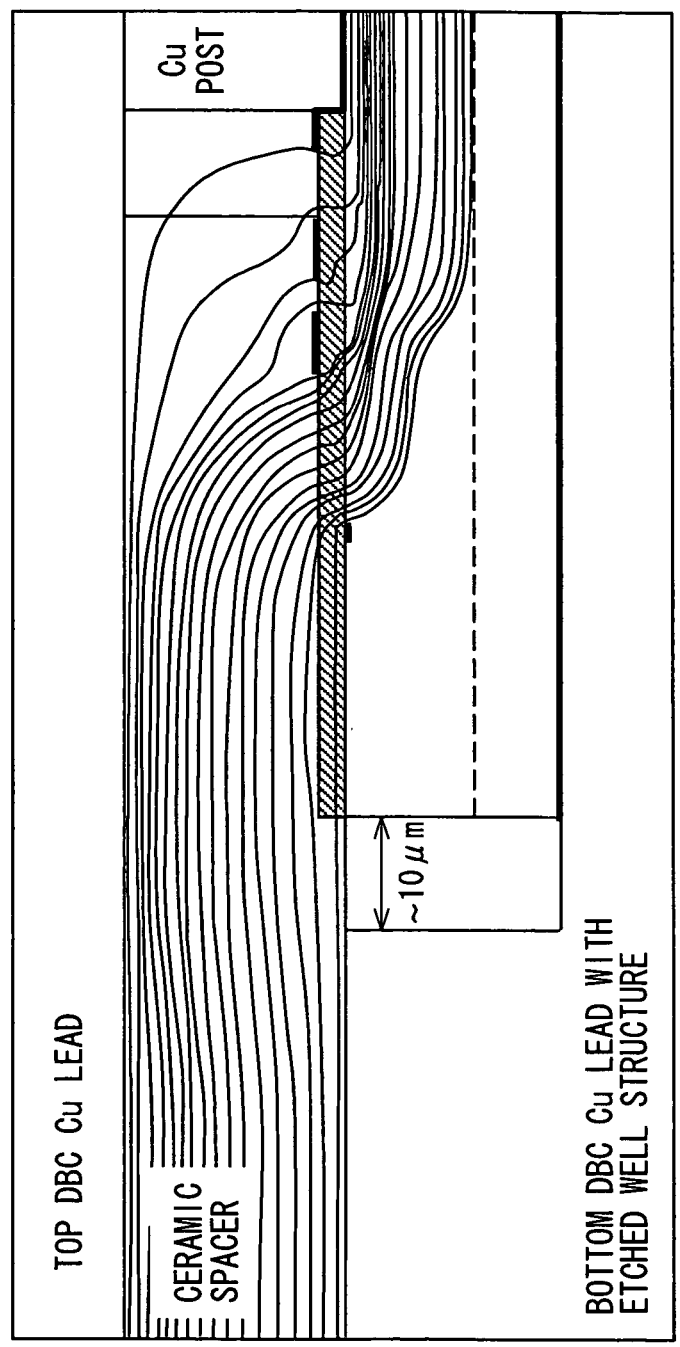
FIG. 41 is a cross-sectional view showing the reduction of crowding of potential lines at the edge of the semiconductor chip.

As shown in FIG. 37, each outer surface of the two high thermal conductive insulating non-planar substrates 1, 2 has not been etched for the improved integration with the heat exchanger 80. This embodiment provide a freedom to use a integrated as well as a non integrated heat exchanger 80 for cooling the both side of the sandwich structure. Each flat outer surface of the two high thermal conductive insulating non-planar substrates 1, 2 is suitable for using closed type micro-channel heat exchanger 41 unit using a thermal component in between to improve the heat radiation performance. However, this leads to a larger thermal resistance of the power electronic package 100. However, this configuration relaxes the total stress on the sandwich structure due to lack of direct bonding of the heat exchanger 80 unit. This structure can also be mounted on the air-cooled heat exchanger 80 units. The rest of the construction is the same as that of the fourth embodiment. With this kind of construction also, it is possible to improve the thermal heat generation and shear stress distribution within the power electronic package 100.

FIGS. 38A to 39B show the top and bottom plan views of upper and lower high thermal conductivity insulating substrates. As shown in these figures, the upper and lower high thermal conductivity insulating non-planar substrates 1, 2 are made up of a substantially rectangular shapes, with all the external connection buses on the upper high thermal conductivity insulating substrate. The upper high thermal conductivity insulating substrate 1 is big in size compare to the lower upper high thermal conductivity insulating substrate 2. First semiconductor transistor 20 and first diode 30 and second semiconductor transistor 20 and second diode chips 30 are soldered on the upper and lower high thermal conductivity insulating non-planar substrates 1, 2, respectively.

In a sixth example embodiment, a power electronic package will be described with reference to FIG. 40 through FIG. 45B. The differences between this package and the package shown in FIGS. 1 to 28 will be described.

Figure 42:
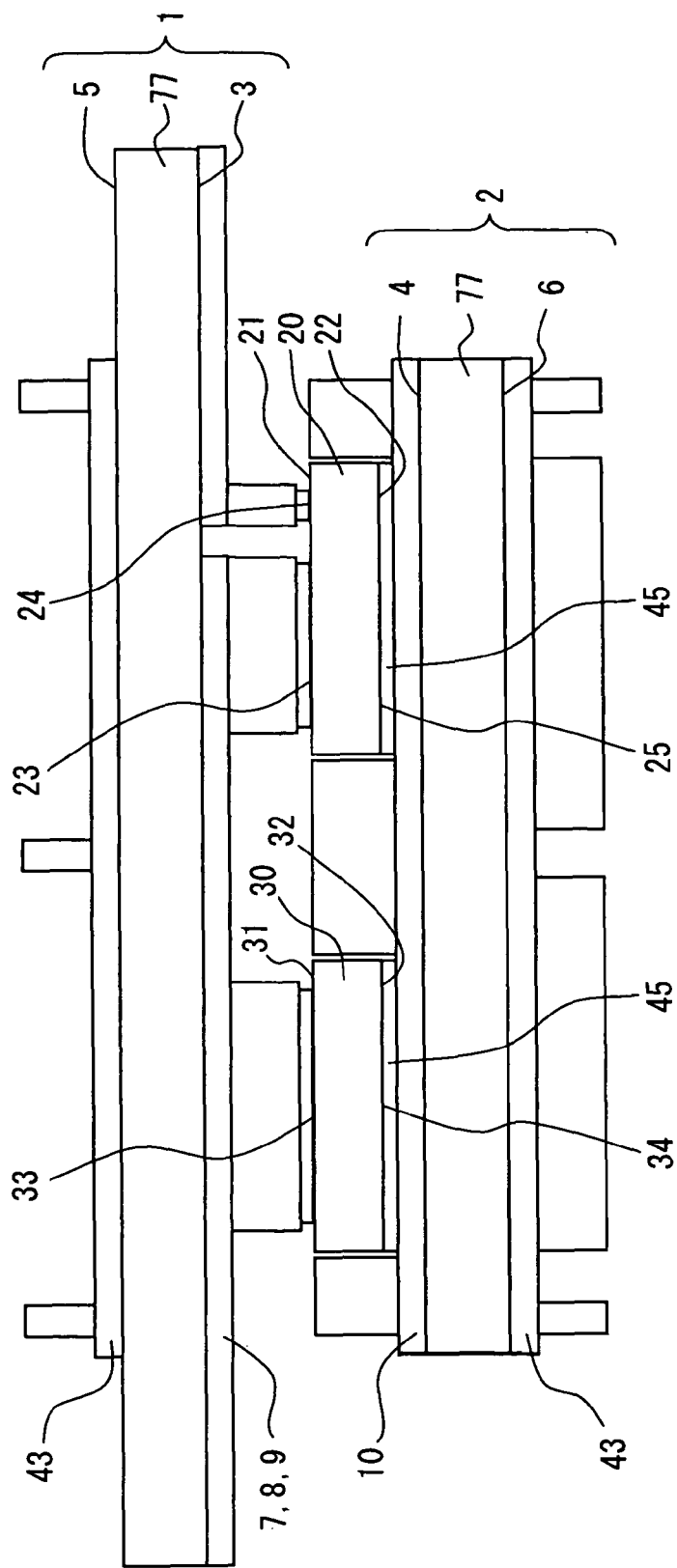
FIG. 42 is a cross-sectional view showing another power electronic package.

During operation of the half bridge rectifier, the potential of the upper substrate copper lead is lower than that of the lower substrate copper lead. This results in an electric field buildup in the cavity between the two ceramic tiles where the equally spaced potential lines are parallel to the substrates as shown in FIG. 42. At the edge of the semiconductor chips, these potential lines bend outwards from within the depletion region (due to the termination structures) into this air cavity. The height of the etched copper post on the upper substrate is for example approximately 300 μm, as is the thickness of the semiconductor chips. This 600 μm separation between the upper and lower substrate results in a further bending of the potential lines from the edge of the semiconductor chips as they redistribute in the air cavity. This electric field enhancement is further enhanced by the roughness of the die edges after laser cutting. Inadvertently, this leads to potential crowding at the edge of the semiconductor which could possibly result in premature breakdown of the semiconductor at the chip edges due to high electric field buildup in that region.

Figure 43:
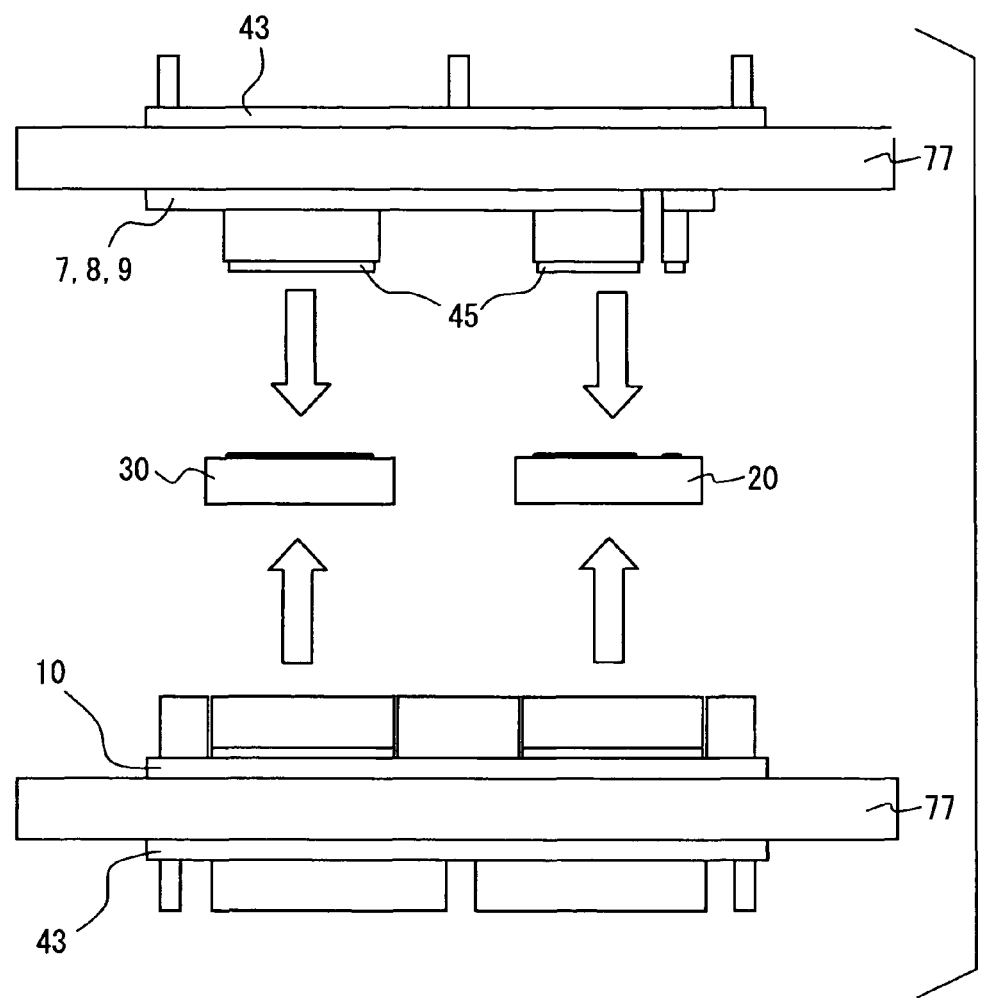
FIG. 43 is an exploded view showing the power electronic package.
Figure 44A:
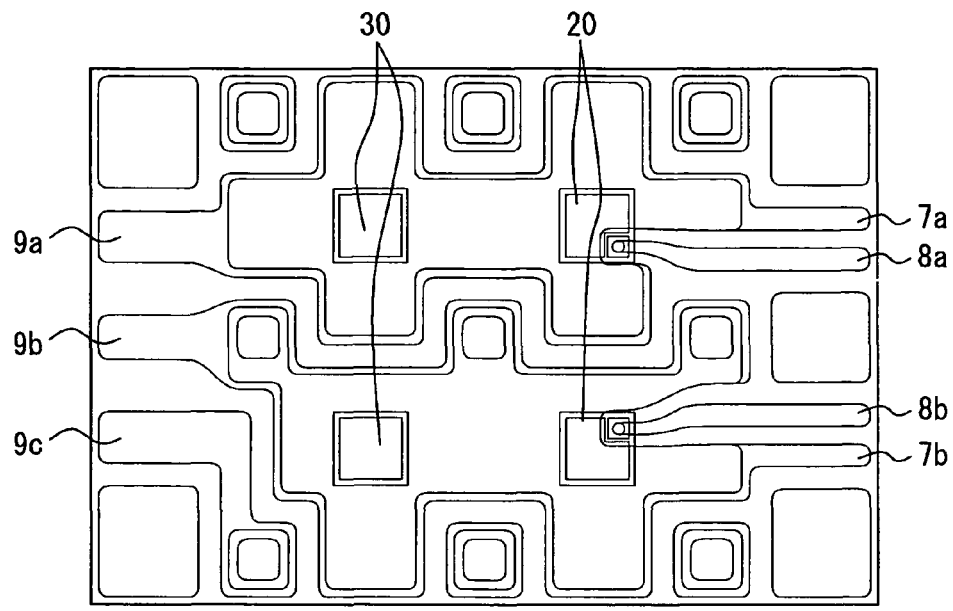
FIGS. 44A and 44B are top and bottom plan views of an upper high thermal conductivity insulating substrate.
Figure 44B:
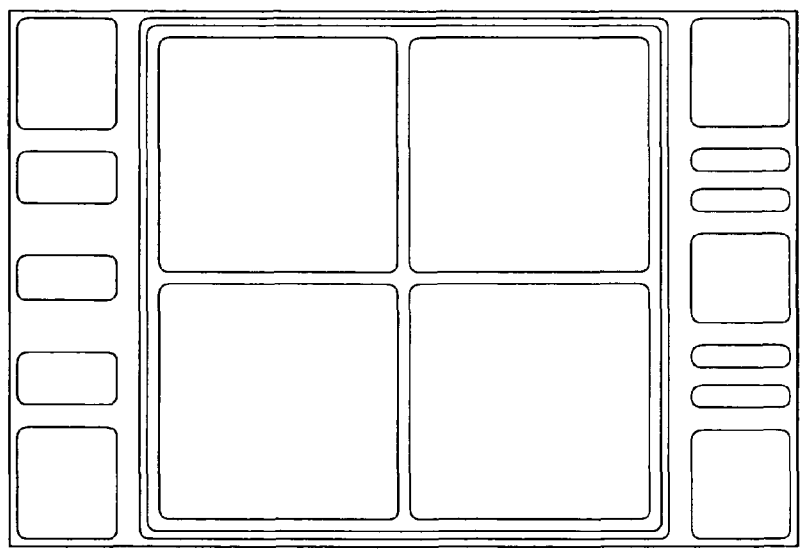
Figure 45A:
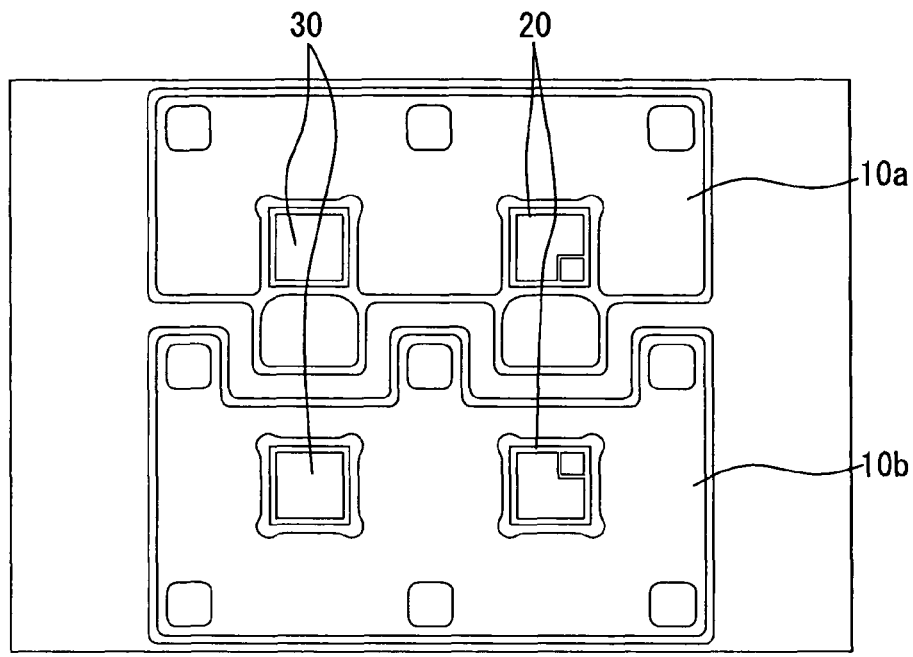
FIGS. 45A and 45B are top and bottom plan views a lower high thermal conductivity insulating substrate.
Figure 45B:
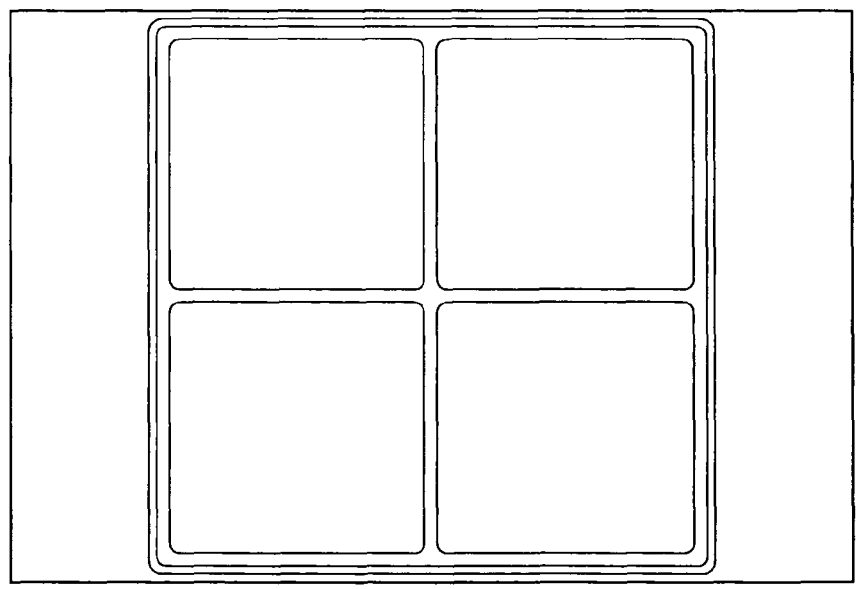

The introduction of etched windows into thick copper substrate tiles attempts to cater to this issue to prevent edge breakdown as shown in the FIG. 43. Here the unetched copper layer is for example 500 μm thick, while the thickness of the copper at the base of the window is for example 200 μm. However, in order for these wells to prevent high electric fields along the periphery of the die, the spacing between the die and the well edge has to be to the order of about 10 μm. This is not physically possible due to the tolerances involved during the etching process as well as the alignment accuracy of the die attach process. In actual fact, the wells have been designed to be for example 450 µm larger than the dies being used due to the etching process of today technology. While this will not change the situation of local field enhancement at the die edges, from a mechanical perspective, these well structures are expected to provide more stability to the ceramic sandwich due to the thicker Cu layers. Thicker copper layers on both the upper and lower substrates also provide for another package variation.

In addition, the earlier explained simulation result suggests that it is obvious that the copper layer thickness has severe implications on the upper substrate. Here substrate with 500 µm of copper shows much lower residual stresses in the outer and inner copper, and ceramic layers. Thicker copper layers reduce the residual stresses in the inner copper layer on the upper substrate by 40% moving it lower than its yield stress point to the region of elastic deformation. Ceramic layer stresses in the top DBC also show a 33% decrease in stress values. Stress values on the bottom DBC show little improvement as this is masked by the saturation in stress values for materials in the vicinity of the semiconductor chip and the die attach solder.

As shown in FIG. 42, the inner surface of the lower high thermal conductive insulating non-planar substrate 2 has been etched so that there are one or more recesses or wells within which the components are located. Such a configuration makes the lower thermal conductive insulating non-planar substrate 2 thicker compare to the upper thermal conductive insulating non-planar substrate 1. FIG. 43 shows the exploded view the power electronic package, and FIGS. 44A to 45B show the top and bottom plan views of upper and lower high thermal conductivity insulating substrates. As shown in these figures, the upper and lower high thermal conductivity insulating non-planar substrates 1, 2 are made up of a substantially rectangular shapes, with all the external connection buses on the upper high thermal conductivity insulating substrate 1. The upper high thermal conductivity insulating substrate 1 is big in size compare to the lower upper high thermal conductivity insulating substrate 2. Two semiconductor transistor 20 and two semiconductor diode chips 30 are soldered on the lower high thermal conductivity insulating non-planar substrate 2. The rest of the construction is the same as that of the first embodiment.

In a seventh example embodiment, a power electronic package will be described with reference to FIG. 46 through FIG. 48B. The differences between this package and the package shown in FIGS. 40 to 45B will be described.

Figure 46:
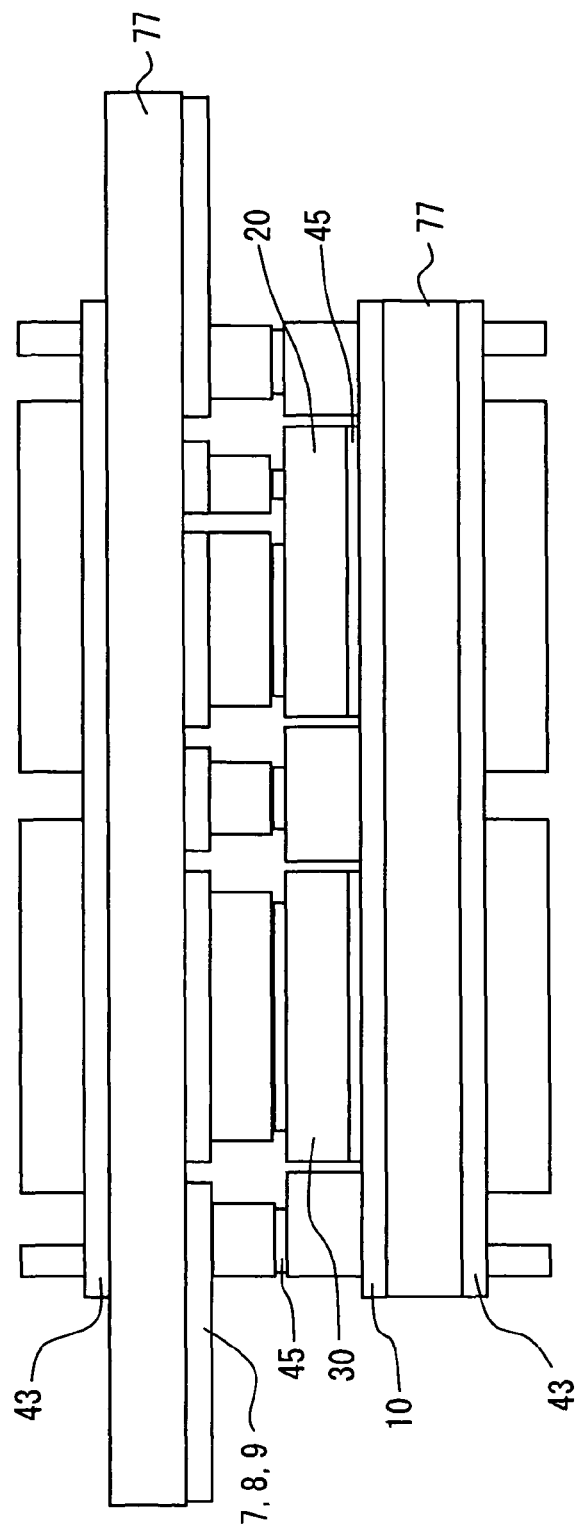
FIG. 46, is a cross-sectional view showing another power electronic package.
Figure 47A:
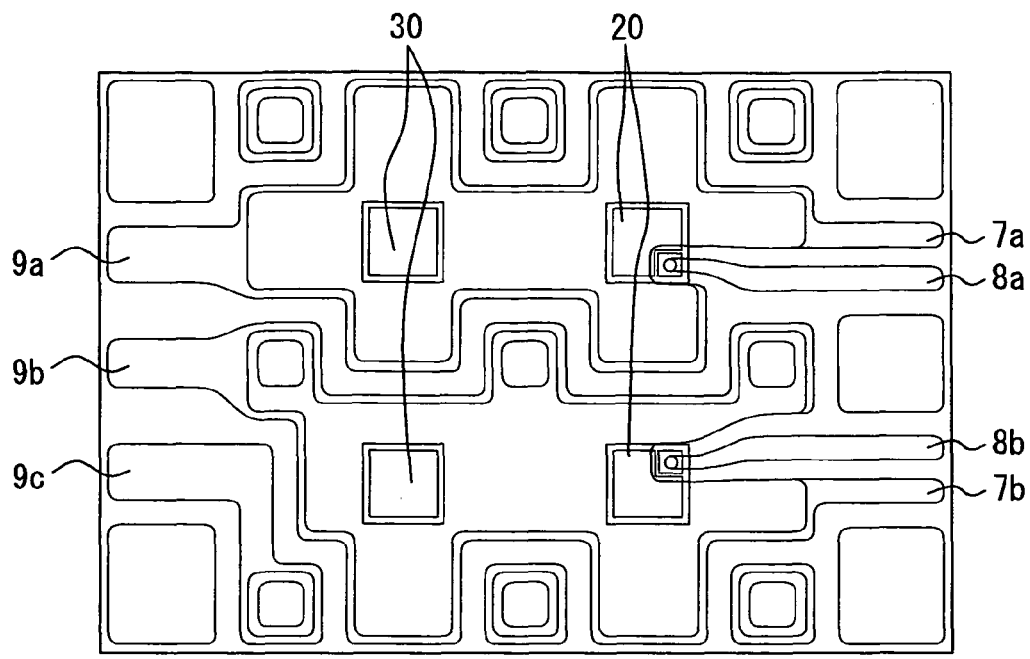
FIGS. 47A and 47B are top and bottom plan views of an upper high thermal conductivity insulating substrate.
Figure 47B:
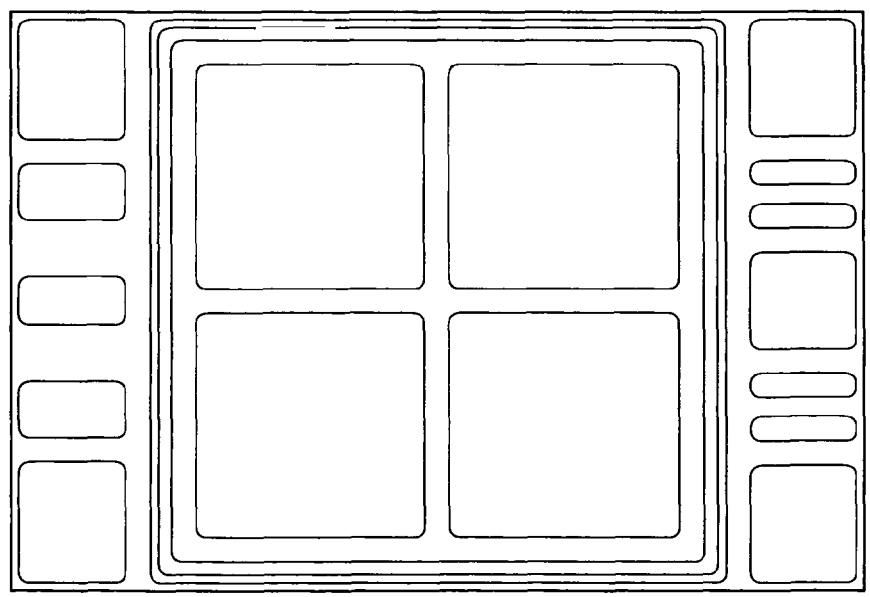
Figure 48A:
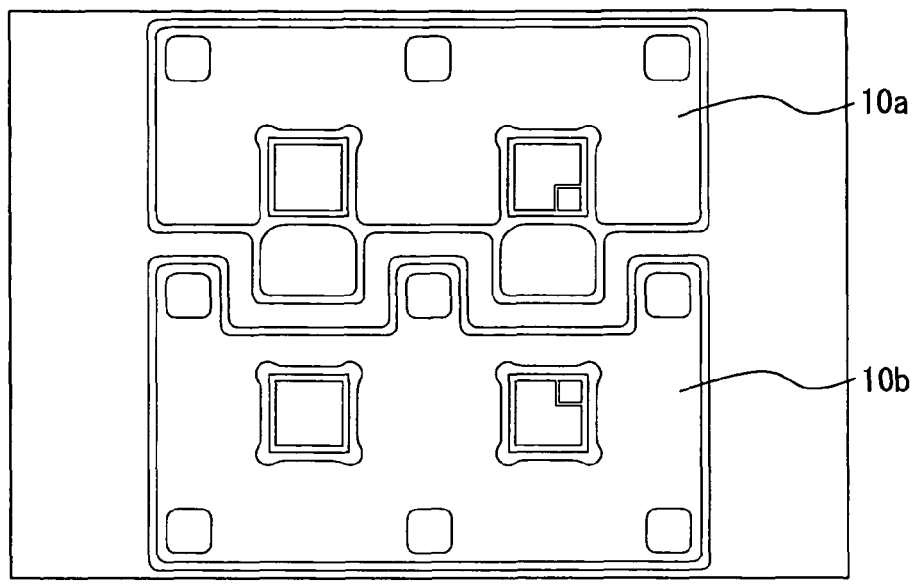
FIGS. 48A and 48B are top and bottom plan views a lower high thermal conductivity insulating substrate.
Figure 48B:
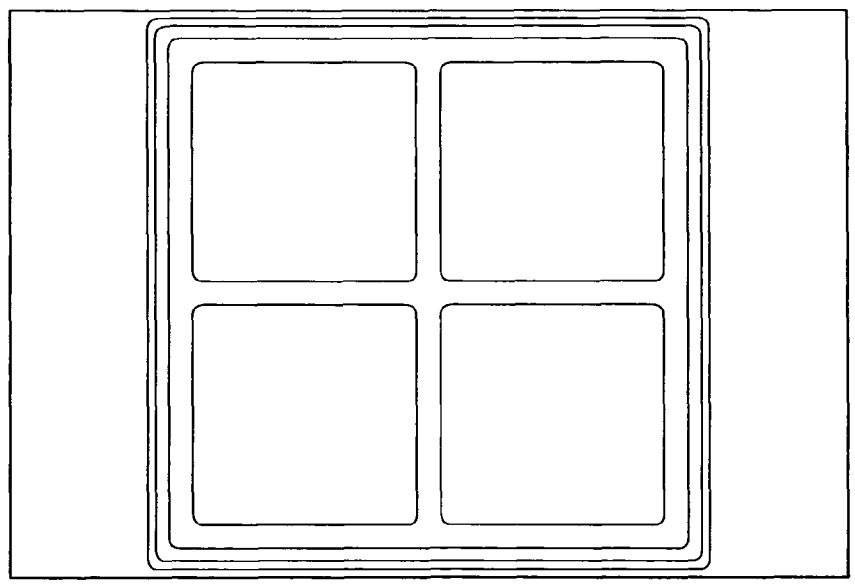

In this embodiment, as shown in FIG. 46, the inner surface of the lower high thermal conductive insulating non-planar substrate 2 has been etched so that there are one or more recesses or wells within which the components are located. Also, the copper layer of the upper high thermal conductive insulating non-planar substrate 1 is matched to the thickness of the lower substrate 2. Such a configuration makes the upper and lower thermal conductive insulating non-planar substrates 1, 2 to have copper thickness thicker compare to the first embodiment. FIGS. 47A to 48B show the top and bottom plan views of upper and lower high thermal conductivity insulating substrates 1, 2. As shown in these figures, the upper and lower high thermal conductivity insulating non-planar substrates 1, 2 are made up of a substantially rectangular shapes, with all the external connection buses on the upper high thermal conductivity insulating substrate 1. The upper high thermal conductivity insulating substrate 1 is big in size compare to the lower upper high thermal conductivity insulating substrate 2. Two semiconductor transistor 20 and two semiconductor diode chips 30 are soldered on the lower high thermal conductivity insulating non-planar substrate 2. The rest of the construction is the same as that of the first embodiment.

In an eighth example embodiment, a power electronic package will be described with reference to FIGS. 49A and 49B. The differences between these packages and the package shown in FIGS. 1 to 28 will be described.

In this embodiment as shown in FIG. 49, the semiconductor chips are mounted on both upper and lower high thermally conductive insulating non-planar substrates 1, 2 in a symmetrical manner. The semiconductor transistor 20 and diode chips 30 having their two principal surfaces front-rear reversed with respect to each other are sandwiched between the two high thermal conductivity insulating substrates 1, 2. Specifically, first transistor 20 and first diode chips 30 are soldered to the upper high thermal conductivity insulating substrate 1, and second transistor 20 and diode chips 30 are soldered to the lower high thermal conductivity insulating substrate 2, which are in a front-rear reversed relationship to each other. The rest of the construction is the same as that of the first embodiment. With this kind of construction also, it is possible to improve the thermal heat generation and shear stress distribution within the power electronic package 100.

Figure 49A:
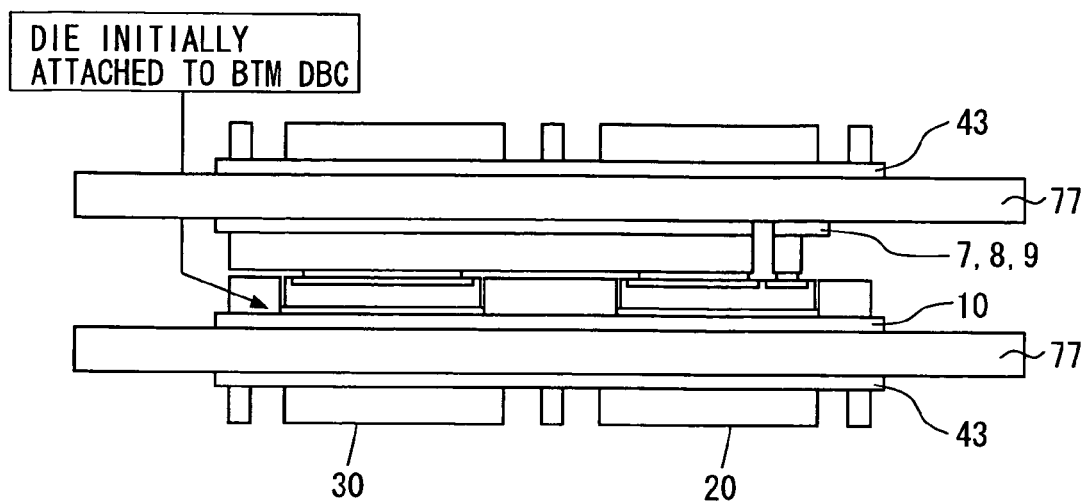
FIGS. 49A and 49B are cross-sectional views showing power electronic packages.
Figure 49B:
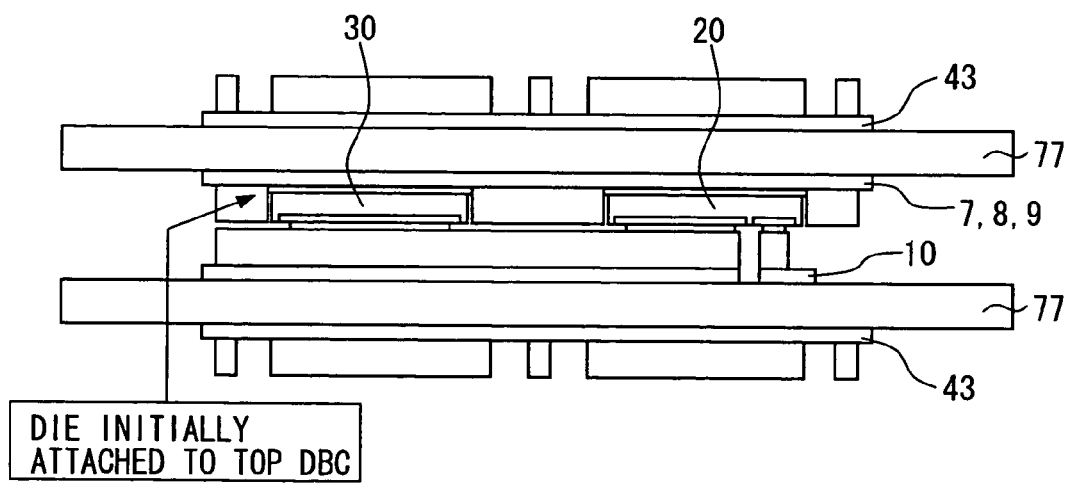
Figure 50:
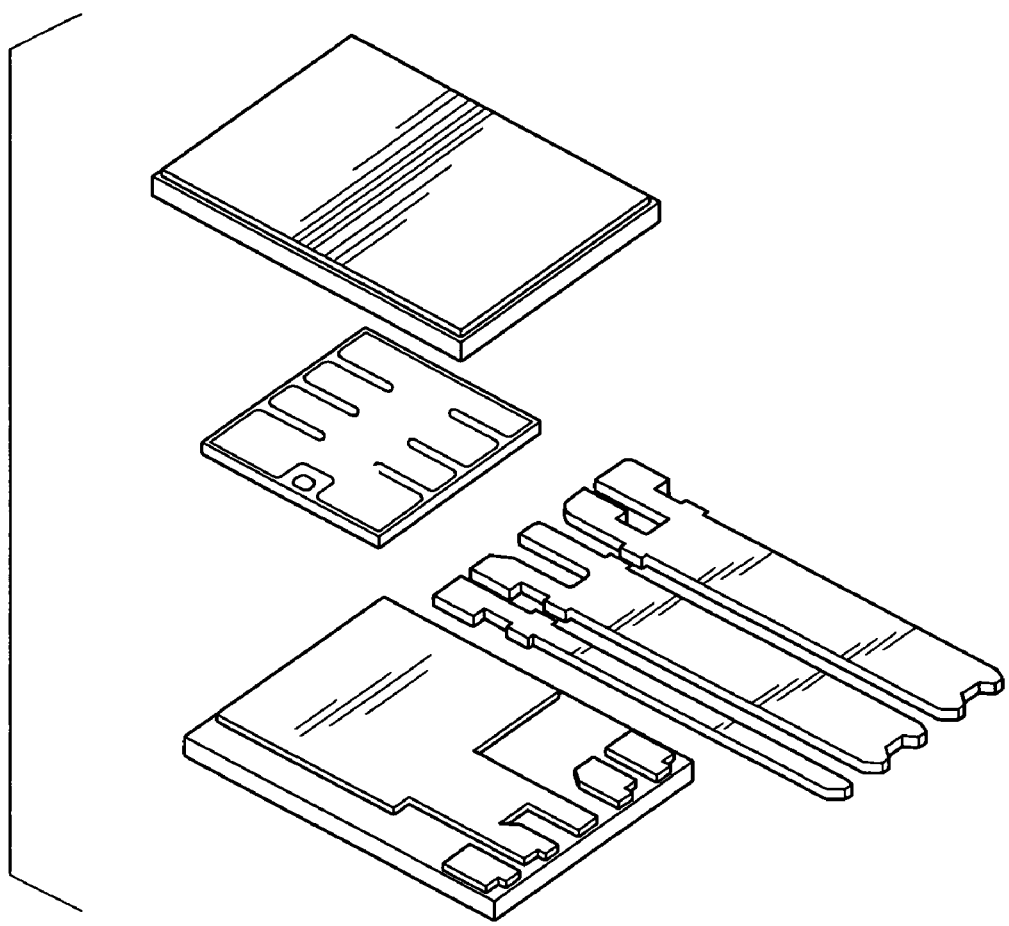
FIG. 50 is an exploded view showing an electrically isolated and thermally conductive double side pre packaged IC component, stamped lead members, contact electrodes, semiconductor chips and the like are positioned between a pair of ceramic substrate members in a prior art.

FIGS. 49A and 49B show the cross-sectional view of upper and lower high thermal conductivity insulating substrates 1, 2 in two possible configurations. As shown in these figures, the upper and lower high thermal conductivity insulating non-planar substrates 1, 2 are made up of a substantially rectangular shapes, with all the external connection buses on the upper high thermal conductivity insulating substrate. The upper high thermal conductivity insulating substrate 1 is big in size compare to the lower upper high thermal conductivity insulating substrate 2. First semiconductor transistor 20 and first diode 30 and second semiconductor transistor 20 and second diode chips 30 are soldered on the upper and lower high thermal conductivity insulating non-planar substrate 1, 2, respectively.

The present disclosure relates generally to a power electronic package having two substrates with multiple electronic components. Specifically, the package includes one or more semiconductor dies and other similarly shaped electronic components, which are mounted between two high thermal conductivity insulating non-planar substrates. Unique non-planar substrates act as the connection large area connection post, realizing low electrical and thermal resistances. These non-planar substrates consist of alternate layers, of electrical insulator and patterned electrical conductor, the electrical conductor being presented to the components in order to make a mechanical and electrical connection. The surface profile of conductor regions on the substrates is adjusted so that they possess a number of raised regions, or posts, which are bonded during assembly to provide mechanical and electrical interconnection between the two substrates. These bonded regions, the number, placement, and geometry control the mechanical separation of the non-planar substrates. The segregation of the conductor layers into a number of electrically isolated regions allows an electrical circuit to be defined on one or both substrates.

Specifically, a uniform stress distribution is obtained in the power electronic package with pressure type contacts after the full assembly process, which can be reduced in semiconductor chip stresses, and the improved heat radiation performance in a direct double-side cooled configuration. Two high thermal conductivity insulating non-planar substrates are used to eliminate the wire bonds. The solid copper interconnection posts that replace the wires over the active surface of the semiconductor chips provide not only an excellent electrical path but an excellent thermal cooling path from two principal surfaces of semiconductor chips as well. Such a power electronic package can have a significantly lower semiconductor chip juncture temperature because the thermal cooling structure is connected to the area of the chip where the heat is generated.

The double-side cooled power electronic package has been proven to be very useful, especially in electronic modules where extended lifetime under extreme high temperature thermal cycles is required. The power electronic package structure does not involve any bond wires from the devices to external pads, thus drastically reducing the number of bonded joints leading to better reliability as well as low parasitic inductances and resistances within the structure.

According to a power electronic package, a semiconductor chip is sandwiched between two high thermal conductivity insulating non-planar substrates, and the electrodes of the semiconductor chip and electrode patterns on the high thermal conductivity insulating non-planar substrates are bonded directly, thereby eliminating the need for wire bonds. The non-planar substrates consist of alternate layers of electrical insulator and patterned electrical conductor, the electrical conductor being presented to the components in order to make a mechanical and electrical connection. The surface profile of conductor regions on the substrates is adjusted so that they possess a number of raised regions, or posts, which are bonded during assembly to provide mechanical and electrical interconnection between the two substrates. The segregation of the conductor layers into a number of electrically isolated regions allows an electrical circuit to be defined on one or both substrates. The bonded regions, the number, placement, and geometry control the mechanical separation of the non-planar substrates. The heat produced by the semiconductor chip is smoothly transmitted from the two principal surfaces of the semiconductor chip to the two high thermal conductivity insulating non-planar substrates, and is thereby radiated quickly. The direct double-side cooled configuration further reduces the heat resistance of the power electronic package.

According to another aspect of the present disclosure, one or more semiconductor dies and other similarly shaped electronic components of a relatively low coefficient of thermal expansion having two principal surfaces front-rear reversed with respect to each other are mounted between the two high thermal conductivity insulating non-planar substrates. The substrates consist of alternate layers of electrical insulator and patterned electrical conductor, the electrical conductor being presented to the components in order to make a mechanical and electrical connection. The surface profile of conductor regions on the substrates is adjusted so that there are one or more recesses or wells on one or both substrate tiles within which the components are located. The bonded regions may be defined by surface profiling or by application of an area selective bonding process. These bonded regions, the number, placement, and geometry control the mechanical separation of the non-planar substrates. The bonding process allows for mechanical and electrical interconnection between the two substrates and segregation of the conductor layers into a number of electrically isolated regions allows an electrical circuit to be defined on one or both substrates. Also, the assembly temperature of the sandwich is higher than the maximum operating temperature so that a net residual compressive stress will be left in the components upon cooling.

According to another aspect of the present disclosure, one or more semiconductor dies and other similarly shaped electronic components having two principal surfaces front-rear reversed with respect to each other are mounted between the two high thermal conductivity insulating non-planar substrates. The power electronic package combines a first non-planar substrate with the raised features with a second non-planar substrate having recesses as described earlier two aspects of the present disclosure. The bonded regions may be defined by surface profiling or by application of an area selective bonding process. These bonded regions, the number, placement, and geometry control the mechanical separation of the non-planar substrates. The geometry of the bonded regions is such that the selective application of a compressive force during bonding will leave a net residual compressive stress in the components after bonding. Also, the bonding process allows for mechanical and electrical interconnection between the two substrates and segregation of the conductor layers into a number of electrically isolated regions allows an electrical circuit to be defined on one or both substrates.

According to another aspect of the present disclosure, one or more semiconductor dies and other similarly shaped electronic components having two principal surfaces front-rear reversed with respect to each other are mounted between the two high thermal conductivity insulating non-planar substrates. The power electronic package combines a first substrate a first substrate with either having the raised or recesses features with a second substrate, in which the patterned conducting layer presented to the components and the first substrate is a planar surface without raised or recessed features. The bonded regions may be defined by surface profiling or by application of an area selective bonding process. These bonded regions, the number, placement, and geometry control the mechanical separation of the non-planar substrates. The geometry of the bonded regions is such that the selective application of a compressive force during bonding will leave a net residual compressive stress in the components after bonding. Also, the bonding process allows for mechanical and electrical interconnection between the two substrates and segregation of the conductor layers into a number of electrically isolated regions allows an electrical circuit to be defined on one or both substrates.

Furthermore, the high thermal conductivity insulating non-planar substrates are composed of non-conductive ceramic substrate and highly conductive metal, bonded by either direct bonded copper, directly bonded aluminum or active metal brazing solder material. Also, non-conductive ceramic substrate comprise materials taken form the group consisting of alumina, aluminum nitride, silicon nitride, silicon carbide, or diamond, and copper or aluminum metal. In this case, because the coefficient of thermal expansion of non-conductive ceramic substrate is close to that of the semiconductor chip, it is possible to reduce thermal stresses acting between the semiconductor chip and the electrode patterns. Furthermore, the height of the non-bonding region of the high thermal conductivity insulating non-planar substrates is smaller than that of bonded regions so as to provided sufficient gap for encapsulation between the two high thermal conductivity insulating non-planar substrates. An encapsulant comprising of for example silicone rubber is injected into the resulting gap minimize the number of air pockets in the structure, which usually leads to air breakdown when high electric fields are involved. Alternatively, a polyamide film is inserted in the gap to prevent the electrical breakdown. Alternatively, the power electronic package further including an insulating polyamide layer positioned between the sandwiching surfaces of high thermal conductivity insulating non-planar substrates to envelope said semiconductor chips and other similarly shaped electronic components and to provide the electrical isolation between the external electrical connections.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A power electronic package comprising:
   first and second high thermal conductivity insulating non-planar substrates; and
   a plurality of semiconductor chips and electronic components, which are disposed between the first and second high thermal conductivity insulating non-planar substrates, wherein
   each of the first and second high thermal conductivity insulating non-planar substrates includes a plurality of electrical insulator layers and patterned electrical conductor layers, which are alternately stacked,
   the electrical conductor layers are connected to the electronic components with mechanical and electrical connection,
   each of the first and second high thermal conductivity insulating non-planar substrates further includes a plurality of raised regions or posts,
   the raised regions or posts are bonded together so that the first and second high thermal conductivity insulating non-planar substrates are mechanically and electrically connected,
   a number of the raised regions or posts, arrangement of the raised regions or posts, and a shape of each raised region or post are adjusted to have mechanical separation between the first and second high thermal conductivity insulating non-planar substrates,
   the electrical conductor layers are separated and isolated from one another so that a plurality of electric circuits is provided on at least one of the first and second high thermal conductivity insulating non-planar substrates,
   the mechanical separation between the first and second high thermal conductivity insulating non-planar substrates provides to reduce shear stress in the semiconductor chips and the electronic components,
   the number of the raised regions or posts is equal to or larger than four,
   the raised regions or posts are arranged symmetrically with respect to a center of the high thermal conductivity insulating non-planar substrate,
   each electrically inactive bonding region has a planar shape of a square with a rounded corner or a planar shape of a circle, and
   the rounded corner has a curvature radius equal to or larger than 0.6 mm, or the circle has a radius equal to or larger than 0.6 mm.

2. The power electronic package according to claim 1, wherein
   the raised regions or posts provide a plurality of bonding regions between the first and second high thermal conductivity insulating non-planar substrates, and
   the bonding regions have a predetermined arrangement, which enables to connect between at least one of the first and second high thermal conductivity insulating non-planar substrates and an external electric circuit.

3. The power electronic package according to claim 1, wherein
   the mechanical separation between the first and second high thermal conductivity insulating non-planar substrates is controlled by material of the raised regions or posts, and
   the material of the raised regions or posts has high thermal expansion coefficient.

4. The power electronic package according to claim 1, wherein
   each semiconductor chip includes first and second main electrodes,
   the first main electrode is disposed on a first principle surface of the semiconductor chip,
   the second main electrode is disposed on a second principle surface of the semiconductor chip, and
   the second principle surface is opposite to the first principle surface.

5. The power electronic package according to claim 4, wherein
   each of the first and second high thermal conductivity insulating substrates has first and second exterior surfaces,
   the first exterior surface provides for connection between an electrode of one of the semiconductor chips and an electrode of one of the electronic components, and
   the first exterior surface and the second exterior surface provides an external bus for a two-side electrical connection.

6. The power electronic package according to claim 5, wherein
   the semiconductor chips include a semiconductor transistor chip,
   the electronic components include a diode chip, and
   the external bus includes a first external bus for connecting between the first main electrode of the semiconductor transistor chip and the first main electrode of the diode chip.

7. The power electronic package according to claim 6, wherein the external bus further includes a second external bus for connecting between the second main electrode of the transistor chip and the second main electrode of the diode chip.

8. The power electronic package according to claim 5, wherein the semiconductor chips and the electronic components are sandwiched between the first exterior surfaces of first and second high thermal conductivity insulating non-planar substrates.

9. The power electronic package according to claim 5, wherein the electrode of the one of the semiconductor chips, the electrode of the one of the electronic components, and the external bus are bonded with solderable electrically conductive material.

10. The power electronic package according to claim 5, wherein
    the first and second high thermal conductivity insulating non-planar substrates are connected at a sandwich portion through an insulating resin,
    the insulating resin is made of epoxy resin or silicone resin, and
    the insulating resin covers the semiconductor chips, and provides electrical isolation between the external buses of the first and second high thermal conductivity insulating non-planar substrates.

11. The power electronic package according to claim 5, wherein
    the first and second high thermal conductivity insulating non-planar substrates are connected at a sandwich portion through an insulating polyamide layer, and the insulating polyamide layer covers the semiconductor chips and the electronic components, and provides electrical isolation between the external buses of the first and second high thermal conductivity insulating non-planar substrates.

12. The power electronic package according to claim 1, wherein
each of the first and second high thermal conductivity insulating non-planar substrates includes a non-conductive ceramic substrate and a highly conductive metal member, and
the highly conductive metal members of the first and second high thermal conductivity insulating non-planar substrates are coupled with a direct bonding copper, a direct bonding aluminum or an active metal brazing solder material.

13. The power electronic package according to claim 12, wherein the non-conductive ceramic substrate is made of two materials, one of which is alumina, aluminum nitride, silicon nitride, silicon carbide, or diamond, and the other one of which is copper or aluminum.

14. The power electronic package according to claim 1, wherein each of the first and second high thermal conductivity insulating non-planar substrates is made of copper or aluminum.

15. The power electronic package according to claim 5, wherein
the external bus is disposed on each of the first and second high thermal conductivity insulating non-planar substrates,
the external bus is capable of being formed by a one-bond and two-step etching method with using copper or aluminum.

16. The power electronic package according to claim 5, wherein
the external bus is disposed on each of the first and second high thermal conductivity insulating non-planar substrate, and
the external bus is capable of being formed by a two-bond and two-step etching method with using copper or aluminum.

17. The power electronic package according to claim 1, wherein the semiconductor chips include a vertical type junction field effect transistor.

18. The power electronic package according to claim 1, wherein the semiconductor chips include a vertical type metal oxide semiconductor field effect transistor.

19. The power electronic package according to claim 1, wherein the semiconductor chips include a vertical type isolated gate bipolar transistor.

20. The power electronic package according to claim 1, wherein the semiconductor chips include a vertical type junction diode.

21. The power electronic package according to claim 1, wherein the semiconductor chips include a vertical type Schottky barrier diode.

22. The power electronic package according to claim 1, wherein
the semiconductor chips include a vertical type wide band gap semiconductor transistor, and
the electronic components include a diode chip.

23. The power electronic package according to claim 1, wherein
the semiconductor chips include a vertical type silicon carbide transistor, and
the electronic components include a diode chip.

24. The power electronic package according to claim 1, wherein the package is formed under a process temperature, which is higher than a maximum operating temperature of the package, so that a net residual compressive stress is reduced in the electronic components.

25. The power electronic package according to claim 1, further comprising:
a direct liquid impingement first heat exchanger unit attached to the first high thermal conductivity insulating non-planar substrate; and
a direct liquid impingement second heat exchanger unit attached to the second high thermal conductivity insulating non-planar substrate, wherein
the heat exchanger units are disposed in parallel to each other,
each of the heat exchanger units includes first and second surfaces,
the first surface of the first heat exchanger unit contacts the first high thermal conductivity insulating non-planar substrate, and
the first surface of the second heat exchanger unit contacts the second high thermal conductivity insulating non-planar substrate.

26. The power electronic package according to claim 25, further comprising:
a DC link capacitor board unit attached to the second surface of the direct liquid impingement first heat exchanger unit; and
a gate drive unit attached to the second surface of the direct liquid impingement second heat exchanger unit, wherein
the DC link capacitor board unit and the gate drive unit provide a liquid cooling inverter system, and
each heat exchanger unit has all surfaces for cooling the package.

* * * * *